United States Patent
Mao et al.

(10) Patent No.: US 12,351,944 B2
(45) Date of Patent: Jul. 8, 2025

(54) TWO-DIMENSIONAL PEROVSKITES FOR STABLE AND EFFICIENT PHOTOVOLTAIC CELLS

(71) Applicant: Northwestern University, Evanston, IL (US)

(72) Inventors: Lingling Mao, Evanston, IL (US); Weijun Ke, Evanston, IL (US); Konstantinos Stoumpos, Chicago, IL (US); Mercouri G. Kanatzidis, Wilmette, IL (US)

(73) Assignee: Northwestern University, Evanston, IL (US)

( * ) Notice: Subject to any disclaimer, the term of this patent is extended or adjusted under 35 U.S.C. 154(b) by 548 days.

(21) Appl. No.: 17/285,049

(22) PCT Filed: Oct. 14, 2019

(86) PCT No.: PCT/US2019/056036
§ 371 (c)(1),
(2) Date: Apr. 13, 2021

(87) PCT Pub. No.: WO2020/081412
PCT Pub. Date: Apr. 23, 2020

(65) Prior Publication Data
US 2021/0292344 A1   Sep. 23, 2021

Related U.S. Application Data

(60) Provisional application No. 62/745,563, filed on Oct. 15, 2018.

(51) Int. Cl.
C30B 7/14 (2006.01)
C07F 7/00 (2006.01)
(Continued)

(52) U.S. Cl.
CPC ............ C30B 7/14 (2013.01); C07F 7/003 (2013.01); H10F 77/211 (2025.01); H10K 30/10 (2023.02);
(Continued)

(58) Field of Classification Search
CPC ........ C07F 7/003; H10K 30/40; H10K 85/50; H10K 30/10; H10K 30/50;
(Continued)

(56) References Cited

U.S. PATENT DOCUMENTS

| | | |
|---|---|---|
| 6,420,056 B1 | 7/2002 | Chondroudis et al. |
| 6,429,318 B1 | 8/2002 | Mitzi |

(Continued)

FOREIGN PATENT DOCUMENTS

| | | |
|---|---|---|
| WO | WO 2013/171520 | 11/2013 |
| WO | WO 2014/045021 | 3/2014 |

(Continued)

OTHER PUBLICATIONS

Kanatzidis, Hybrid Dion-Jacobson 2D Lead Iodide Perovskites, J. Am. Chem. Soc. 2018, 140, 3775-3783 (Year: 2018).*

(Continued)

Primary Examiner — Devina Pillay
(74) Attorney, Agent, or Firm — Bell & Manning, LLC

(57) ABSTRACT

Two-dimensional halide perovskites are provided. The perovskites have two-dimensional Dion-Jacobson phases and are composed of a plurality of inorganic perovskite layers separated by 3-(aminomethyl)piperidinium (3AMP) and/or 4-(aminomethyl)piperidinium (4AMP) spacer cations. The halide perovskites may have a single perovskitizer cation or mixed perovskitizer cations. Also provided are radiation-absorbing materials comprising the perovskites and photovoltaic cells comprising the radiation-absorbing materials as photoactive materials.

18 Claims, 54 Drawing Sheets

$(A')(MA)_{n-1}Pb_nI_{3n+1}$   (A' = 3AMP or 4AMP)

(51) Int. Cl.
H10F 77/20 (2025.01)
H10K 30/10 (2023.01)
H10K 30/40 (2023.01)
H10K 30/50 (2023.01)
H10K 85/50 (2023.01)

(52) U.S. Cl.
CPC .............. *H10K 30/40* (2023.02); *H10K 85/50* (2023.02); *C07B 2200/13* (2013.01); *H10K 30/50* (2023.02)

(58) Field of Classification Search
CPC ......... H01L 31/022425; C07B 2200/13; C30B 29/12; C30B 7/14; H10F 77/211; Y02E 10/549
See application file for complete search history.

(56) References Cited

U.S. PATENT DOCUMENTS

| | | | |
|---|---|---|---|
| 7,491,286 | B2 | 2/2009 | Kagan et al. |
| 10,128,052 | B1* | 11/2018 | Zang ................. H01G 9/2009 |
| 10,475,710 | B1* | 11/2019 | Guo .................. H01L 21/324 |
| 2008/0292825 | A1 | 11/2008 | DeHaven et al. |
| 2013/0233377 | A1 | 9/2013 | Kanatzidis et al. |
| 2021/0395279 | A1* | 12/2021 | Taylor ................. C23C 14/0694 |

FOREIGN PATENT DOCUMENTS

| | | |
|---|---|---|
| WO | WO 2018/015831 A1 | 1/2018 |
| WO | WO 2018/026326 A1 | 2/2018 |

OTHER PUBLICATIONS

Pellet, Mixed-Organic-Cation Perovskite Photovoltaics for Enhanced Solar-Light Harvesting, Angew. Chem. Int. Ed. 2014, 53, 3151-3157 (Year: 2014).*

Smith, A Layered Hybrid Perovskite Solar-Cell Absorber with Enhanced Moisture Stability, Angew. Chem. Int. Ed. 2014, 53, 11232-11235 (Year: 2014).*

Ke, Weijun, et al. "Compositional and Solvent Engineering in Dion-Jacobson 2D Perovskites Boosts Solar Cell Efficiency and Stability." *Advanced Energy Materials*, vol. 9, No. 10, (2019): 1803384.

Stoumpos, Constantinos C., et al. "Ruddlesden-Popper hybrid lead iodide perovskite 2D homologous semiconductors." *Chemistry of Materials*, vol. 28, No. 8 (2016), pp. 2852-2867.

Lingling Mao et al., "Seven-Layered 2D Hybrid Lead Iodide Perovskites," *Chem*, vol. 5; pp. 2593-2604.

Lingling Mao et al., "Hybrid Dion-Jacobson 2D Lead Iodide Perovskites," *Journal of the American Chemical Society*, American Chemical Society, 2018, vol. 140, No. 10; pp. 3775-3783.

Chan Myae Myae Soe et al., "Structural and thermodynamic limits of layer thickness in 2D halide perovskites," *PNAS*, Jan. 2, 2019, vol. 116, No. 1; pp. 58-66.

J.-C. Blancon et al., "Scaling law for excitons in 2D perovskite quantum wells," *Nature Communication*; pp. 1-10.

Chan Myae Myae Soe et al., New Type of 2D Perovskites with Alternating Cations in the Interlayer Space, (C(NH 2) 3) (CH 3 NH 3) n Pb n I 3 n+1: Structure, Properties, and Photovoltaic Performance, *Journal of the American Chemical Society*, American Chemical Society, 2017, vol. 139, No. 45; pp. 16297-16309.

The International Search Report and the Written Opinion issued on Dec. 27, 2019 for International Patent Application No. PCT/US2019/056036; pp. 1-7.

Pellet et al., "Mixed-Organic-Cation Perovskite Photovoltaics for Enhanced Solar-Light Harvesting," *Angewandte Chemie International Edition*, vol. 53, Issue 12; Feb. 19, 2014; pp. 1-3. Retrieved on Nov. 27, 2019, Retrieved from the Internet: URL: https://onlinelibrary.wiley.com/doi/10.1002/anie.201309361 . . . Abstract.

International Search Report and Written Opinion issued in PCT/US2016/056370, Feb. 16, 2017.

Cao et al., 2D Homologous Perovskites as Light-Absorbing Materials for Solar Cell Applications, Journal of the American Chemical Society, vol. 137, May 28, 2015, pp. 7843-7850.

Filip et al., Steric engineering of metal-halide perovskites with tunable optical band gaps, Nature Communications, vol. 5, Dec. 15, 2014.

Mitzi et al., Templating and structural engineering in organic-inorganic perovskites, Journal of the Chemical Society-Dalton Transactions, Dec. 5, 2000, pp. 1-12.

Mitzi et al., Conducting layered organic-inorganic halides containing (110)-oriented perovskite sheets, Science, vol. 267, Mar. 10, 1995, pp. 1473-1476.

Mitzi et al., Conducting tin halides with a layered organic-based perovskite structure, Nature, vol. 369, Jun. 9, 1994, pp. 467-469.

Arachchige et al., Mercouri G. Kanatzidis: Excellence and Innovations in Inorganic and Solid-State Chemistry, Inorg. Chem., 56, Jun. 27, 2017, pp. 7582-7597.

Stoumpos et al., High Members of the 2D Ruddlesden-Popper Halide Perovskites: Synthesis, Optical Properties, and Solar Cells of (CH3(CH2)3NH3)4(CH3NH3)4Pb5I16, Chem 2, Mar. 9, 2017, pp. 427-440.

Calabrese et al., J. Am. Chem. Soc. (1991), 113, 2328.
Mei et al. Science 345 (2014) 295.
Kojima et al., J. Am. Chem. Soc. (2009), 131, 6050.
Zhou et al., Science (2014), 345, 542.
Hao et al., Nat. Photonics (2014), 8, 489.
Noel et al., J. Energy Environ. Sci. (2014), 7, 3061.
Ogomi et al., J. Phys. Chem. Lett. 2014, 5, 1004.
Hao et al., J. Am. Chem. Soc. (2014), 136, 8094.
Zuo, et al., Adv. Mater. (2014), 26, 6454.
Mitzi, D. B. Chem. Mater. (1996), 8, 791.
Mitzi, D. B.; Liang, K. Chem. Mater. (1997), 9, 2990.
Kagan et al., Science (1999), 286, 945.
Ishihara et al., Solid State Commun. (1989), 69, 933.
Wu et al., J. Am. Chem. Soc. 2015, 137, 2089.
Papavassiliou et al., Prog Solid State Ch (1997), 25 (3-4), 125-270.
Yan et al., Cation ordering within the perovskite block of a six-layer Ruddlesden-Popper oxide from layer-by-layer growth—artificial interfaces in complex unit cells. Chemical Science (2011), 2 (2), 261-272.

Smith et al., A Layered Hybrid Perovskite Solar-Cell Absorber with Enhanced Moisture Stability, Angewandte Chemie, vol. 126, Sep. 1, 2014, 11414-11417.

Shi et al., Self-Assembly and X-ray Structure Determination of the Novel 2-D Layered Organic-Inorganic Hybrid Pb-X Compound: [PbX2(4,4'-bipy)]n (X = I, Br), Chemistry Letters, 2001, vol. 30, pp. 678-679.

Billing et al., Synthesis, characterization and phase transitions in the inorganic-organic layered perovskite-type hybrids [(CnH2n + 1NH3)2PbI4], n = 4, 5 and 6, Acta Cryst., B63, (2007), pp. 735-747.

Billing et al., Synthesis, characterization and phase transitions of the inorganic-organic layered perovskite-type hybrids [(CnH2n+1NH3)2PbI4] (n = 12, 14, 16 and 18), New J. Chem., 32, (2018), pp. 1736-1746.

Shiguo Han et al., "Exploring a Polar Two-dimensional Multi-layered Hybrid Perovskite of (C5H11NH3)2(CH3NH3)Pb2I7 for Ultrafast-Responding Photodetection," Laser Photonics Rev. 2018, vol. 12, 1800060 (1-6).

* cited by examiner

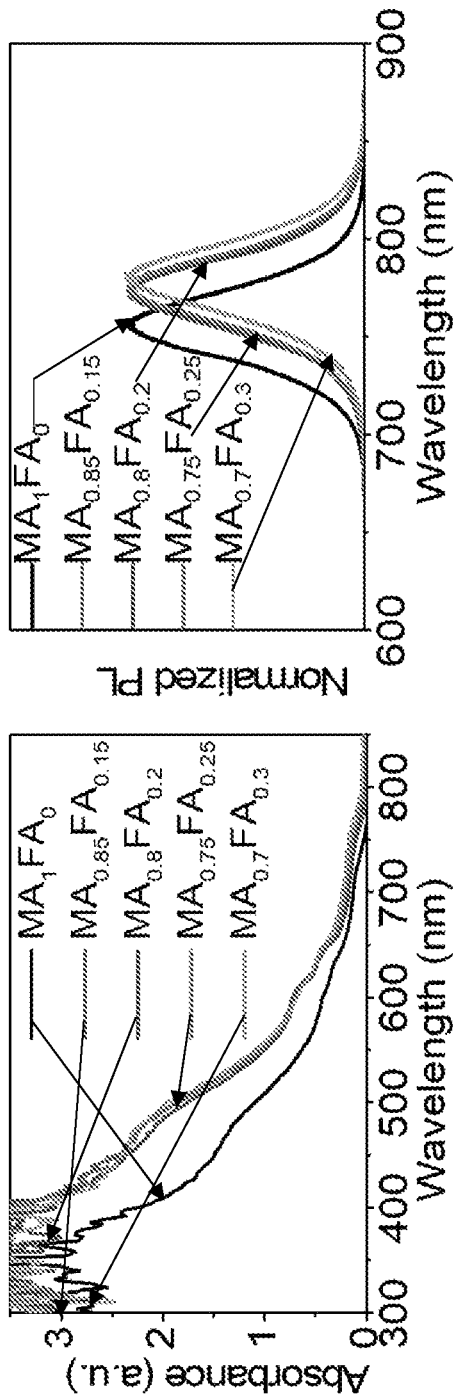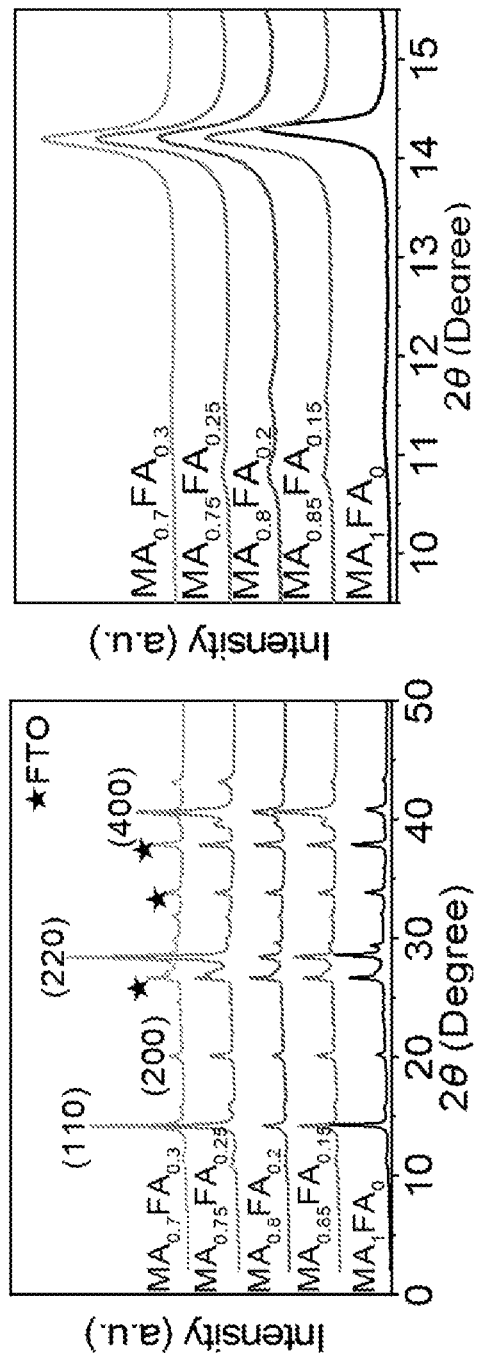
FIG. 8A  FIG. 8B  FIG. 8C  FIG. 8D

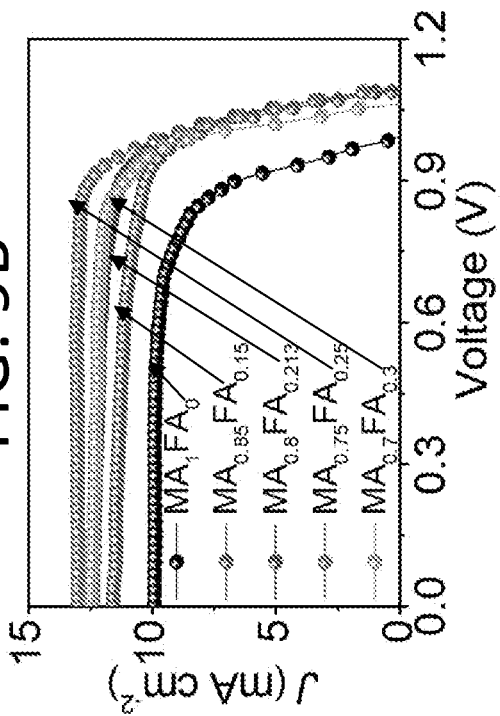
FIG. 9A
FIG. 9B
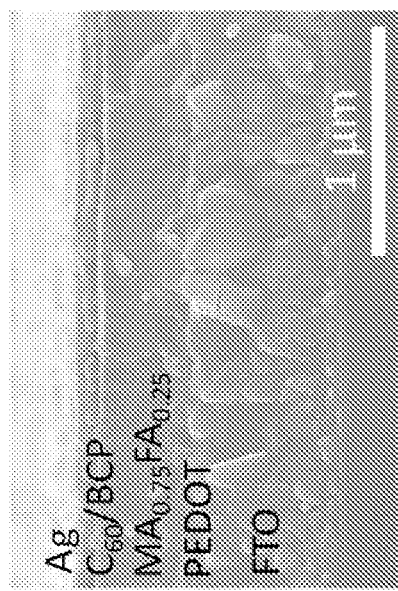
FIG. 9C
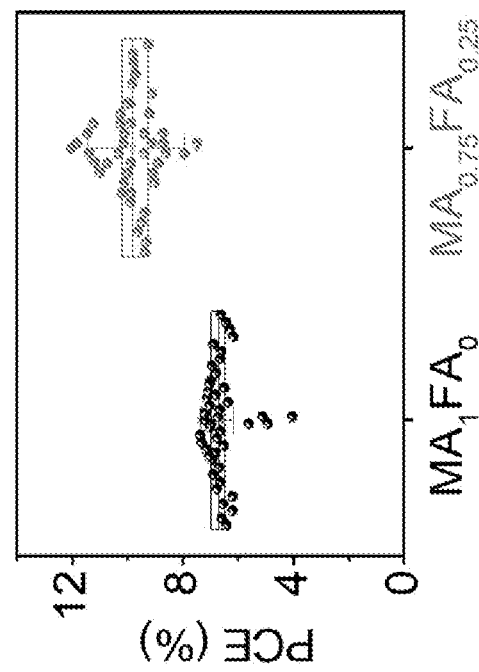
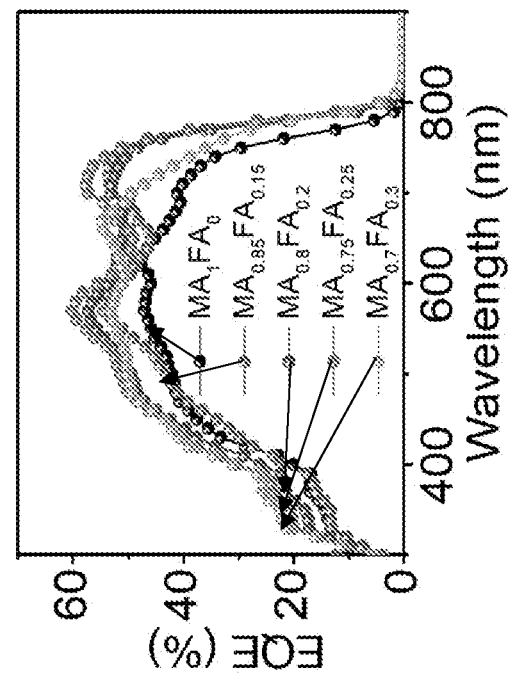
FIG. 9D

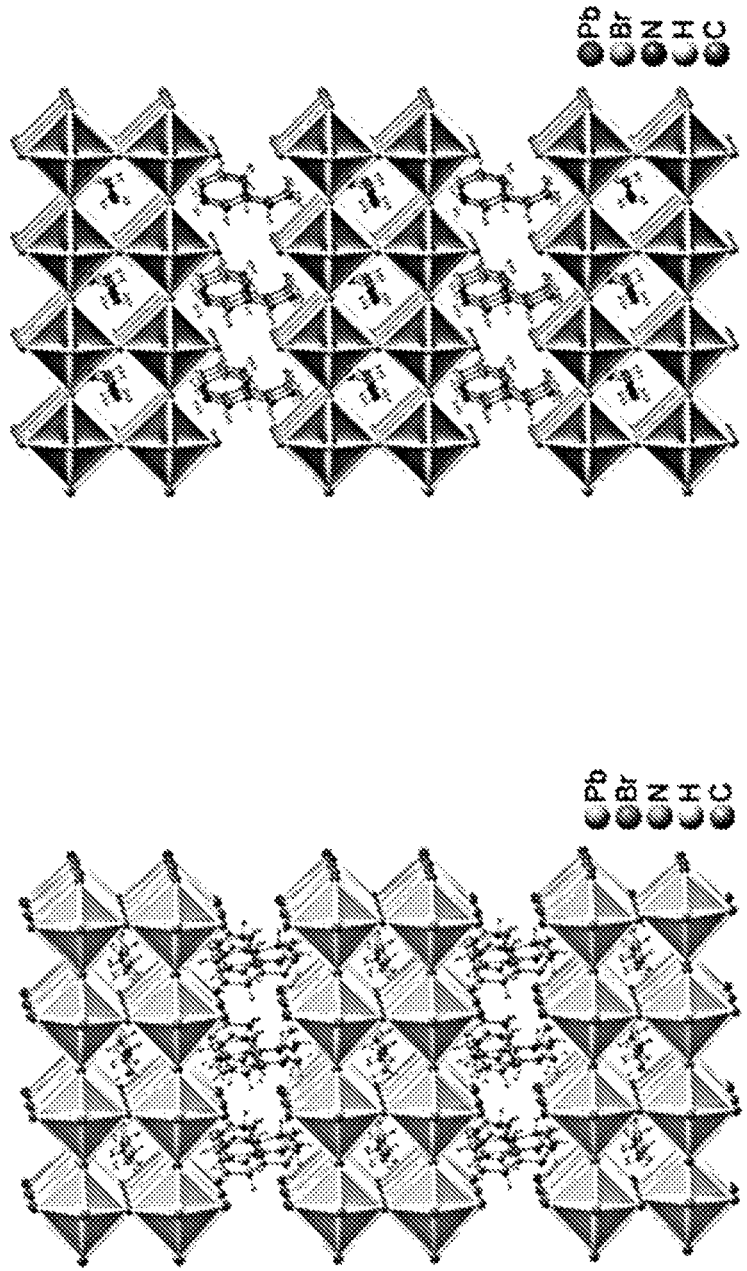
FIG. 12A
FIG. 12B

Crystal structure (4AMP)(MA)Pb$_2$Br$_7$ (4AMP)(FA)Pb$_2$Br$_7$

Crystal structure (4AMP)(MA)Pb$_2$Br$_7$ (4AMP)(FA)Pb$_2$Br$_7$

Powder X-ray diffraction

Band gaps

FIG. 24A  (4AMP)(MA)$_6$Pb$_7$I$_{22}$
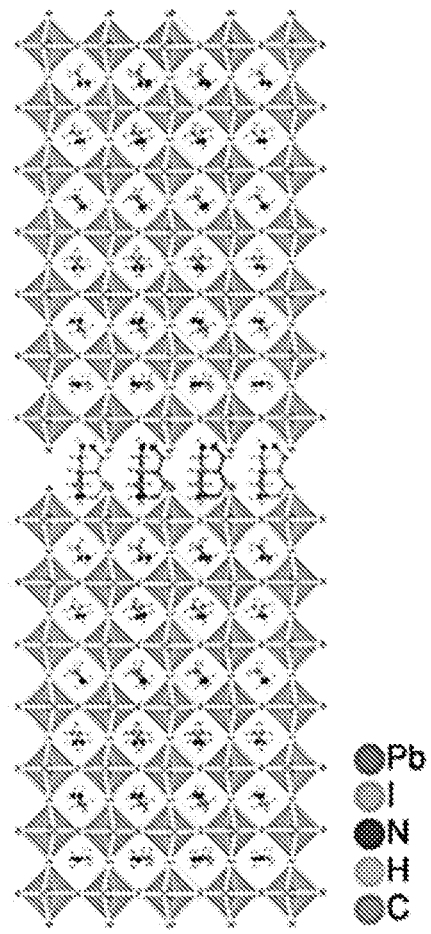
FIG. 24C
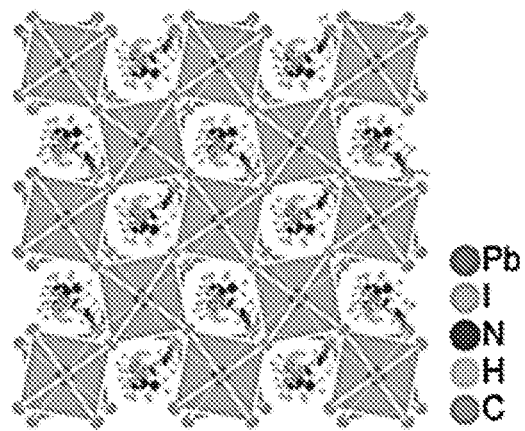

FIG. 24B  $(BA)_2(MA)_6Pb_7I_{22}$
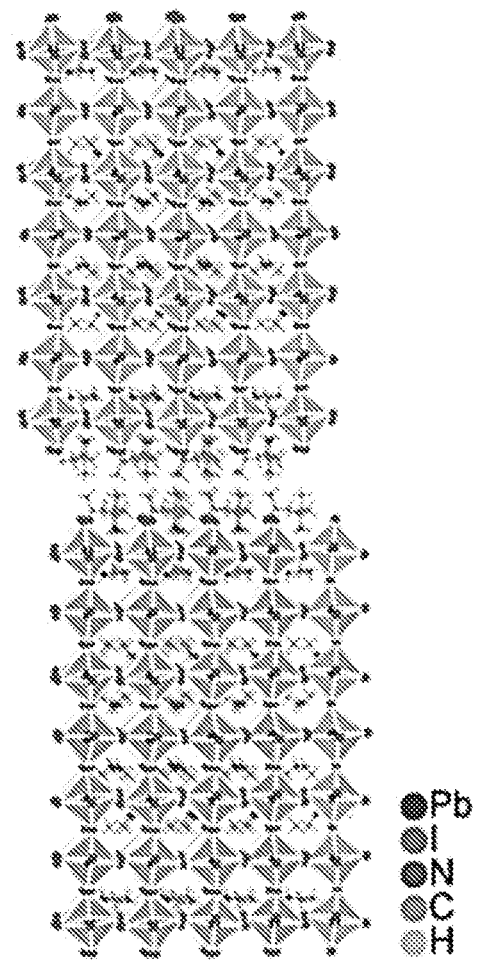
FIG. 24D
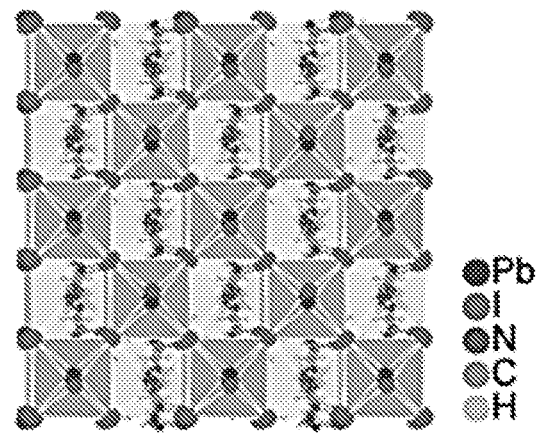

TWO-DIMENSIONAL PEROVSKITES FOR STABLE AND EFFICIENT PHOTOVOLTAIC CELLS

CROSS-REFERENCE TO RELATED APPLICATIONS

This application is a National Stage of International Application No. PCT/US19/56036, filed Oct. 14, 2019, which claims the priority benefit of U.S. Provisional Patent Application No. 62/745,563, filed Oct. 15, 2018, the entire disclosures of which are incorporated by reference herein.

REFERENCE TO GOVERNMENT RIGHTS

This invention was made with government support under DE-SC0001059 and SC0012541 awarded by the Department of Energy. The government has certain rights in the invention.

BACKGROUND

Organic-inorganic halide perovskites are promising as next-generation solar cells absorbers because of their tunable band gaps, high absorption coefficients, long carrier lifetimes, and greater stability. High-performance perovskite solar cells are dominated by three-dimensional (3D) perovskites such as methylammonium lead iodide (MAPbI$_3$), formamidinium lead iodide (FAPbI$_3$), and their mixtures. The long-term stability of 3D halide perovskites with organic cations is still an open issue and under intense investigation. To fulfill further commercialization requirements, in addition to high efficiency, solar cells should also possess good environment stability, enabling the devices to run for a very long time. Two-dimensional (2D) halide perovskites with bulky organic cations are attracting attention because of their better moisture resistance by the protection of the hydrophobic organic spacer layer. The family of A'$_2$A$_{n-1}$M$_n$X$_{3n+1}$, referred as Ruddlesden-Popper (RP) 2D perovskites, has (PEA)$_2$(MA)$_{n-1}$Pb$_n$I$_{3n+1}$ and (BA)$_2$(MA)$_{n-1}$Pb$_n$I$_{3n+1}$ (PEA=phenylethylammonium, BA=butylammonium) as representative members. Much work so far has focused on 2D RP perovskite solar cells by optimizing the film orientation and optoelectronic properties to push the efficiency higher.

SUMMARY 2D halide perovskites are provided. Also provided are photovoltaic cells comprising the 2D perovskites as photoactive materials.

Some embodiments of the 2D halide perovskites have the formula (I) A'(A)$_{n-1}$M$_n$X$_{3n+1}$, wherein A' is a 3-(aminomethyl)piperidinium (3AMP) cation or a 4-(aminomethyl)piperidinium (4AMP) cation, A is a perovskitizer cation, M is Ge, Sn, Pb or a combination thereof; X is I, Br, Cl, F or a combination thereof; and n is an integer in the range from 1 to 12. The 2D perovskites have a structure that includes a plurality of perovskite layers composed of inorganic [MX6]$^{4-}$ octahedral and the perovskitizer cations, wherein the perovskite layers are confined between layers of the A' cations.

Other embodiments of the 2D halide perovskites have the formula (A'$_{1-y}$A'''y)(A$_{1-x}$A''$_x$)$_{n-1}$M$_n$X$_{3n+1}$, wherein A' is a 3AMP cation, A''' is a 4AMP cation, A is a first perovskitizer cation, A'' is a second perovskitizer cation, M is Ge, Sn, Pb, or a combination thereof, X is I, Br, Cl, F, or a combination thereof, n is an integer in the range from 1 to 12, 0≤x≤1, and 0≤y≤1, provided that at least one of x and y has a value that is greater than 0 and less than 1. These 2D perovskites also have a structure that includes a plurality of perovskite layers comprising inorganic [MX$_6$]$^{4-}$ octahedral and the perovskitizer cations, wherein the perovskite layers are confined between layers of the A' cations.

One embodiment of a photovoltaic cell includes: a first electrode comprising an electrically conductive material; a second electrode comprising an electrically conductive material; and a 2D halide perovskite of a type described herein in electrical communication with the first electrode and the second electrode.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIGS. 3A and 3B show optical absorption spectra of 3AMP and 4AMP series. FIGS. 3C and 3D show steady-state photoluminescence (PL) spectra of 3AMP and 4AMP series. FIGS. 3E and 3F show a summary of absorption and PL in energy from n=1 to 5.

FIG. 6A shows a scheme of the adopted inverted device structure. FIG. 6B shows photocurrent density-voltage (J-V) curves of the 2D perovskite solar cell devices. FIG. 6C shows external quantum efficiency (EQE) spectra. FIG. 6D shows powder X-ray diffraction (PXRD) of the thin-films. FIG. 6E shows steady-state PL spectra, where the emission peaks are: 746 nm, 1.66 eV(3AMPPb$_3$I$_{10}$), 764 nm, 1.62 eV (3AMPPb$_4$I$_{13}$), 752 nm, 1.65 eV (4AMPPb$_3$I$_{10}$ and 4AMPPb$_4$I$_{13}$). FIG. 6F shows absorption spectra for the thin-films.

FIG. 8A shows ultraviolet-visible (UV-vis) absorption spectra, FIG. 8B shows PL spectra, and FIGS. 8C-8D show X-ray diffraction (XRD) patterns of (3AMP)(MA$_{1-x}$FA$_x$)$_3$Pb$_4$I$_{13}$ (x=0-0.3) films deposited on fluorine-doped tin oxide/poly(3,4-ethylenedioxythiophene) polystyrene sulfonate (FTO/PEDOT:PSS) substrates.

FIG. 9A shows a cross-sectional scanning electron microscopy (SEM) image of a completed (3AMP)(MA$_{0.75}$FA$_{0.25}$)$_3$Pb$_4$I$_{13}$ solar cell having planar device architecture. FIG. 9B shows J-V curves and FIG. 9C shows EQE spectra of (3AMP)(MA$_{1-x}$FA$_x$)$_3$Pb$_4$I$_{13}$ (x=0-0.3) solar cells. FIG. 9D shows power conversion efficiency (PCE) statistics for 45 (3AMP)MA$_3$Pb$_4$I$_{13}$ cells and 45 (3AMP)(MA$_{0.75}$FA$_{0.25}$)$_3$Pb$_4$I$_{13}$ cells.

FIGS. 12A-12L show the general structure of additional two-dimensional halide perovskites prepared according to another illustrative embodiment.

FIGS. 24A-24D show the crystal structure of (FIG. 24A) DJ phase (4AMP)(MA)$_6$Pb$_7$I$_{22}$ and (FIG. 24B) RP phase (BA)$_2$(MA)$_6$Pb$_7$I$_{22}$, and a top-down view of the layers in (FIG. 24C) (4AMP)(MA)$_6$Pb$_7$I$_{22}$ and (FIG. 24D) (BA)$_2$(MA)$_6$Pb$_7$I$_{22}$. The layers of DJ perovskite lay on top of each other, whereas the RP phase shows an offset shifting of one octahedral unit.

FIGS. 25E and 25F show distortion evaluation of individual [PbI$_6$]octahedron using bond angle variance (BAV) and distortion index (DI) calculated by Vesta software. The DJ phase shows a much lower distortion level than the RP phase both on BAV and DI. FIG. 25G shows classification of axial (perpendicular to the layers) and equatorial (along the layers) Pb—I—Pb angles. FIG. 25H shows a comparison between averaged axial, equatorial, and total Pb—I—Pb angles.

Figure 1A:
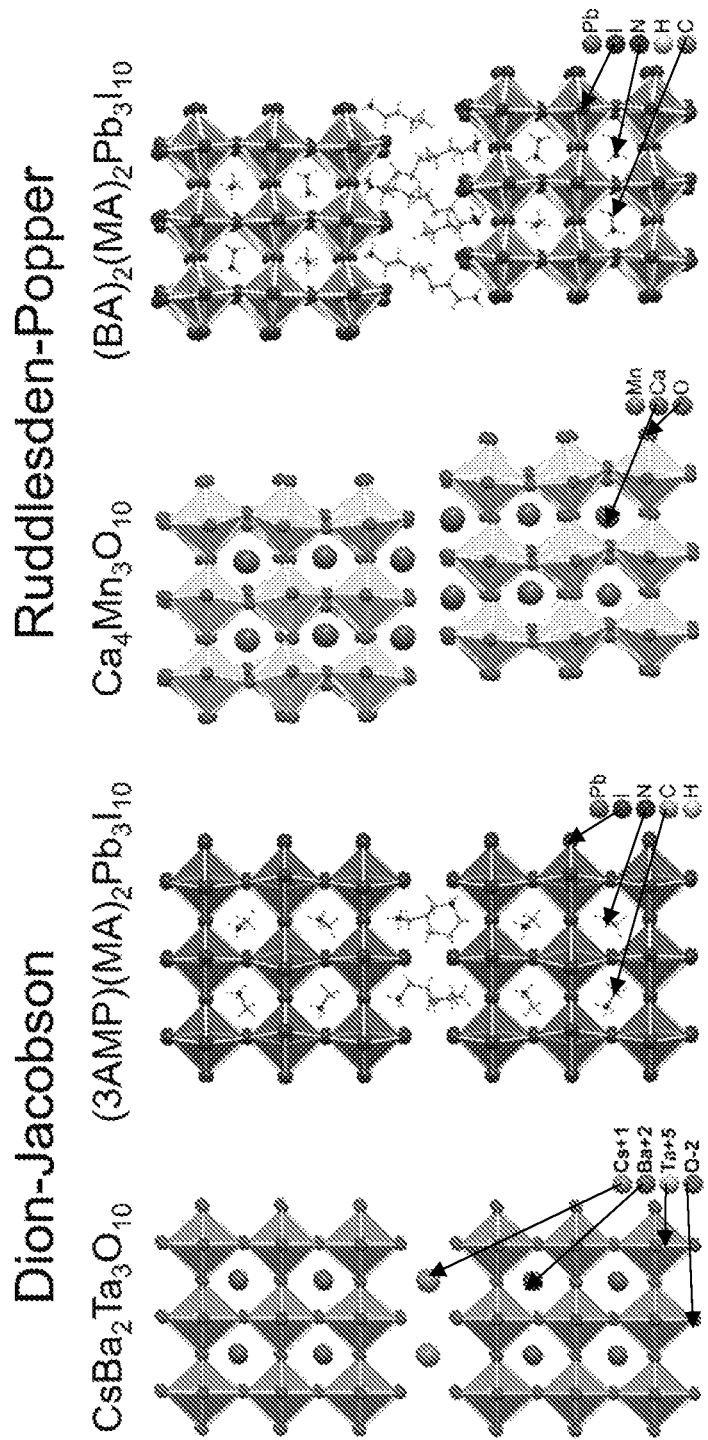
FIG. 1A shows a comparison between Dion-Jacobson (DJ) phases and RP phases for both oxide and halide perovskites.

DETAILED DESCRIPTION 2D halide perovskites having DJ phases are provided. Also provided are radiation-absorbing materials comprising the perovskites and photovoltaic cells comprising the radiation-absorbing materials as photoactive materials.

The structural differences between RP and DJ halide perovskites are mainly caused by the inter-layer cations (spacers), where RP phases have two sheets of interdigitating cations (1+) while the DJ phases only have one sheet of inter-layer cations (2+) between the inorganic slabs. The influence of the spacers on inorganic slabs is exerted on many levels, depending on the cation size and shape (steric effect), charge (electrostatic attraction) and the position of the functional groups (H-bonding and dispersion forces). This difference between RP and DJ perovskites is also reflected in their general formulas, where the RP phase has a general formula of $A'_2A_{n-1}M_nX_{3n+1}$ and the DJ phase has a general formula of $A'A_{n-1}M_nX_{3n+1}$ (A'=inter-layer cation). Structurally, the DJ perovskites are characterized by a periodically ordered structure in which a plurality of perovskite layers comprising inorganic $[MX_6]^{4-}$ octahedra, with A cations within the perovskite cages, are confined between layers of the A' cations, which provide a spacer between the perovskite layers.

Some embodiments of the 2D perovskites have the formula (I) $A'A_{n-1}M_nX_{3n+1}$, wherein A' is a divalent organic cation, A is a univalent cation, M is a divalent metal, X is a halide anion, and n is an integer, e.g., from 1 to 12. The univalent cation, A, is a perovskitizer and may be a univalent organic cation or a univalent inorganic cation.

In some embodiments, A' is an alkyl ammonium functionalized piperidinium, i.e., a piperidinium in which one of the hydrogens bound to a carbon of the heterocyclic amine has been replaced by an alkyl ammonium. Illustrative such A' cations include 3AMP and 4AMP.

The perovskitizer cation, A, is a small cation that directs the formation of a perovskite structure. Various organic and inorganic pervoskitizers are known. In some embodiments, A is an alkyl ammonium. Illustrative alkyl ammoniums include methyl ammonium and dimethylammonium. In some embodiments, A is an amidinium. An illustrative amidinium is formamidinium. In some embodiments, A is guanidinium. In some embodiments, A is cesium (Cs) or rubidium (Rb).

In some embodiments, M is selected from Ge, Sn, Pb, or a combination thereof. In some embodiments, X is selected from I, Br, Cl, F, or a combination thereof. In some embodiments, n≥2, n≥3, n≥4, n≥5, n≥6, or n≥7. For example, in various illustrative embodiments of the 2D perovskites, n has a value of 2, 3, 4, 5, 6, or 7. The use of 2D DJ perovskites having higher n values may be advantageous because they enable the construction of thicker perovskite layers.

In other embodiments, the 2D perovskites are mixed cation 2D perovskites having the formula (IA) $(A'_{1-y}A'''_y)(A_{1-x}A''_x)_{n-1}M_nX_{3n+1}$, wherein A' and A''' are two different alkyl ammonium functionalized piperidinium cations, such as 3AMP and 4AMP; $A_1$ and A'' are two different perovskitizer cations; M is Ge, Sn, Pb, or a combination thereof; X is I, Br, Cl, F, or a combination thereof; n is an integer in the range from 1 to 12, 0≤x≤1, and 0≤y≤1, provided that at least one of x and y has a value that is greater than 0 and less than 1. In some embodiments of the mixed cation 2D perovskites, the perovskitizer cations may be independently selected from methyl ammonium, formamidinium, dimethylammonium, guanidinium, Cs, and Rb. In some embodiments, A is methyl ammonium and A'' is formamidinium. In some embodiments of the mixed cation 2D perovskites, M is Pb. In some embodiments of the mixed cation 2D perovskites, X is I or Br.

In some embodiments of the mixed cation 2D perovskites, n is 2, 3, 4, 5, 6, or 7. In some embodiments, 0≤y≤1. For example, y may have a value in the range from 0.05 to 0.95 (e.g., in the range from 0.25 to 0.75), including any of the following values: 0.05, 0.25, 0.50, 0.75, or 0.95. In some embodiments, 0≤x≤1. For example, x may have a value in the range from 0.05 to 0.95 (e.g., in the range from 0.25 to 0.75), including any of the following values: 0.05, 0.10, 0.15, 0.20, 0.25, 0.30, 0.35, 0.40, 0.45, 0.50, 0.55, 0.65, 0.70, 0.75, 0.80, 0.85, 0.90, or 0.95.

The 2D perovskites can be configured as photoactive, radiation-absorbing materials by applying a thin film of the perovskite on a substrate, e.g., an electron acceptor. The electron acceptor substrate may be a semiconductor such as a semiconducting metal oxide. The radiation-absorbing materials can be made by applying a solution comprising any of the 2D perovskites disclosed herein and an organic solvent (or a combination of organic solvents). An additive such as a strong acid, e.g., HI, may be included in the solution. As described in the Examples, below, such an additive is useful for ensuring desirable film morphology, crystalline quality, and crystal orientation. The solution may be applied using, e.g., spin coating. The deposition may be conducted at room temperature. As—deposited films may be dried and optionally, annealed.

Figure 6B:
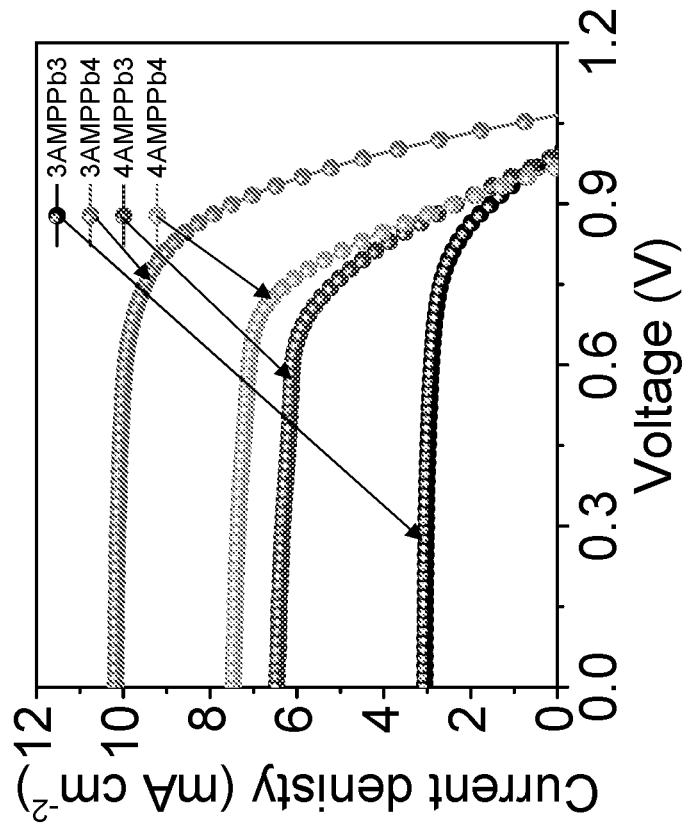
FIGS. 6A-6F illustrate solar cell architecture for the higher layer numbers (n=3 and 4) of 3AMP and 4AMP.
Figure 6A:
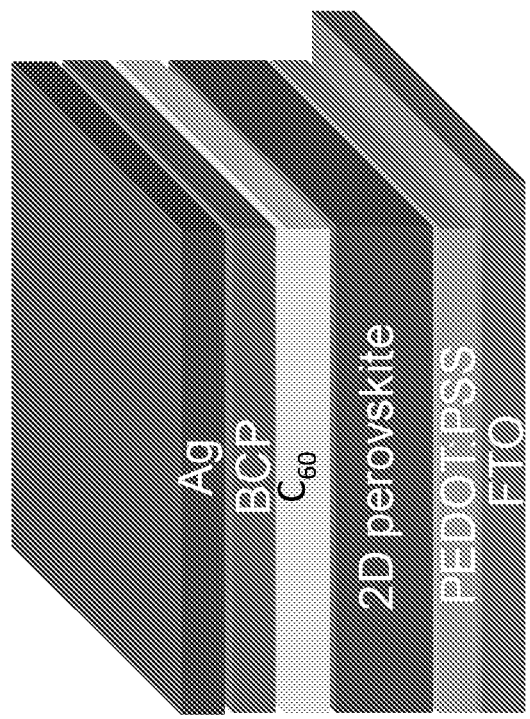

The 2D perovskites (and the radiation-absorbing materials) may be used in a variety of optoelectronic applications, e.g., as the photoactive materials in a photovoltaic cell. A schematic illustration of a photovoltaic cell comprising a 2D perovskite-based radiation-absorbing material in its photoactive layer is shown in FIG. 6A. The photovoltaic cell comprises a first electrode comprising an electrically conductive material (e.g., FTO), a second electrode comprising an electrically conductive material (e.g., Ag), a light absorbing layer comprising the radiation-absorbing material ("2D perovskite") disposed between (including partially between) and in electrical communication with the first and second electrodes, and an organic hole transporting material (e.g., PEDOT:PSS) disposed between (including partially between) the first and second electrodes and configured to facilitate the transport of holes (that is, to provide preferential transport of holes relative to electrons) generated in the radiation-absorbing material to one of the first or second electrodes. Other layers commonly used in thin film photovoltaic cells, such as electron transport layers (ETLs) (e.g., a bilayer of C60 and bathocuproine (BCP) as shown in FIG. 6A), hole blocking layers, and the like, may also be incorporated into the photovoltaic cells.

At least one of the two electrodes is desirably transparent to the incident radiation (e.g., solar radiation). The transparent nature of the electrode can be accomplished by constructing the electrode from a transparent material or by using an electrode that does not completely cover the incident surface of the cell (e.g., a patterned electrode). In the embodiment of FIG. 6A, the transparent electrode comprises a transparent conducting oxide (e.g., FTO) coated on a transparent substrate.

Photovoltaic cells comprising radiation-absorbing layers comprising the 2D perovskite compounds disclosed herein can have significant power conversion efficiencies. For example, photovoltaic cells having power conversion efficiencies of at least 7%, at least 9%, at least 10%, at least 11%, at least 12%, at least 13%, or at least 14% are provided. In addition, photovoltaic cells comprising radiation-absorbing layers comprising the two-dimensional perovskite compounds disclosed herein can be extremely stable. For example, photovoltaic cells having power conversion efficiencies which remain within 10%, 15%, 20%, or 25% of their initial values after at least 24 hours, 48 hours, or 72 hours are provided. These power conversion efficiencies may be measured under AM 1.5G solar illumination in ambient air at 50-60% relative humidity as further described in the Examples, below.

EXAMPLES

Example 1

Figure 1B:
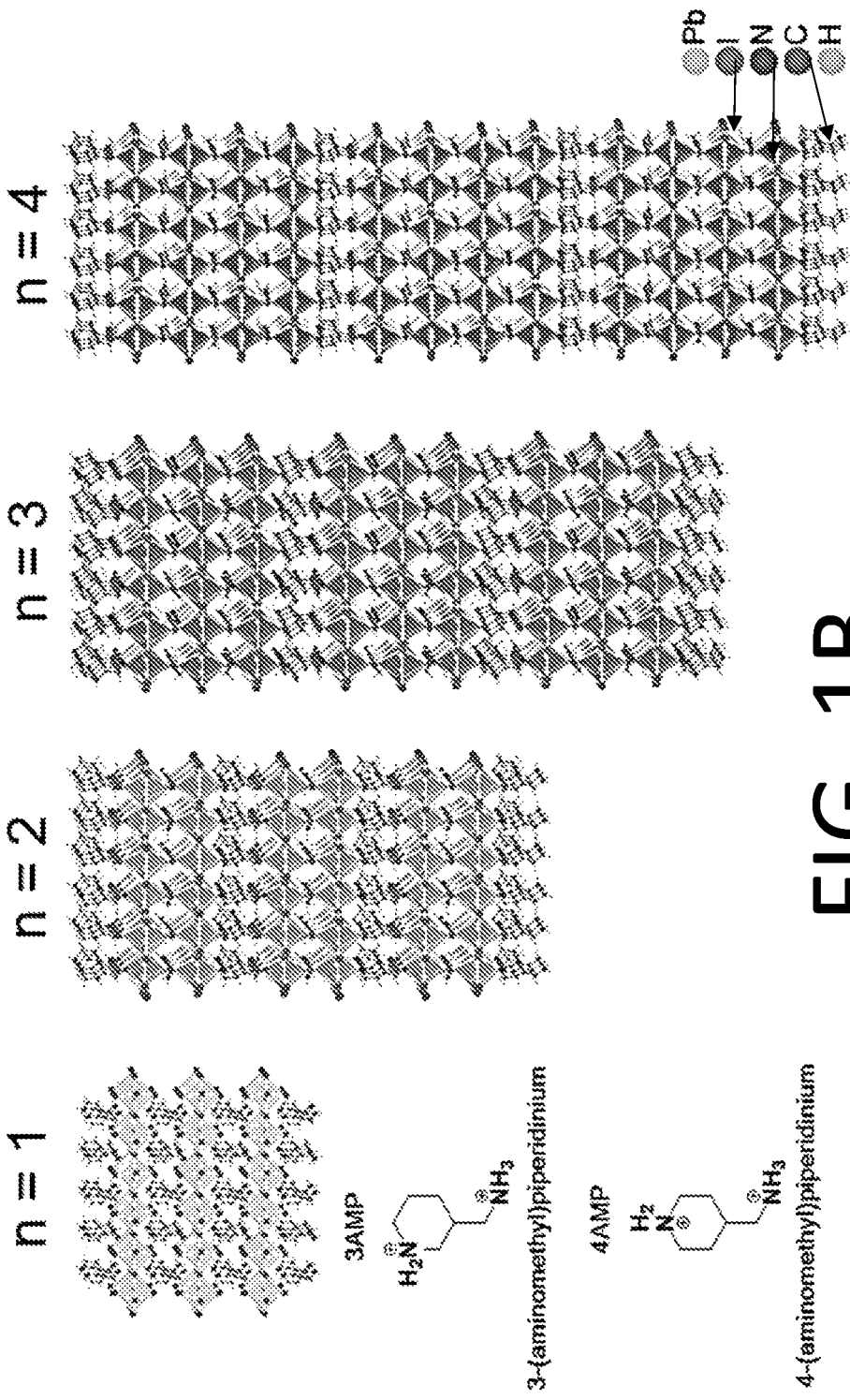
FIG. 1B shows the general crystal structure of the two series of DJ perovskites reported here, from n=1 to 4. Structures of the cation 3AMP and 4AMP are listed in the lower left corner.

Example 1 reports the first examples of hybrid 2D DJ lead iodide perovskites which consist of thick perovskite slabs (n>1) with layer number (n) ranging from 1 to 4. Two new DJ perovskite series are described herein based on bivalent (+2) organic cations deriving from a piperidinium ($C_5NH_{12}$) organic backbone (FIG. 1B). The new DJ perovskites are built from 3AMP and 4AMP cations between the layers ("spacers") and methylammonium (MA) cations inside the 2D layers ("perovskitizers") to form (A') $(MA)_{n-1}Pb_nI_{3n+1}$ (A'=3AMP or 4AMP, n=1-4) homologous series. With the exception of the n=1 members, the 3AMP and 4AMP series with a representative crystal structure sequence are shown in FIG. 1B. The difference in the position of the —$CH_2NH_3^+$ group on the piperidine chair (3- and 4-position with respect to the piperidine nitrogen) was found to influence the crystal structure through different hydrogen bonding modes, which is further reflected on the distortion of the inorganic layers. This difference has a major impact on the optical and electronic properties, which show a narrowing of the bandgap and an enhanced charge transport performance for the least distorted structure (3AMP). DFT calculations are in good agreement with the observed trends. The superior optoelectronic properties of these materials are further demonstrated on photovoltaic devices. Owing to the less distorted crystal structure, the 3AMP series shows a superior performance (~7% champion efficiency for n=4) to the 4AMP series (~5% champion efficiency for n=4). These two series of examples showcase the power of utilizing different templating organic cations to influence the semiconducting properties of the inorganic part of the perovskites, which broaden the horizons of 2D perovskites for achieving new solar cells and other optoelectronic devices with better characteristics.

Methods

Materials. PbO (99.9%), 3-(aminomethyl)piperidine (Aldrich$^{CPR}$)4-(aminomethyl)piperidine (96%), hydroiodic acid (57 wt. % in $H_2O$, distilled, stabilized, 99.95%) and hypophosphorous acid solution (50 wt. % in $H_2O$) were purchased from Sigma-Aldrich and used as received. Methylammonium iodide (>99.5%) was purchased from Luminescence Technology Corp. and used as received.

Synthesis of $(3AMP)(MA)_{n-1}Pb_nI_{3n+1}$. For n=1, an amount of 669 mg (3 mmol) 99.9% PbO powder was dissolved in 6 ml of hydroiodic acid and 1 ml of a hypophosphorous acid solution by heating under stirring for 5-10 min at ~130° C. until the solution turned to clear bright yellow. 0.5 ml hydroiodic acid was added to 342 mg (3 mmol) 3AMP in a separate vial under stirring. The protonated 3AMP solution was added into the previous solution under heating and stirring for 5 min. Red plate-like crystals precipitated during slow cooling to room temperature. The yield was 963 mg (38.6% based on total Pb content). For n=2, an amount of 669 mg (3 mmol) 99.9% PbO powder was dissolved in 6 ml of hydroiodic acid and 1 ml of hypophosphorous acid solution by heating under stirring for 5-10 min at 130° C. until the solution turned to clear bright yellow. 318 mg (2 mmol) of methylammonium iodide (MAI) was added directly to the above solution under heating. 0.5 ml hydroiodic acid was added to 57 mg (0.5 mmol) 3AMP in a separate vial under stirring. The protonated 3AMP solution was added into the previous solution under heating and stirring for 5 min. Dark red plate-like crystals precipitated (FIG. 1C) during slow cooling to room temperature. The yield was 487 mg (22.4% based on total Pb content). For the synthesis of higher numbers, the same route was followed except the ratios were changed to 37.6 mg (0.33 mmol) 3AMP, 477 mg (3 mmol) MAI, 669 mg (3 mmol) PbO for n=3, yielding 252 mg (12.2% based on total Pb content) and 34.2 mg (0.3 mmol) 3AMP, 636 mg (4 mmol) MAI, 892 mg (4 mmol) PbO for n=4, and yielding 301 mg (11.2% based on total Pb content).

Synthesis of $(4AMP)(MA)_{n-1}Pb_nI_{3n+1}$. Similar synthetic procedures were used to synthesize the 4AMP series. However, the amount of 4AMP was reduced, as the 4AMP series precipitated faster than the 3AMP. The experimental ratios (4AMP: MAI: PbO) (in mmol) of the 4AMP were 3:0:3 for n=1, 0.5:2:3 for n=2, 0.33:3:3 for n=3 and 0.27:4:4 for n=4. The yield was 1155 mg (46.3%), 684 mg (31.5%), 531 mg (25.6%) and 477 mg (17.7% based on total Pb content), respectively.

PXRD. PXRD analysis was performed using a Rigaku Miniflex600 powder X-ray diffractometer (Cu Kα graphite, λ=1.5406 Å) operating at 40 kV/15 mA with a Kβ foil filter.

Single Crystal XRD. Full sphere data were collected after screening for a few frames using either a STOE IPDS 2 or IPDS 2T diffractometer with graphite-monochromatized Mo Kα radiation (λ=0.71073 Å) (50 kV/40 mA) under $N_2$ at 293 K ($3AMPPbI_4$, $4AMPPbI_4$ and $(3AMP)(MA)_3Pb_4I_{13}$). The collected data were integrated and applied with numerical absorption corrections using the STOE X-AREA programs. The rest of the compounds were collected using a Bruker Molly instrument with MoKα IμS microfocus source (λ=0.71073 Å) with MX Optics at 250 K. The collected data were integrated and applied with numerical absorption corrections using the APEX3 software. Crystal structures were solved by charge flipping and refined by full-matrix least squares on $F^2$ with the Jana2006 package.

Optical Absorption Spectroscopy. Optical diffuse reflectance measurements were performed using a Shimadzu UV-3600 UV-VIS-NIR spectrometer operating in the 200-1000 nm region using $BaSO_4$ as the reference of 100% reflectance. The band gap of the material was estimated by converting reflectance to absorption according to the Kubelka-Munk equation: $\alpha/S=(1-R)^2(2R)^{-1}$, where R is the reflectance and a and S are the absorption and scattering coefficients, respectively.

Steady State and TRPL. Steady-state PL spectra were collected using an HORIBA LabRAM HR Evolution Confocal RAMAN microscope. A 473 nm laser (0.1% power) was used to excite all samples at 50× magnification. TRPL spectra were acquired using an HORIBA Fluorolog-3 equipped with a 450-W xenon lamp and a TCSPC module (diode laser excitation at λ=375 nm) and an integrating sphere (Horiba Quanta-φ) for absolute photoluminescence quantum yield determination. The spectra were corrected for the monochromator wavelength dependence and photomnultiplier response functions provided by the manufacturer.

Electronic Structure Calculations. First-principles calculations are based on DFT as implemented in the VASP package. (Kresse, G. et al., *Phys. Rev. B* 1996, 54, 11169; Kresse, G. et al., *Comput. Mater. Sci.* 1996, 6, 15-50; Shishkin, M. et al., *Phys. Rev. B* 2006, 74, 035101.) All calculations were carried out on the experimentally determined crystal structures. The Generalized Gradient Approximation (GGA) functional was used in the Perdew-Burke-Ernzerhof (PBE) form; the projector augmented wave (PAW) method was used with the PAW data set supplied in the VASP package with the following valence orbitals: Pb [$5d^{10}6s^26p^2$], I [$5s^25p^5$], N [$2s^22p^3$], H [$Is^1$] and C [$2s^22p^2$]. (Blöchl, P. E., *Phys. Rev. B* 1994, 50, 17953; Kresse, G. et al., *Phys. Rev. B* 1999, 59, 1758.) In addition, the wavefunctions were expanded using a plane-wave basis set with an energy cut-off of 500 eV. Spin-orbit coupling was systematically considered. For band structures, the reciprocal space integration was performed over a 4×4×1 Monkhorst- Pack grid for compounds with n=1 and n=3, and over a 4×4×4 grid for compounds with n=2 and n=4 in their primitive cells. (Monkhorst, H. J. et al., *Phys. Rev. B* 1976, 13, 5188; Pack, J. D. et al., *Phys. Rev. B* 1977, 16, 1748.)

Device fabrications. FTO glass substrates were coated with PEDOT:PSS by spin-coating at 4000 rpm for 30s, and then annealed at 150° C. for 30 min in air. The 2D perovskite precursors with a molar concentration of 0.6 M were prepared by dissolving the 2D perovskite crystal powders in a mixed solvent of N,N-Dimethylformamide (DMF) and Dimethyl sulfoxide (DMSO) with a volume ratio of 4:1. After the crystal powders dissolved, 0.8 vol % HI was added into the perovskite precursors. Then the precursors were coated on the substrates with a spin rate of 4000 rpm for 60s in a $N_2$-filled glove box. During the spin-coating, 0.7 mL diethyl ether was dropped on the rotating substrates at 20 s. After spin-coating, the films were annealed at 100° C. for 10 min in the glove box. To complete the devices, C60 (20 nm)/BCP (5 nm)/Ag (100 nm) were sequentially thermally evaporated on top of the perovskites. The active area of the solar cells was 0.09 $cm^2$.

Characterizations. J-V curves were measured by a Keithley model 2400 instrument under AM 1.5G simulated irradiation with a standard solar simulator (Abet Technologies). The light intensity of the solar simulator was calibrated by a National Renewable Energy Laboratory-certified monocrystalline silicon solar cell. EQE curves were measured by an Oriel model QE-PV-SI instrument equipped with a National Institute of Standards and Technology-certified Si diode.

Results and Discussion

The structural differences between RP and DJ halide perovskites are mainly caused by the inter-layer cations (spacers), where RP phases have two sheets of interdigitating cations ($1^+$), while the DJ phases only have one sheet of inter-layer cations ($2^+$) between the inorganic slabs. The influence of the spacers on inorganic slabs is exerted in many levels, depending on the cation size and shape (steric effect), charge (electrostatic attraction), and the position of the functional groups (H-bonding and dispersion forces). This difference between RP and DJ perovskites is also reflected in the general formula, where the RP phase has a general formula of $A'_2A_{n-1}M_nX_{3n+1}$ and the DJ phase has a general formula of $A'A_{n-1}M_nX_{3n+1}$ (A'=inter-layer cation). In hybrid DJ phases, the inter-layer organic cations are $2^+$, having less degrees of freedom, making the layers closer to each other. In RP phases, the organic cations are $1^+$, which results in more flexible layer stacking.

Figure 1C:
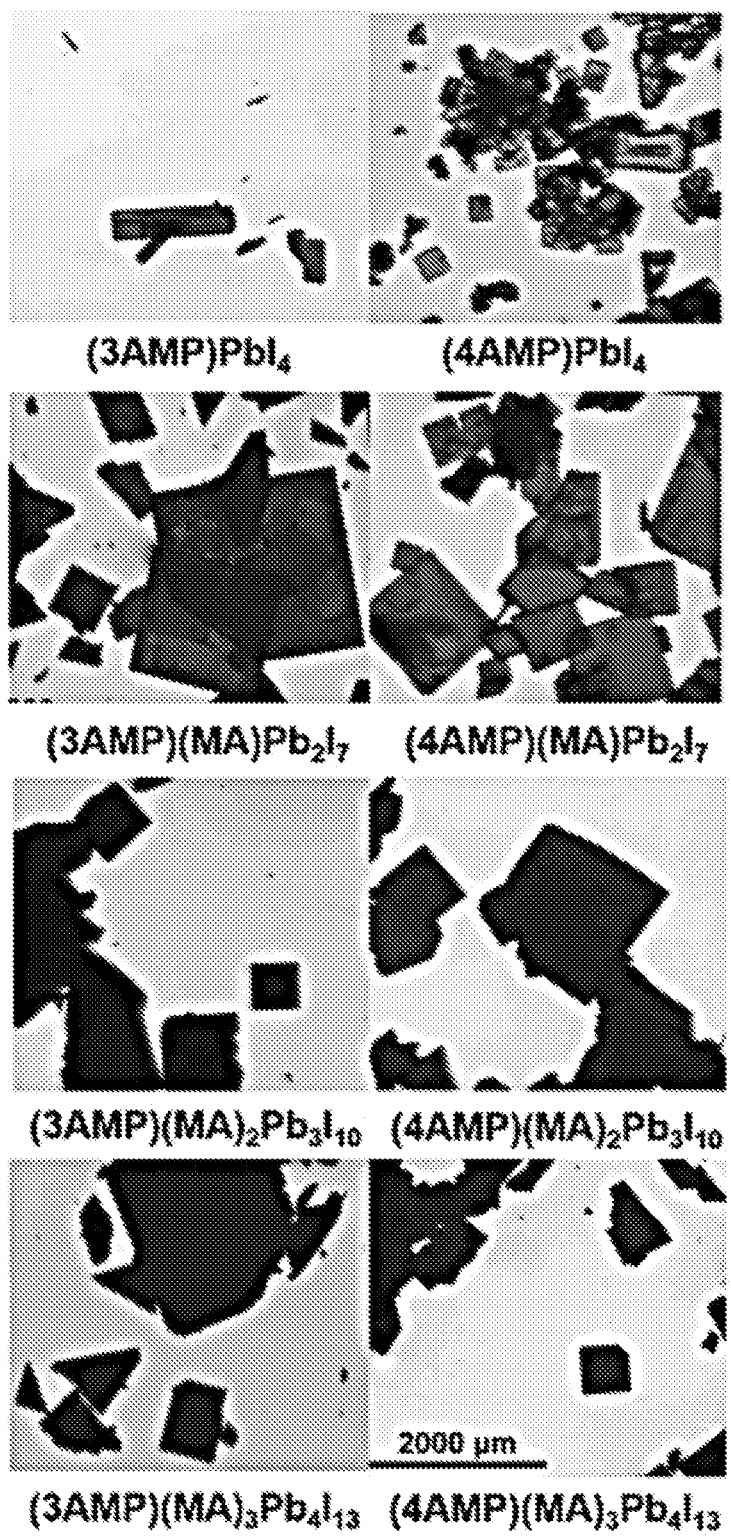
FIG. 1C shows optical images of the 3AMP and 4AMP crystals. The scale bar on the bottom right applies to all.

The DJ series of layered perovskites, $(A')(MA)_{n-1}Pb_nI_{3n+1}$ (A'=3AMP or 4AMP, n=1-4), produce uniform, square plate-like crystals, except 3-AMPPbI$_4$, which is an elongated plate as seen in FIG. 1C. For the 3AMP series, the color of the crystal gets progressively darker from n=1 to n=4. The 4AMP has a similar trend, but it starts from lighter colors than the 3AMP for the n=1 and n=2 members. The bulk crystals exhibit good stability in an ambient environment and can be handled without any protection during characterizations.

Figure 2A:
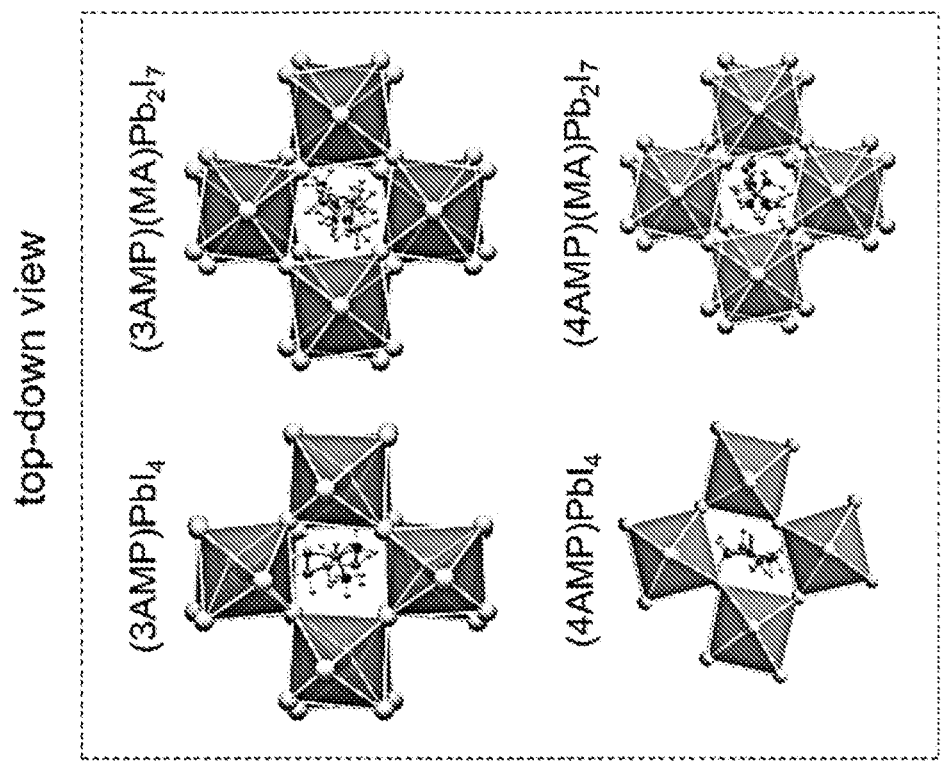
FIG. 2A shows a top-view of (3AMP)PbI$_4$, (4AMP)PbI$_4$, (3AMP)(MA)Pb$_2$I$_7$, and (4AMP)(MA)Pb$_2$I$_7$.
Figure 2B:
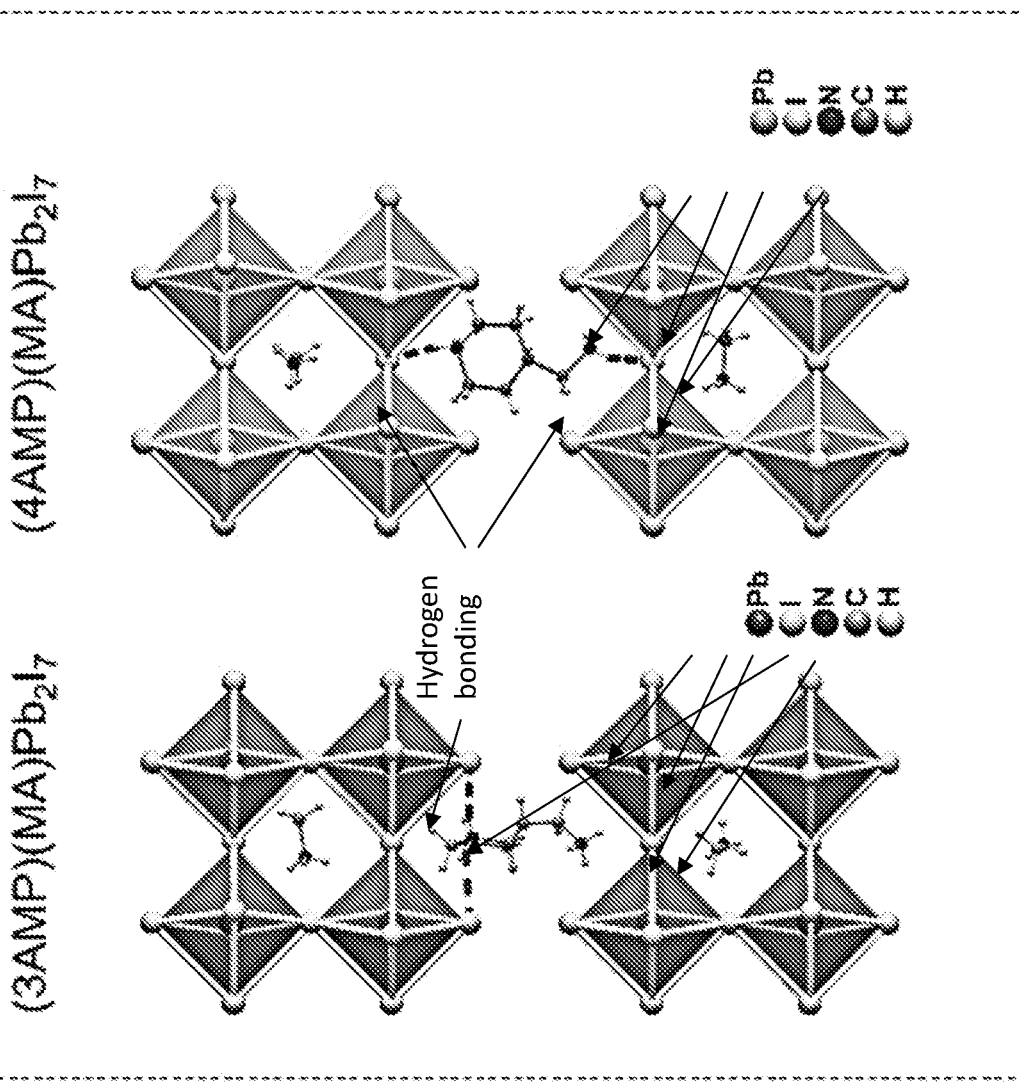
FIG. 2B shows a side-view of (3AMP)(MA)Pb$_2$I$_7$ and (4AMP)(MA)Pb$_2$I$_7$; hydrogen bonding is marked.

Both $(A')(MA)_{n-1}Pb_nI_{3n+1}$ series form isostructural analogues for n>1. Detailed crystallographic data and structural refinements for all eight compounds reported here are listed in Table 1 (see Mao et al., *J. Am. Chem. Soc.* 2018, 140, 3775-3783, which is hereby incorporated by reference in its entirety). They consist of n layers (~6.3 Å is the thickness of one octahedron) of corner-sharing $[PbI_6]^{4-}$ octahedra with xAMP$^{2+}$(x=3, 4) separating the perovskite slabs and MA$^+$ filling in the perovskite voids (FIG. 1B). The difference between the two DJ perovskite families is highlighted in FIGS. 2A and 2B, where specific crystallographic characteristics are stressed. The n=1 and n=2 members of each AMP series were selected as representative examples. For n=1, the layers stack almost exactly on top of one another from the top-down viewing direction. (3AMP)PbI$_4$ is somewhat mismatched due to an out-of-plane tilting (FIG. 2A). (4AMP)PbI$_4$ matches perfectly, as it displays exclusively large in-plane tilting. The 3AMP and 4AMP behave alike when it comes to n=2, where the difference only lies in the Pb—I—Pb angle. The trend continues for the higher numbers (n=3 and 4). Viewed along the inorganic layers (FIG. 2B), the hydrogen bonding networks for 3AMP and 4AMP are drastically different. In (3AMP)(MA)Pb$_2$I$_7$, the 3AMP cation forms weak H-bonds with the terminal I$^-$. Bonding with the terminal I$^-$ has a small effect on the in-plane Pb—I—Pb angles, as the terminal I$^-$ does not contribute to the in-plane distortion directly. On the contrary, in (4AMP)(MA)Pb$_2$I$_7$, the H-bonds are formed with the bridging I$^-$ anions deeper inside the layers as seen in FIG. 2B, which amplifies the in-plane distortion.

TABLE 1

| Crystal and structure refinement for A'Ma$_{n-1}$Pb$_n$I$_{3n+1}$ (A' = 3AMP or 4AMP) | | | | |
|---|---|---|---|---|
| Compound | (3AMP)PbI$_4$ | (3AMP) (MA)Pb$_2$I$_7$ | (3AMP) (MA)$_2$Pb$_3$I$_{10}$ | (3AMP) (MA)$_3$Pb$_4$I$_{13}$ |
| Empirical formula | C$_6$N$_2$H$_{16}$PbI$_4$ | (C$_6$N$_2$H$_{16}$)(CH$_3$NH$_3$)Pb$_2$I$_7$ | (C$_6$N$_2$H$_{16}$)(CH$_3$NH$_3$)$_2$Pb$_3$I$_{10}$ | (C$_6$N$_2$H$_{16}$)(CH$_3$NH$_3$)$_3$Pb$_4$I$_{13}$ |
| Crystal system | | Monoclinic | | |
| Space group | P2$_1$/c | Ia | Pa | Ia |
| Unit cell dimensions | a = 8.6732(6) Å, b = 18.4268(9) Å, c = 20.4522(14) Å, β = 99.306(6)° | a = 8.8581(11) Å, b = 8.8607(4) Å, c = 33.4749(5) Å, β = 90° | a = 8.8616(3) Å, b = 8.8624(3) Å, c = 23.0316(7) Å, β = 90° | a = 8.8627(18) Å, b = 8.8689(18) Å, c = 58.842(12) Å, β = 90° |
| Volume (Å$^3$) | 3225.67(35) | 2627.4(3) | 1808.79(10) | 4625.1(16) |
| Z | 8 | 4 | 2 | 4 |
| Density (g/cm$^3$) | 3.4224 | 3.6681 | 3.8024 | 3.8645 |
| Indep. refl. | 5033 [R$_{int}$ = 0.1102] | 4422 [R$_{int}$ = 0.0202] | 8035 [R$_{int}$ = 0.0361] | 5893 [R$_{int}$ = 0.0405] |
| Data/restraints/param. | 5033/32/145 | 4422/17/115 | 8035/28/163 | 5893/19/201 |

TABLE 1-continued

Crystal and structure refinement for A'Ma$_{n-1}$Pb$_n$I$_{3n+1}$ (A' = 3AMP or 4AMP)

| Final R indices [I > 2σ(I)] | R$_{obs}$ = 0.0869, wR$_{obs}$ = 0.1622 | R$_{obs}$ = 0.0323, wR$_{obs}$ = 0.0922 | R$_{obs}$ = 0.0395, wR$_{obs}$ = 0.1063 | R$_{obs}$ = 0.0901, wR$_{obs}$ = 0.2062 |
|---|---|---|---|---|
| R indices [all data] | R$_{all}$ = 0.1471, wR$_{all}$ = 0.1686 | R$_{all}$ = 0.0365, wR$_{all}$ = 0.0941 | R$_{all}$ = 0.0612, wR$_{all}$ = 0.1296 | R$_{all}$ = 0.1136, wR$_{all}$ = 0.2138 |
| Largest diff. peak and hole | 3.97 and −4.88 e · Å$^{-3}$ | 1.44 and −1.23 e · Å$^{-3}$ | 2.014 and −1.382 e · Å$^{-3}$ | 11.07 and −5.34 e · Å$^{-3}$ |

| Compound | (4AMP)PbI$_4$ | (4AMP)(MA)Pb$_2$I$_7$ | (4AMP)(MA)$_2$Pb$_3$I$_{10}$ | (4AMP)(MA)$_3$Pb$_4$I$_{13}$ |
|---|---|---|---|---|
| Empirical formula | C$_6$N$_2$H$_{16}$PbI$_4$ | (C$_6$N$_2$H$_{16}$)(CH$_3$NH$_3$)Pb$_2$I$_7$ | (C$_6$N$_2$H$_{16}$)(CH$_3$NH$_3$)$_2$Pb$_3$I$_{10}$ | (C$_6$N$_2$H$_{16}$)(CH$_3$NH$_3$)$_3$Pb$_4$I$_{13}$ |
| Crystal system | | | Monoclinic | |
| Space group | Pc | Ia | Pc | Ia |
| Unit cell dimensions | a = 10.4999(13) Å, b = 12.5429(9) Å, c = 12.5289(13) Å, β = 89.984(9)° | a = 8.8412(11) Å, b = 8.8436(4) Å, c = 33.6045(5) Å, β = 90° | a = 23.1333(7) Å, b = 8.8365(3) Å, c = 8.8354(3) A, β = 90° | a = 8.8587(18) Å, b = 8.8571(18) Å, c = 58.915(12) Å, β = 90° |
| Volume (Å$^3$) | 1650.05(43) | 2627.5(4) | 1806.11(10) | 4622.6(16) |
| Z | 4 | 4 | 2 | 4 |
| Density (g/cm$^3$) | 3.3441 | 3.6681 | 3.8081 | 3.8666 |
| Indepd. refl. | 4646 [R$_{int}$ = 0.1198] | 4558 [R$_{int}$ = 0.028] | 7954 [R$_{int}$ = 0.0291] | 8002 [R$_{int}$ = 0.1339] |
| Data/restraints/param. | 4646/36/141 | 4558/17/116 | 7954/18/158 | 8002/19/202 |
| Final R indices [I > 2σ(I)] | R$_{obs}$ = 0.0797, wR$_{obs}$ = 0.1093 | R$_{obs}$ = 0.0330, wR$_{obs}$ = 0.0915 | R$_{obs}$ = 0.0351, wR$_{obs}$ = 0.0889 | R$_{obs}$ = 0.0585, wR$_{obs}$ = 0.0839 |
| R indices [all data] | R$_{all}$ = 0.1618, wR$_{all}$ = 0.1275 | R$_{all}$ = 0.0410, wR$_{all}$ = 0.0949 | R$_{all}$ = 0.0559, wR$_{all}$ = 0.0970 | R$_{all}$ = 0.1700, wR$_{all}$ = 0.1000 |
| Largest diff. peak and hole | 4.48 and −4.31 e · Å$^{-3}$ | 1.69 and −1.20 e · Å$^{-3}$ | 1.80 and −1.39 e · Å$^{-3}$ | 4.23 and −2.94 e · Å$^{-3}$ |

Figures 2C, 2D:
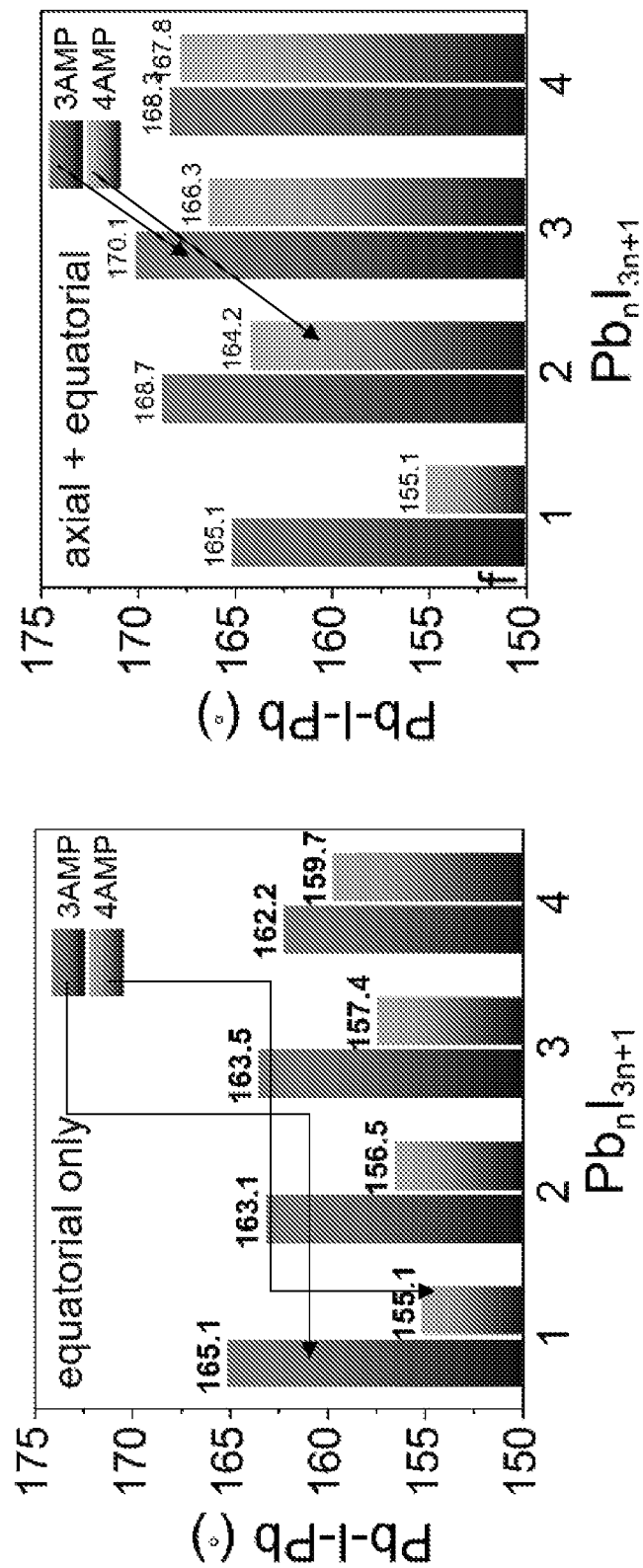
FIG. 2C shows average equatorial Pb—I—Pb angles for 3AMP and 4AMP series from n=1 to 4.
FIG. 2D shows average axial and equatorial angles for 3AMP and 4AMP.
Figure 2F:
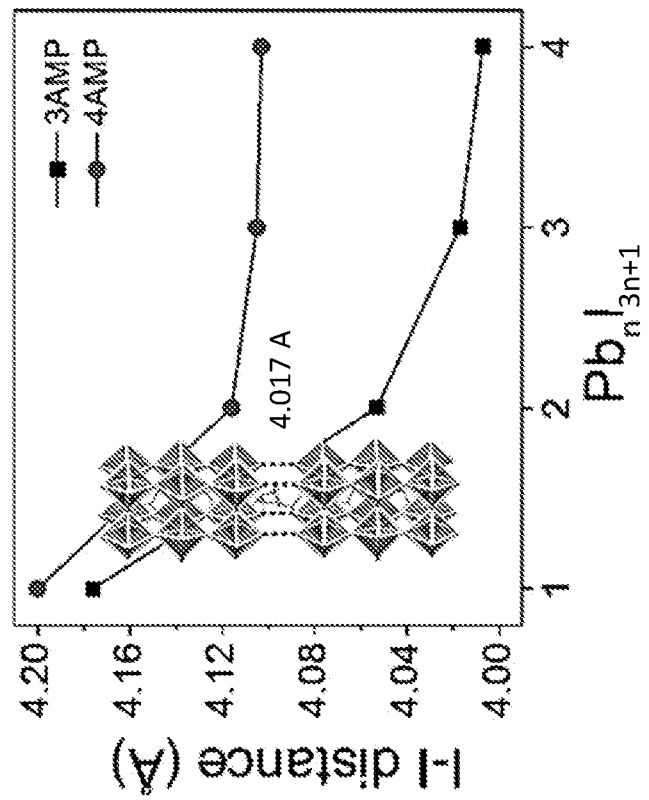
FIG. 2F shows the I . . . I distance trend in 3AMP and 4AMP, where the 3AMP series has closer distance.
Figure 2E:
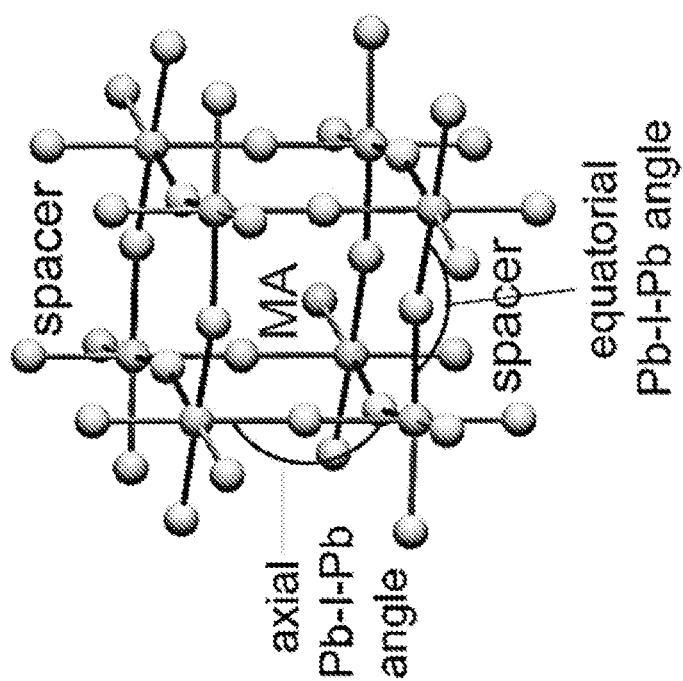
FIG. 2E shows the definition of axial and equatorial Pb—I—Pb angles.

$R = \Sigma||F_o| - |F_c||/\Sigma|F_o|$, $wR = \{\Sigma[w(|F_o|^2 - |F_c|^2)^2]/\Sigma[w(|F_o|^4)]\}^{1/2}$ and $w = 1/\sigma^2(I) + (0.0004I^2)$ The differences in hydrogen bonding have an impact on the Pb—I—Pb angles, which are directly related to the optical and electrical properties of these materials. To illustrate this point, the Pb—I—Pb angles were classified into two categories: the axial (along the longest crystallographic axis) and the equatorial (along the inorganic plane), as shown in FIG. 2E. In these systems, the axial Pb—I—Pb angles are very close to 180°, as they are much less affected by the interaction (e.g. hydrogen bonding) with the spacing cations. On the other hand, the equatorial Pb—I—Pb angles are much more distorted since they are directly exposed to the spacing cations, especially for the case of n=1 and n=2. The evolution of the Pb—I—Pb angles is summarized in FIGS. 2C and 2D, where FIG. 2C shows only the averaged equatorial angles, and FIG. 2D shows the averaged (both axial and equatorial) Pb—I—Pb angles. From FIG. 2C, it is clear that the gap between the average of the equatorial angles of the 3AMP and 4AMP gradually closes as the layer thickness increases from n=1 to 4. For 3AMP, the averaged equatorial Pb—I—Pb decreases from 165.10 to 162.2°, while for 4AMP it increases from 155.1° to 159.7°. This indicates that the effect of the organic cation on the inorganic slabs is gradually diminished as they get thicker (increasing n number). As the axial Pb—I—Pb angles in both series are close to 180°, when they are averaged with the equatorial angles as shown in FIG. 2D, the average is increased for both series up to n=4. Another interesting structural feature is that the I . . . I distance between the inorganic layers is very short. Since the layers lay exactly on top of each other (eclipsed configuration), the I . . . I distance essentially defines the closest interlayer distance. The 3AMP series has generally smaller I . . . I distance than 4AMP (FIG. 2D), while for both series the I . . . I distance gradually decreases slightly as the layer gets thicker. This is possibly a result of increased stacking fault formation in the perovskite layers as n increases, expressed indirectly in the determined average crystallographic structure. The close I . . . I interlayer distance (~4.0 Å) is one of the shortest among reported 2D lead iodide perovskites and plays a crucial role in affecting the electronic band structure of these materials, which will be discussed below.

Figure 3B:
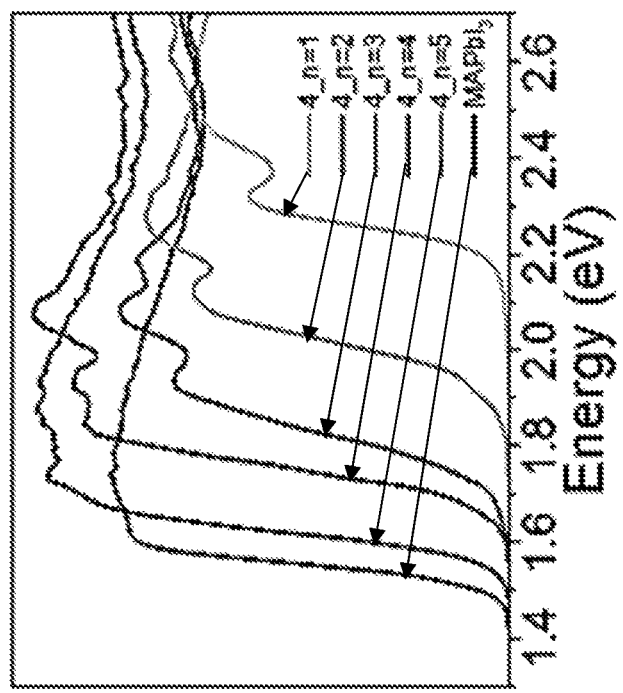
FIGS. 3A-3F show the optical properties of the 3AMP and 4AMP series.
Figure 3A:
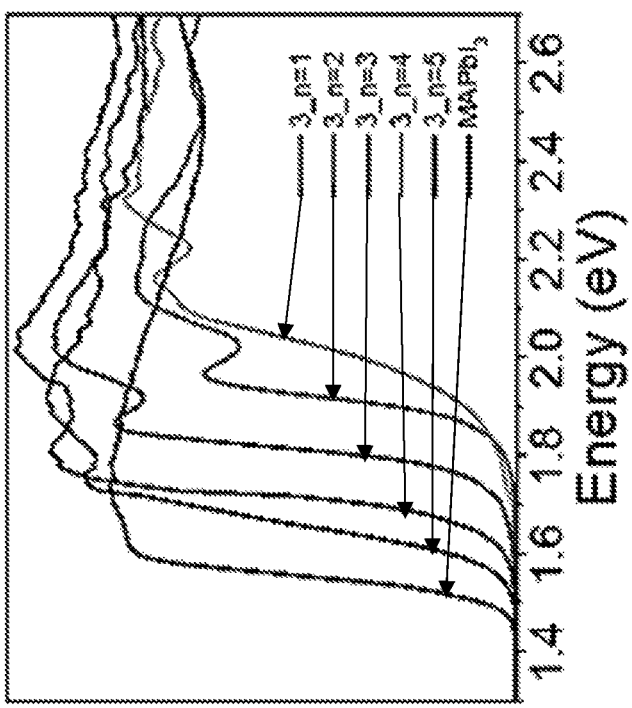
Figures 3C, 3D:
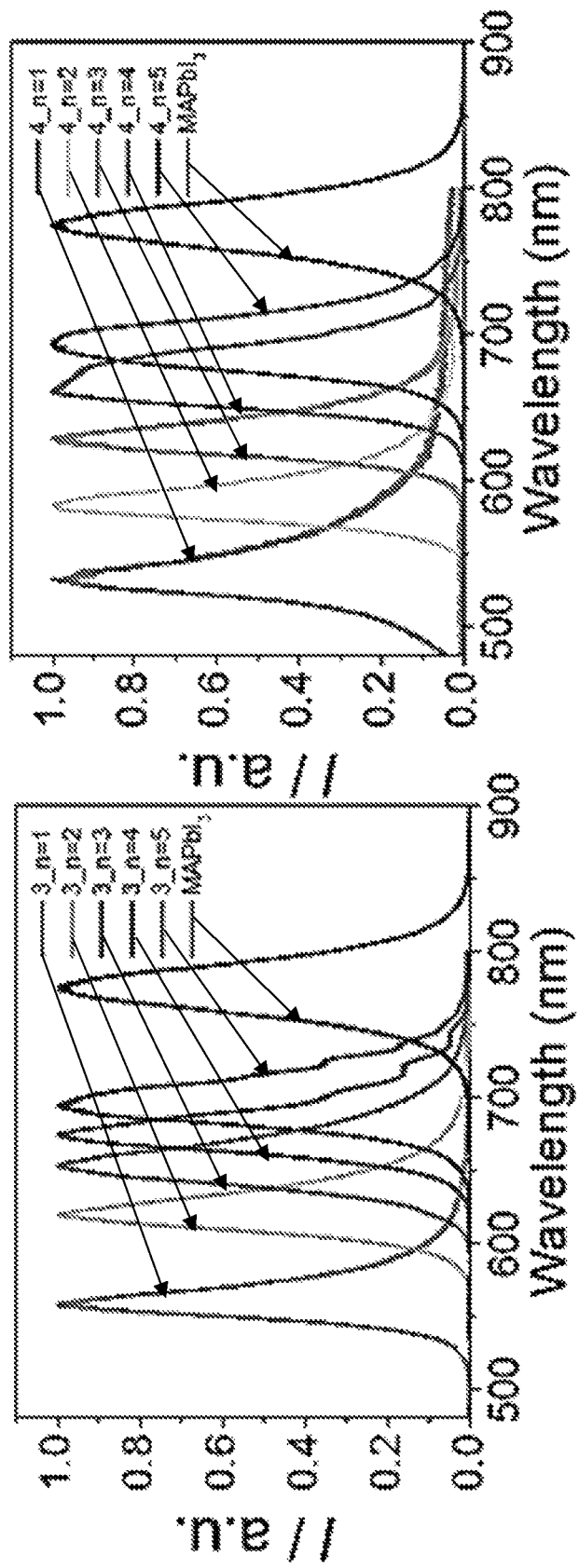
Figures 3E, 3F:
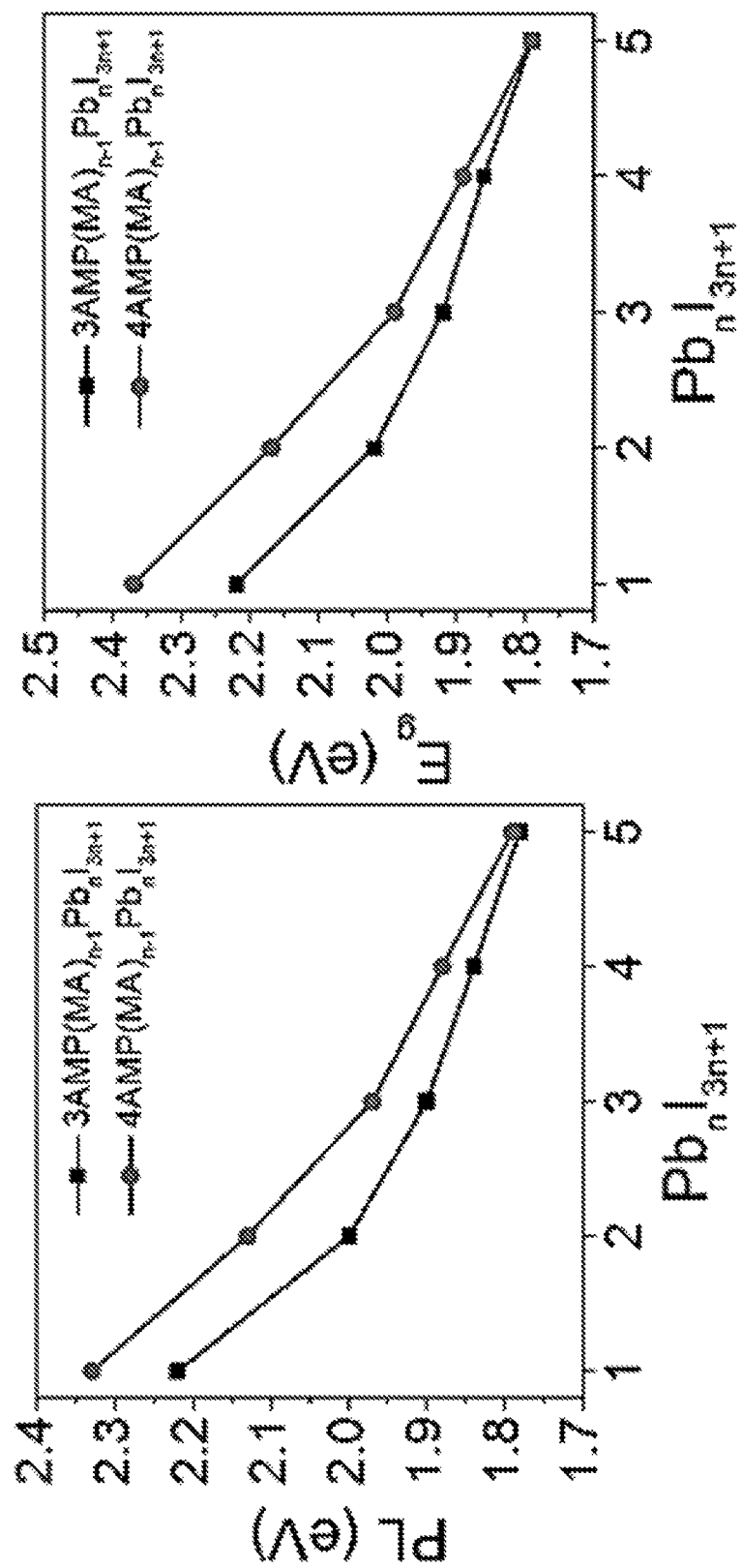
Figure 17A:
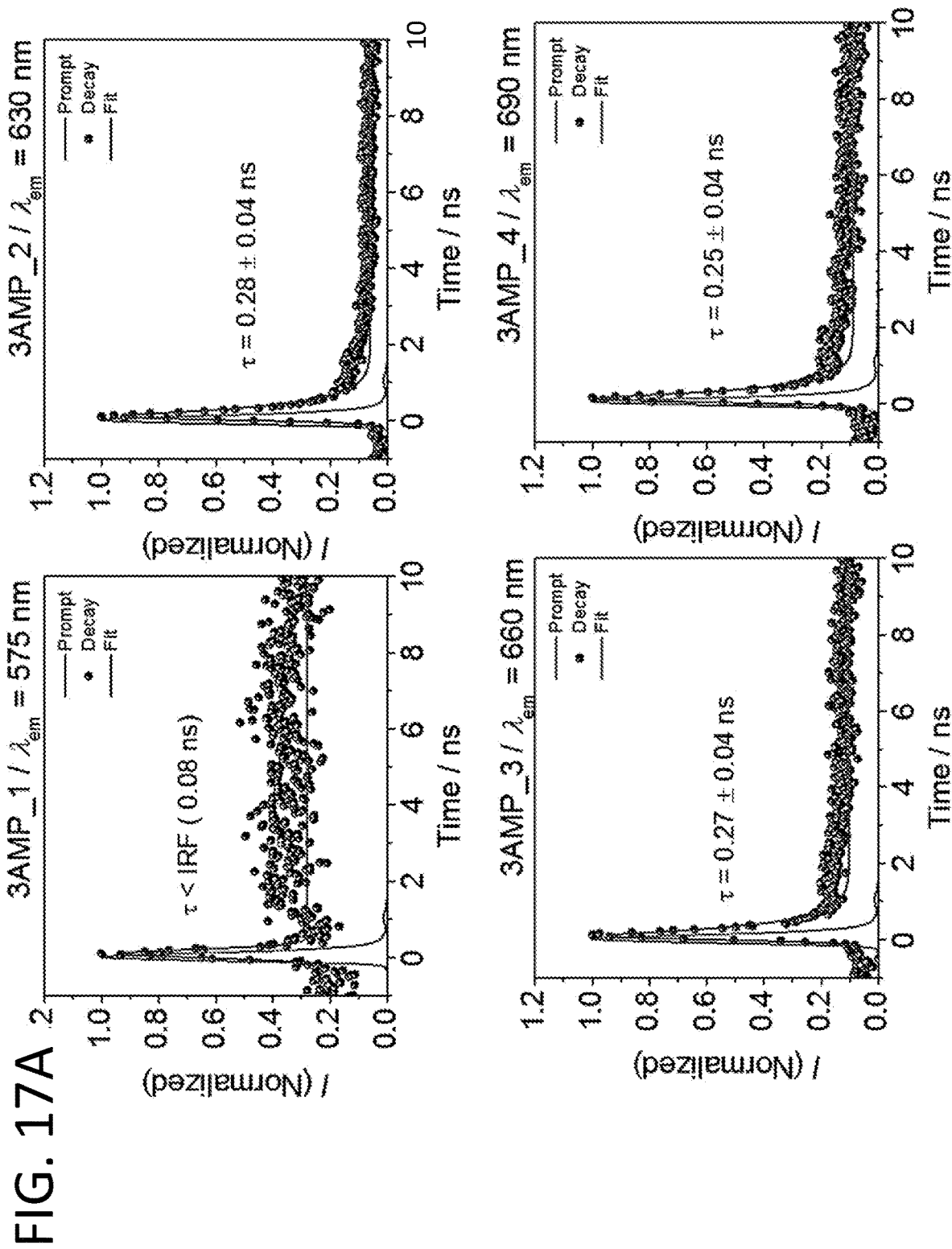
FIGS. 17A-17B show time-resolved photoluminescence (TRPL) decay for the 3AMP and 4AMP series. The 3AMP series show generally longer lifetimes than the 4AMP series.
Figure 17B:
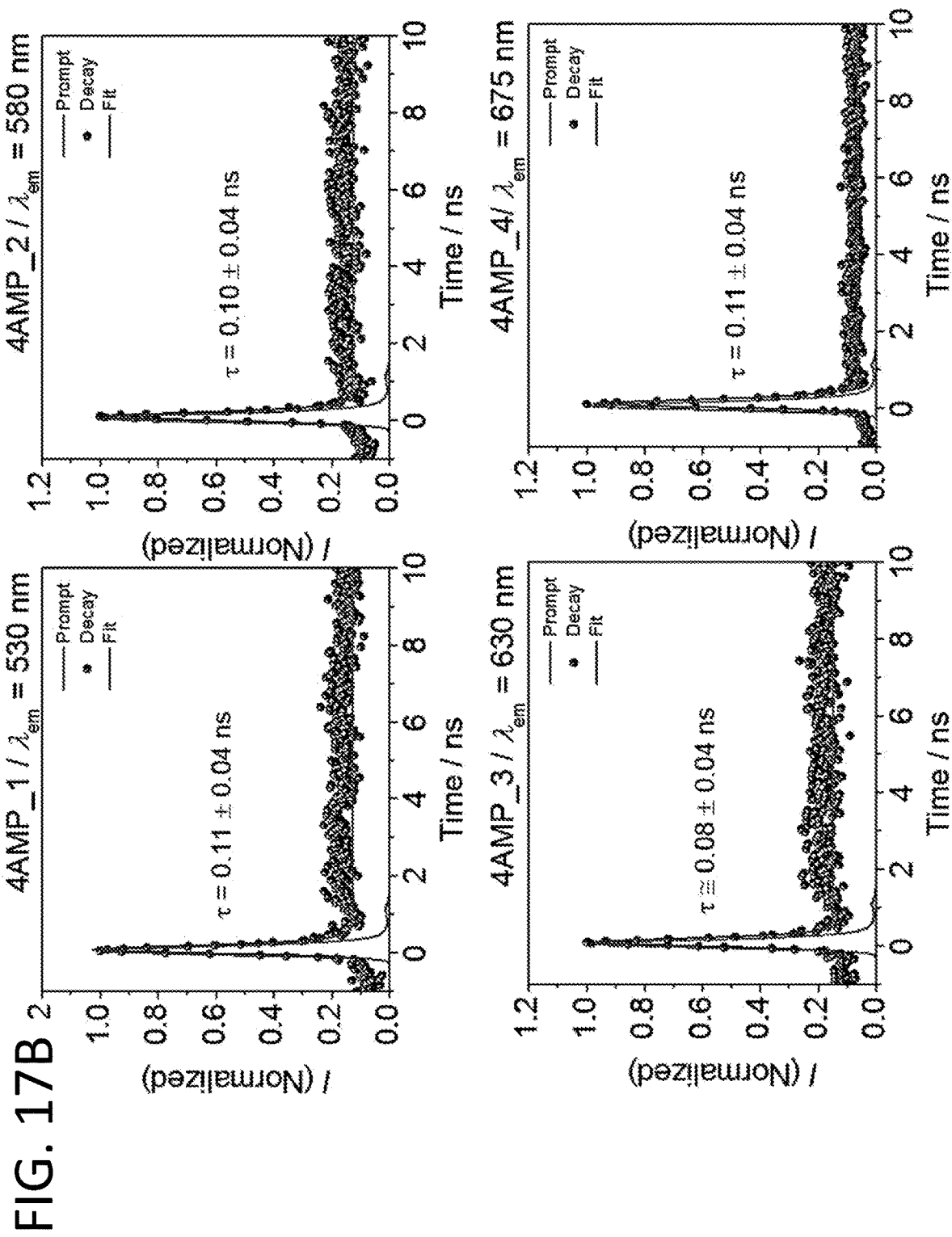

The optical band gaps of both 3AMP and 4AMP series follow a general trend that has the energy gap ($E_g$) decreasing as the layer number (n) increases (Table 2). From n=1 to n=∞ (MAPbI$_3$), the band gap decreases from 2.23 eV to 1.52 eV for the 3AMP series, while for the 4AMP the range is much wider (2.38 eV to 1.52 eV) (FIGS. 3A and 3B). The spectra of both series show clear excitonic features similar to other 2D perovskites, which become less prominent as the n number increases and finally disappear for n=x. The steady-state PL spectra of these materials, shown in FIGS. 3C and 3D, exhibit an analogous trend with the band gaps. The 3AMP series demonstrates constantly lower PL emission energy than the 4AMP, until n=5 when they become equal. Though the evolution of the band gap of both series matches the PL trend, from n=3 and above, the difference between the two series is negligible (FIGS. 3E and 3F). The lifetimes of both AMP series (FIGS. 17A-17B) are comparable to the previously reported 2D layered perovskite PEA (PEA=phenylethylamine) series, for which the lifetimes lie in the 0.1-0.2 ns range. (Peng, W. et al., *Nano Lett.* 2017, 17, 4759-4767.) Overall, the 3AMP series has longer lifetime than the 4AMP (except n=1), which indicates slower carrier combination, which is more ideal for the photovoltaic devices.

TABLE 2

Optical properties and color of the (A')(MA)$_{n-1}$Pb$_n$I$_{3n+1}$ (A' = 3AMP or 4AMP, n = 1-4) DJ perovskites.

| | Compound | $E_g$ (eV) | PL (eV) | Color | Compound | $E_g$ (eV) | PL (eV) | Color |
|---|---|---|---|---|---|---|---|---|
| n = 1 | (3AMP)PbI$_4$ | 2.23 | 2.22 | red | (4AMP)PbI$_4$ | 2.38 | 2.33 | orange |
| n = 2 | (3AMP)(MA)Pb$_2$I$_7$ | 2.02 | 2.00 | dark red | (4AMP)(MA)Pb$_2$I$_7$ | 2.17 | 2.13 | red |
| n = 3 | (3AMP)(MA)$_2$Pb$_3$I$_{10}$ | 1.92 | 1.90 | black | (4AMP)(MA)$_2$Pb$_3$I$_{10}$ | 1.99 | 1.97 | black |
| n = 4 | (3AMP)(MA)$_3$Pb$_4$I$_{13}$ | 1.87 | 1.84 | black | (4AMP)(MA)$_3$Pb$_4$I$_{13}$ | 1.89 | 1.88 | black |

Figures 4A, 4B:
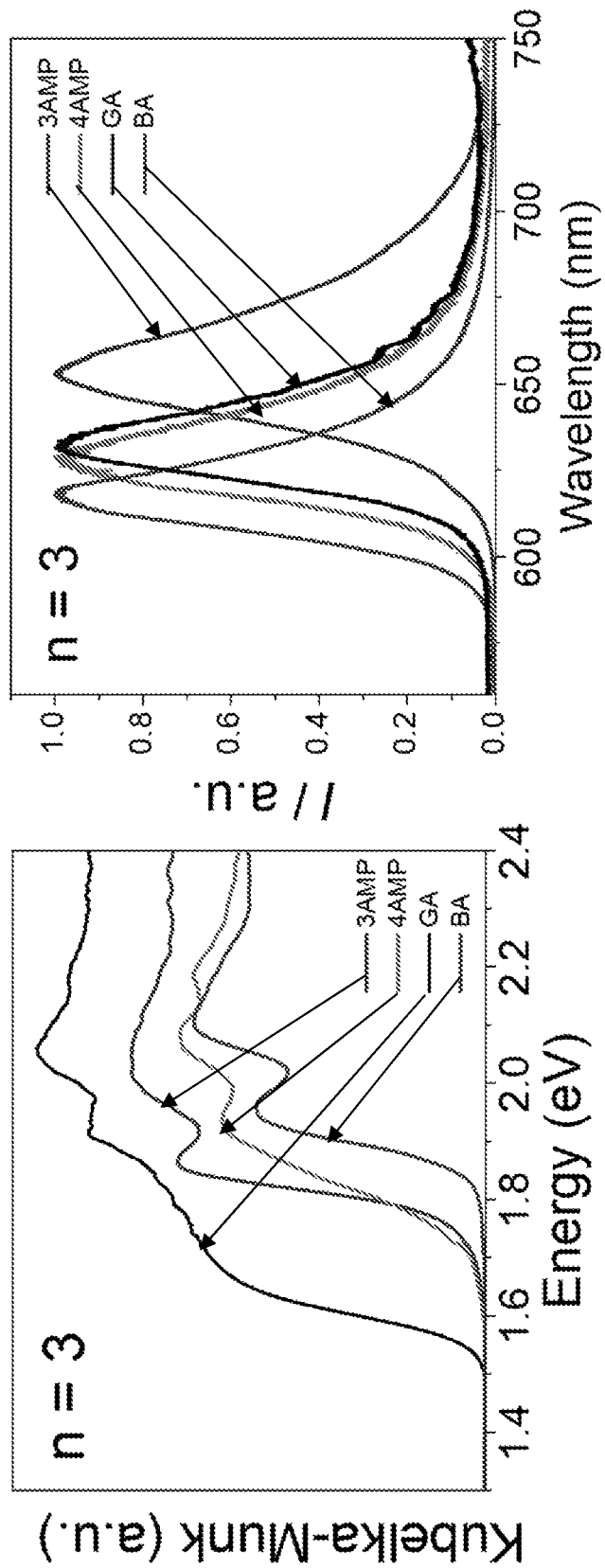
FIGS. 4A-4B show a comparison of the (FIG. 4A) optical absorption spectra and (FIG. 4B) PL spectra between (3AMP)(MA)$_2$Pb$_3$I$_{10}$, (4AMP)(MA)$_2$Pb$_3$I$_{10}$, (GA)(MA)$_3$Pb$_3$I$_{10}$, and (BA)$_2$(MA)$_2$Pb$_3$I$_{10}$.

The optical properties of the DJ iodide perovskites are quite different from those observed in RP perovskites. (Stoumpos, C. C. et al., Chem. Mater. 2016, 28, 2852-2867.) Relative to the corresponding RP perovskites (FIGS. 4A and 4B), the emission energy observed in PL is characteristically red shifted by ~0.1 eV in the case of 3AMP (1.90 eV) and 0.03 eV in the case of 4AMP (1.97 eV) with respect to the BA analogue (2.00 eV), taking n=3 as the reference example. The absorption edges of the compounds containing AMPs (1.70 eV) are also 0.1 eV lower than the BA analogue. The recently reported structural type ACI perovskite GAMA$_3$Pb$_3$I$_{10}$ falls in between the RP and DJ perovskites, with a $E_g$ of 1.73 eV and PL emission peak at 1.66 eV. (Soe, C. M. M. et al., J Am. Chem. Soc. 2017, 139, 16297-16309.)

The optical properties of these materials correlate very well with their structural characteristics. As discussed above, the Pb—I—Pb angles for 3AMP are systematically larger than the 4AMP.

The larger the Pb—I—Pb bond angles (closer to 180°), the more the Pb s and I p orbitals overlap. The strong anti-bonding interaction pushes up the valence band maximum (VBM), resulting in a reduced band gap. Thus, the systematically narrower band gap observed for 3AMP vs. 4AMP can be attributed to the more linear Pb—I—Pb angles (i.e. smaller octahedral tilting) for the former.

Figures 5A, 5B:
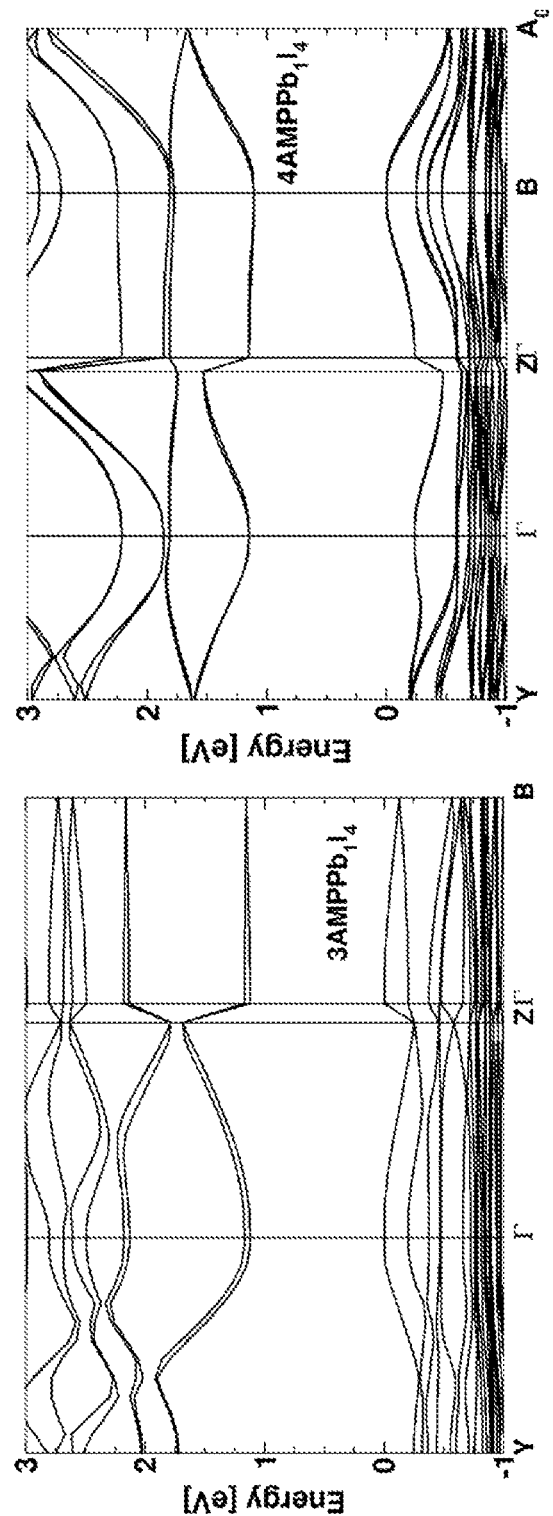
FIGS. 5A-5H show density functional theory (DFT) calculations of band structures for the 3AMP and 4AMP series with spin-orbit coupling (SOC). The calculated gaps are 1.13 eV for (3AMP)PbI$_4$ (at I), 1.14 eV for (4AMP)PbI$_4$ (at B), 0.48 eV for (3AMP)(MA)Pb$_2$I$_7$ (at Yo), 0.70 eV for (4AMP)(MA)Pb$_2$I$_7$ (at Yo), 0.47 eV for (3AMP)(MA)$_2$Pb$_3$I$_{10}$ (at Z), 0.74 eV for (4AMP)(MA)$_2$Pb$_3$I$_{10}$ (at Z), 0.07 eV for (3AMP)(MA)$_3$Pb$_4$I$_{13}$ (at Yo), 0.54 eV for (4AMP)(MA)$_3$Pb$_4$I$_{13}$ (at Yo).
Figures 5C, 5D:
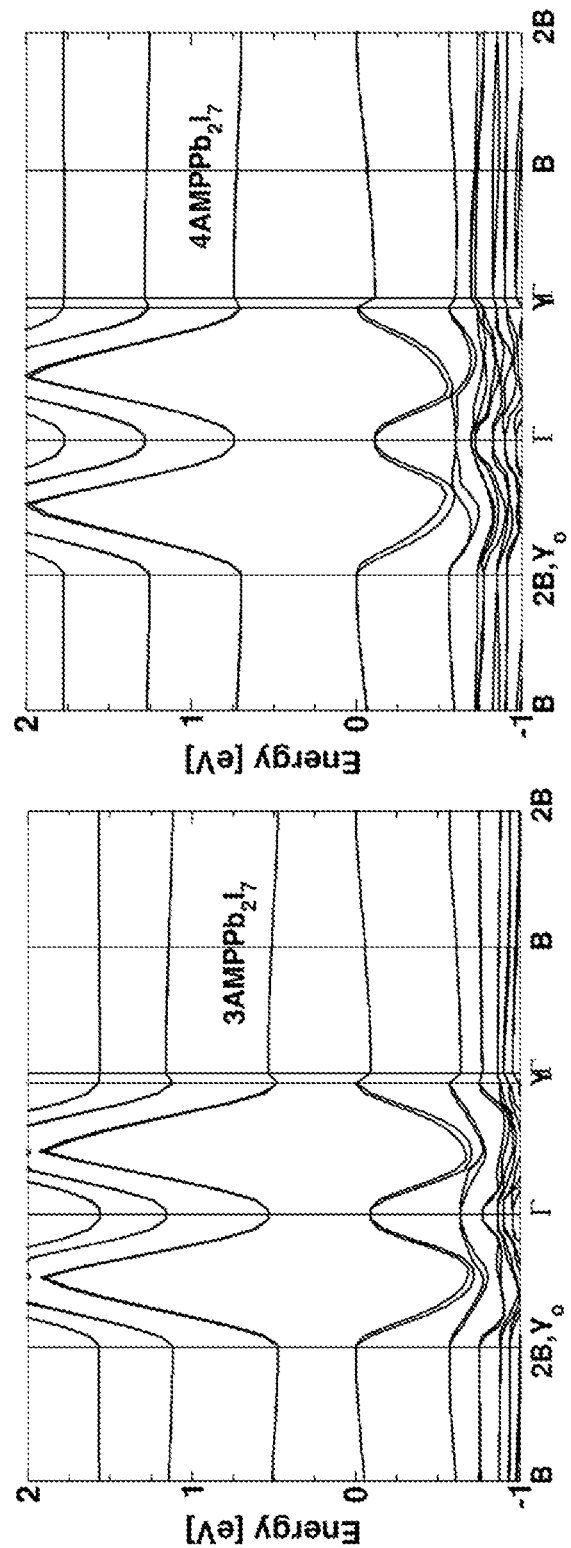
Figures 5E, 5F:
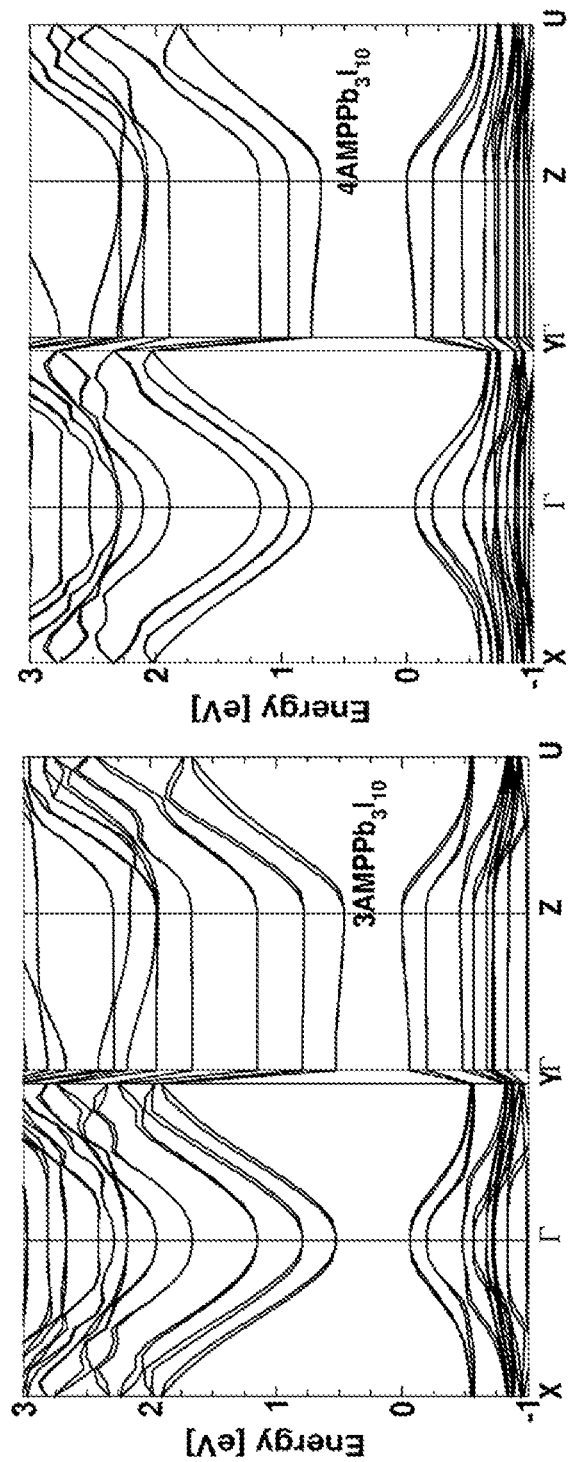
Figures 5G, 5H:
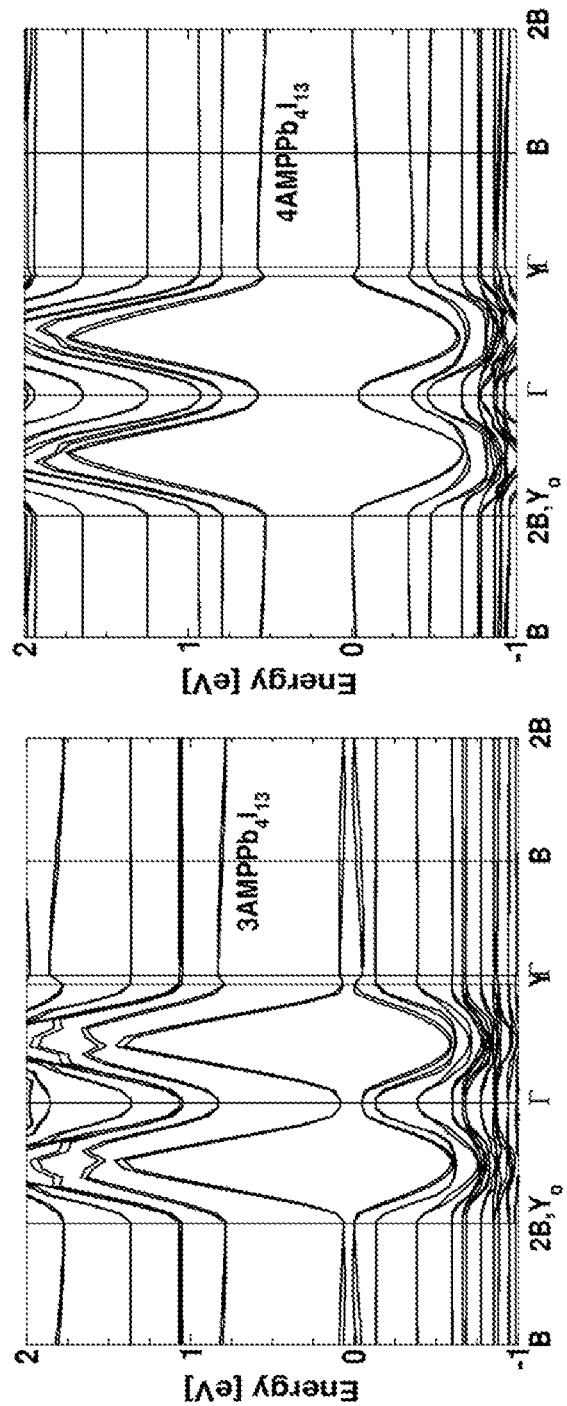

The results of DFT electronic structure calculations are shown in FIGS. 5A-5G. The calculated band gap for (3AMP)PbI$_4$ is determined at the Γ point (1.13 eV) (FIG. 5A), whereas the band gap of (4AMP)PbI$_4$ is determined at the BZ edge (1.14 eV) (FIG. 5B). The calculated band gaps for the higher numbers between the 3AMP and 4AMP series have larger differences, where $E_g$ is 0.48 eV for n=2, 3AMP, and 0.70 eV for n=2, 4AMP (FIGS. 5C-5D). For n=3, the band gaps at Z point for 3AMP and 4AMP are 0.47 eV and 0.74 eV, respectively (FIGS. 5E-5F). The calculated gap for 3AMP (n=4) is very small (0.07 eV), much lower than 0.54 eV for n=4, 4AMP as seen in FIGS. 5G-5H. The DFT computed band gaps do not include many-body interactions needed to properly assess optical response, which is why calculated values are systematically underestimated without GW corrections. The band gaps of 3AMP series DJ are systematically smaller than those computed for 4AMP series as shown in FIG. 5H, in agreement with experimental findings. The stacking of perovskite sheets in the DJ structure type, which aligns the perovskite layers, allows for a better interlayer electronic coupling through van der Waals I . . . I interactions. These I . . . I contacts participate in anti-bonding interactions that further destabilize the VBM, contributing to the reduction of the band gap as compared to RP phases with respect to the same n-value, as discussed above.

Based on the attractive properties of the new 2D DJ perovskites, a preliminary study investigated the higher layer numbers (n=3 and 4) as light absorbers for solar cells. A planar solar cell structure was adopted for device fabrication (FIG. 6A), including a FTO substrate, a PEDOT:PSS hole transport layer (HTL), a 2D perovskite light absorber, a C$_{60}$/BCP ETL, and a Ag electrode. The devices were fabricated using a modified solvent engineering method (see Methods). The J-V curves of the solar cells using the 2D DJ perovskites are in FIG. 6B, (measured using a reverse voltage scan). The thickness of the perovskite films was ~250 nm. Among the n=3 and 4 for 3AMP and 4AMP, (3AMP)(MA)$_3$Pb$_4$I$_{13}$ achieved the highest power conversion efficiency (PCE) of 7.32% with a short-circuit current density ($J_{SC}$) of 10.17 mA·cm$^{-2}$, an open-circuit voltage ($V_{oc}$) of 1.06 V, and a fill factor (FF) of 67.60%. This value is significantly higher that the corresponding n=3 and n=4 RP perovskites prepared using a regular mesoporous TiO$_2$ device structure.

Figures 6C, 6D:
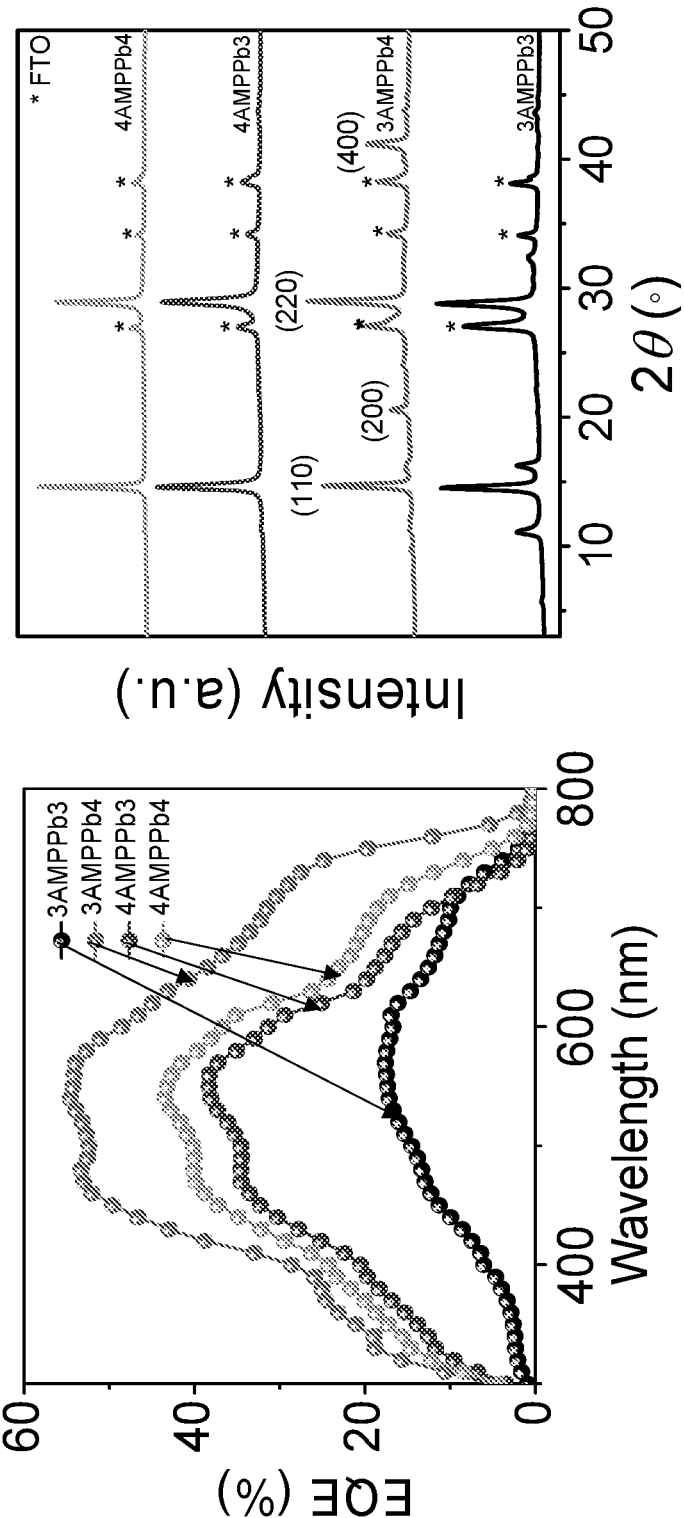

The remarkable performance of (3AMP)(MA)$_3$Pb$_4$I$_{13}$ can be mainly attributed to the reduced band gap and the improved mobility originating from the increased band dispersion (see above). While the device based on (3AMP)(MA)$_2$Pb$_3$I$_{10}$ has the lowest PCE of 2.02% with a $J_{SC}$ of 3.05 mA·cm$^{-2}$, a $V_{oc}$ of 0.99 V, and a FF of 66.54%, attributed to the largest band gap and the intense presence of a secondary phase, identified as the n=2 member (2θ=~11° and ~16°), (4AMP)(MA)$_2$Pb$_3$I$_{10}$ and (4AMP)(MA)$_3$ have a PCE below 5%, mainly due to the much lower $J_{SC}$ relative to the 3AMP. The average photovoltaic parameters of the devices using the various absorbers are summarized in Table 3. The $J_{SC}$ integrated from the EQE curves (FIG. 6C) of the devices based on (3AMP)(MA)$_2$Pb$_3$I$_{10}$, (3AMP)(MA)$_3$Pb$_4$I$_{13}$, (4AMP)(MA)$_2$Pb$_3$I$_{10}$ and (4AMP)(MA)$_3$Pb$_4$I$_{13}$ are 2.92, 10.16, 5.83, and 7.08 mA·cm$^{-2}$, respectively, which are in good agreement with the trend of the $J_{SC}$ obtained from the J-V curves. In FIG. 6D, PXRD of the (3AMP)(MA)$_3$Pb$_4$I$_{13}$, (4AMP)(MA)$_2$Pb$_3$I$_{10}$ and (4AMP)(MA)$_3$Pb$_4$I$_{13}$ films shows preferred orientation in the "perpendicular" direction judging from the strongest hkl (110) and (220) at ~14° and ~28° which facilitates the carriers to travel through the layers.

TABLE 3

Summary of the photovoltaic parameters of solar cells using various perovskite absorbers. Each data point is averaged from 6 devices.

| | $V_{oc}$ [V] | $J_{sc}$ [mA cm$^{-2}$] | FF [%] | PCE [%] |
|---|---|---|---|---|
| 3AMPPb$_3$I$_{10}$ | 0.95 ± 0.09 | 2.96 ± 0.39 | 55.18 ± 14.28 | 1.60 ± 0.62 |
| 3AMPPb$_4$I$_{13}$ | 1.03 ± 0.06 | 10.16 ± 0.10 | 64.51 ± 4.01 | 6.74 ± 0.74 |
| 4AMPPb$_3$I$_{10}$ | 0.96 ± 0.03 | 6.31 ± 0.10 | 60.30 ± 1.46 | 3.67 ± 0.22 |
| 4AMPPb$_4$I$_{13}$ | 0.94 ± 0.03 | 7.05 ± 0.44 | 64.05 ± 1.82 | 4.24 ± 0.50 |

Figures 18A, 18B:
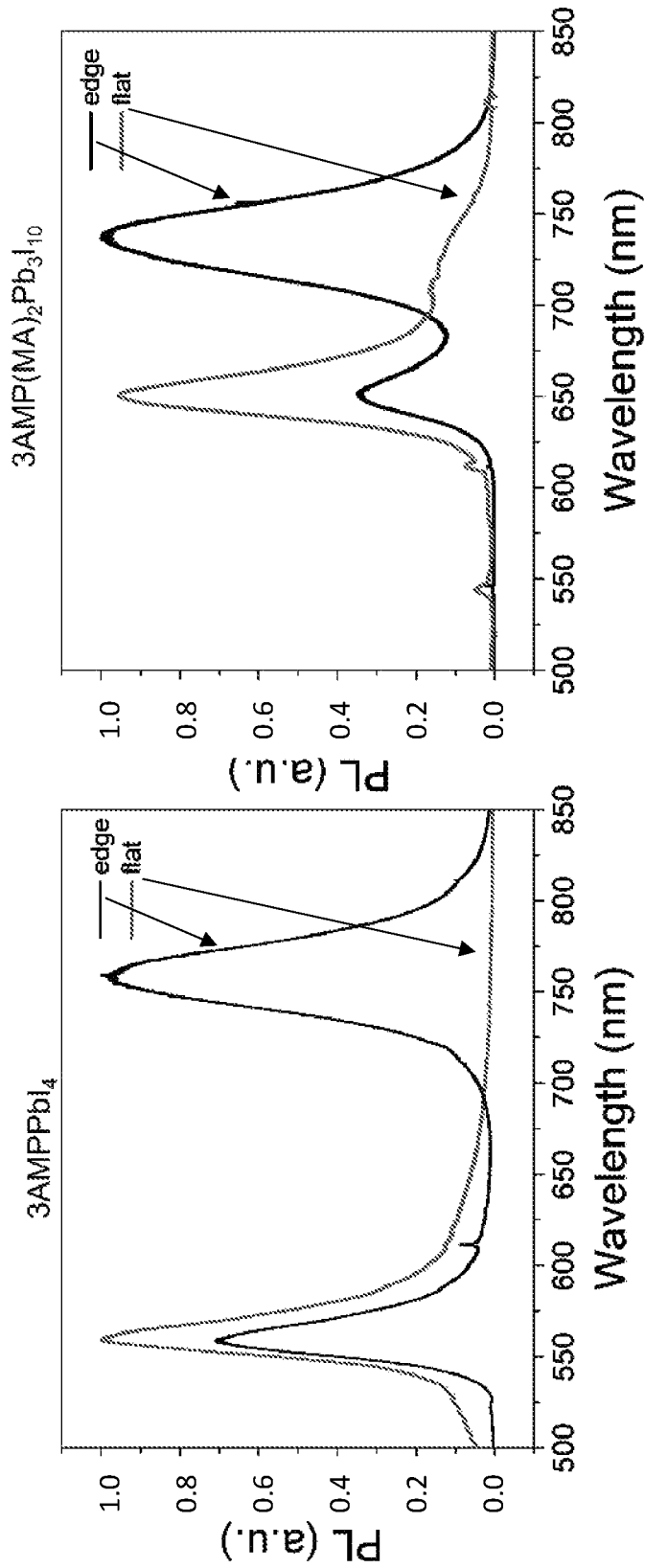
FIGS. 18A-18B show "edge effect" of (3AMP)PbI$_4$ (FIG. 18A) and (3AMP)(MA)$_2$Pb$_3$I$_{10}$ (FIG. 18B). PL was measured perpendicular to the layers (flat) and parallel to the layers (edge) on single crystals.

PL emission properties of the films (FIG. 6E) are quite different (red shifted) from the bulk materials, which can be attributed to the so-called "edge effect". The edge effect is observed in single crystals of both 3AMPPbI$_4$ and (3AMP)(MA)$_2$Pb$_3$I$_{10}$ as seen in FIGS. 18A-18B. The second PL emission at lower energy was observed when the sample was excited through "the edge", which is parallel to the layers. The (3AMP)(MA)$_3$Pb$_4$I$_{13}$ provided a PCE below 5%, mainly due to the much lower $J_{SC}$ relative to the 3AMP. The average photovoltaic parameters of the devices using the various absorbers are summarized to show larger separation of the higher (2.21 eV from bulk) and lower energy emission (1.64 eV edge) of the n=1 than for n=3 (1.91 eV and 1.68 eV) for 3AMP. The lower energy emission (1.68 eV) is very close to the emission of the thin film (1.66 eV). This result is similar to the previously reported $(BA)_2(MA)_2Pb_3I_{10}$ example, where the higher energy emission was 2.00 eV and lower energy emission was 1.70 eV. (Blancon, J.-C. et al., Science 2017, 355, 1288-1292.) Attempts for measuring edge states of the other layered number crystals such as n=2 and 4 were not successful, owing to the thin crystal morphology which has caused handing difficulty.

Figures 6E, 6F:
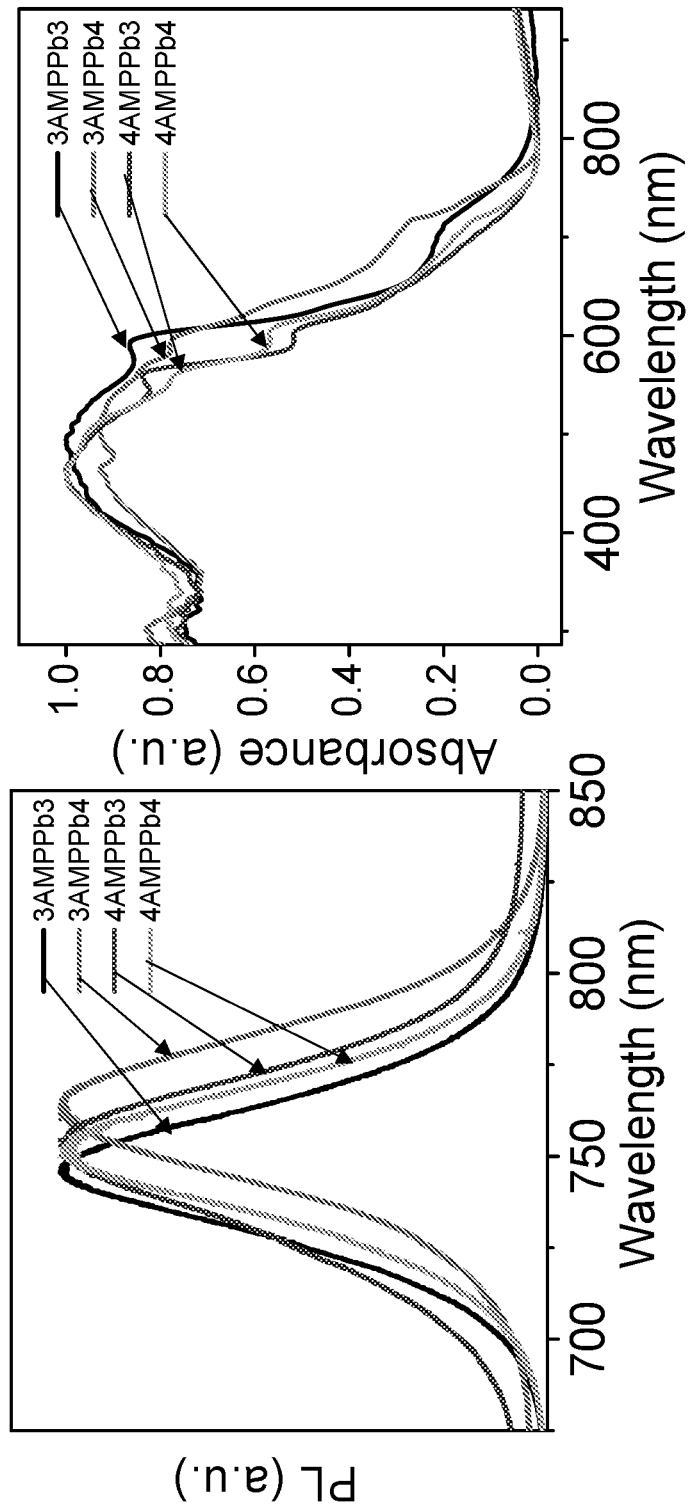

The absorption edges of the films have the same trend as in the EQE spectra, though multiple slopes appear, indicating the formation of some lower layer numbers (FIG. 6F).

Conclusions

It has been shown that a new crystal motif based on the DJ class of perovskites forms 2D hybrid lead iodide perovskites. The special spacer cations using 3AMP and 4AMP have strong influence on the overall properties. Detailed crystallographic investigations on all eight compounds (n=1 to 4, for 3AMP and 4AMP), have provided the structural insights for understanding the structure-property relationships. In particular, by understanding the angular distortion (Pb—I—Pb angle) within the system, the subtle difference in the cations are shown to cause large differences in the optical properties by affecting the Pb—I—Pb angles, where the 3AMP series has systematically larger angles and smaller band gaps than the 4AMP series. Compared to the most common 2D RP perovskites, namely the BA series, the 3AMP and 4AMP series possess lower band gaps because of a less distorted inorganic framework and closer I . . . I interlayer distances. This analysis demonstrates that the optoelectronic properties of the 3AMP are superior to the 4AMP series, which was demonstrated in the actual device fabrication, where the preliminary result shows the champion device has a PCE over 7%. The strong correlation between the materials and their applications' performance validates the importance of understanding structure-property relationships and discovering new materials in the halide perovskite systems.

Example 2

In this Example, the properties were tuned and the performance was significantly improved for 2D DJ 3AMP-based perovskite solar cells by mixing A-site cations in the inorganic slabs as follows $[(MA_{i-x}FA_x)_{n-1}Pb_nI_{3n+1}]^{2-}$. Using single crystal X-ray crystallography, it was found that the structure of $(3AMP)(MA_{0.75}FA_{0.25})_3Pb_4I_{13}$ features on average higher Pb—I—Pb angles than that of $(3AMP)(MA)_3Pb_4I_{13}$ which broadens the electronic bands and narrows the bandgap (as has been explained in Example 1, above). The band gap can be tuned from −1.57 eV ($(3AMP)(MA)_3Pb_4I_{13}$) to −1.48 eV ($(3AMP)(MA_{0.75}FA_{0.25})_3Pb_4I_{13}$). The narrower band gap of $(3AMP)(MA_{0.75}FA_{0.25})_3Pb_4I_{13}$ is more suitable as solar cell absorber. As a result, it is demonstrated that $(3AMP)(MA_{0.75}FA_{0.25})_3Pb_4I_{13}$ solar cells achieve a significantly improved PCE of 12.04% with a higher $J_{SC}$ of 13.69 mA cm$^{-2}$ and a record FF of 81.04%. It was also found that the so-called solvent engineering method, with a mixed DMF/DMSO solvent and HI additive, is well-suited for film fabrication, resulting in better film morphology and crystalline quality, and preferred orientation. Importantly, the 2D DJ $(3AMP)(MA_{0.75}FA_{0.25})$ $_3Pb_4I_{13}$-based films and devices show much better environment stability with respect to the 2D RP BA-based ones as well as the 3D $MA_{1-x}FA_xPbI_3$ analogues.

Methods

Synthesis of $(3AMP)(MA_{i-x}FA_x)_3Pb_4I_{13}$. For x=0.25, 892 mg (4 mmol) of 99.9% PbO powder was dissolved in 6 mL of hydroiodic acid and 1 mL of a hypophosphorous acid ($H_3PO_2$) solution by heating under stirring for 5-10 min at 130° C. until the solution turned clear bright yellow. To this, 358 mg (2.25 mmol) of MAI and 78 mg (0.75 mmol) formamidine acetate were added directly under heating. To a separate vial, 0.5 mL of hydroiodic acid was added to 34.2 mg (0.3 mmol) of 3AMP under stirring. The protonated 3AMP solution was added into the previous solution under heating and stirring at 240° C. until the solution turned clear. Black plate-like crystals precipitated during slow cooling to room temperature. Yield: 338 mg (12.5% based on total Pb content); x=0, 0.15, 0.2, and 0.3 following the same synthesis route except the ratio between MA and FA changed accordingly.

Device Fabrication. PEDOT:PSS aqueous solution was spin-coated on FTO glass substrates with a spin rate of 4000 rpm for 30 s, and then the substrates were annealed at 150° C. for 30 min in air. 2D $(3AMP)(MA_{1-x}FA_x)_3Pb_4I_{13}$ (x=0-0.3) or $(BA)_2(MA)_3Pb_4I_{13}$ perovskite crystal powders were dissolved in a DMF solvent or a mixed solvent of DMF and DMSO (4:1) with a molar concentration of 0.85 M. For the samples with the HI additive, 0.8 vol % HI was added into the perovskite precursors after all the materials dissolved. 3D $MA_{0.75}FA_{0.25}PbI_3$ perovskite precursor was prepared by dissolving 168 mg of MAI, 60.2 mg of FAI, and 645.4 mg of $PbI_2$ in 0.8 mL of DMF and 0.2 mL of DMSO. The filtered perovskite precursors were spin-coated on the substrates by spin rates of 500 rpm for 3 s and then 4000 rpm for 60 s in a $N_2$-filled glovebox. Only for the samples that used a mixed solvent, 0.7 mL of diethyl ether was dropped on the rotating substrates during the second spin-coating process. All films were annealed at 100° C. for 10 min on a hotplate in the glovebox. Finally, 20 nm of Co, 5 nm of BCP, and 100 nm of Ag were sequentially thermally evaporated on top of the perovskite films to complete the devices. The active area of the solar cells was 0.09 or 0.39 cm$^2$.

Characterization. Full sphere data were collected after screening for a few frames using either a STOE IPDS 2 or an IPDS 2T diffractometer with graphite-monochromatized Mo Kα radiation (λ=0.71073 Å) (50 kV/40 mA) under $N_2$ at 250.02 K. The collected data were integrated and applied with numerical absorption corrections using the STOE X-AREA programs. Crystal structures were solved by charge flipping and refined by full-matrix least-squares on $F^2$ with the Jana2006 package. XRD patterns of the films and crystal powders were measured by a Rigaku Miniflex600 PXRD (Cu Kα graphite, λ=1.5406 Å) operating at 40 kV/15 mA with a Kβ foil filter. GIWAXS measurements were performed at Beamline 8-ID-E of the Advanced Photon Source at Argonne National Laboratory. The morphology of the films and devices was characterized by a high-resolution field emission SEM (Hitachi SU8030). PL spectra of the films were measured by a Horiba LabRAM HR Evolution confocal Raman microscope spectrometer (600 g mm-1 diffraction grating) equipped with a diode continuouswave laser (473 nm, 25 mW) and a Synapse charge-coupled device camera. UV-vis absorption measurements of the films and crystals were taken on a Shimadzu UV-3600 UV-vis NIR spectrometer operating in the 200-2000 nm region at room temperature. EQE curves were recorded by an Oriel model QE-PV-SI instrument equipped with a National Institute of Standards and Technology certified Si diode. J-V curves were recorded by a Keithley model 2400 instrument under AM1.5G (100 mW cm$^{-2}$) simulated irradiation with a standard solar simulator (Abet Technologies). The same solar simulator was also used for the long-term stability test of the films and devices. The light intensity of the solar simulator was calibrated by a National Renewable Energy Laboratory-certified monocrystalline silicon solar cell for each time measurement.

Results and Discussion

In Example 1, it was demonstrated that DJ perovskites based on the 3AMP spacer dication have different properties compared with the 4AMP series due to the different position of the functional group. This leads to different Pb—I—Pb angles, which are closely related to the band gaps. The larger the Pb—I—Pb angles and the closer they get to 180°, the broader the conduction and valence bands and the narrower the band gaps. Therefore, the 3AMP DJ series possess narrower band gaps, and the respective solar cells yield better performance. Here, by introducing the larger FA cation, the Pb—I—Pb angles in the perovskite slabs are further expanded, which leads to even narrower band gaps of the materials.

Figure 7C:
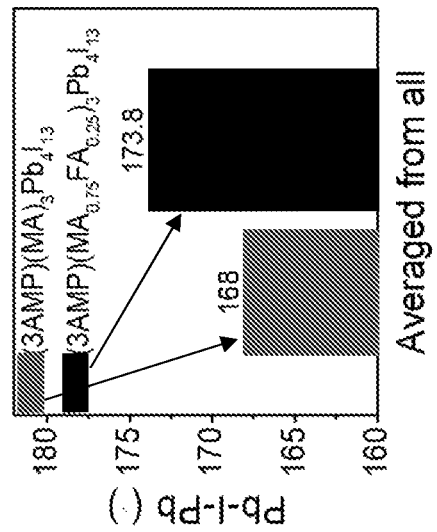
FIGS. 7B-7C show individual and averaged Pb—I—Pb angles.
Figure 7E:
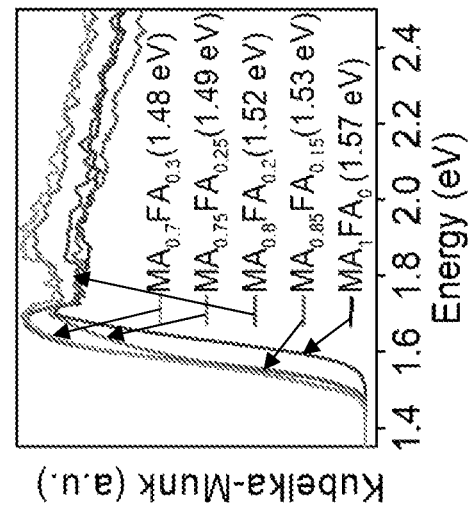
FIG. 7E shows absorption spectra of (3AMP)(MA$_{1-x}$FA$_x$)$_3$Pb$_4$I$_{13}$ (x=0-0.3) crystals.
Figure 7B:
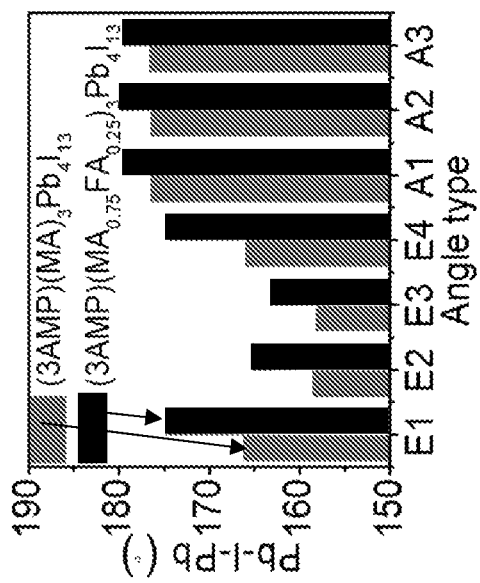
Figure 7D:
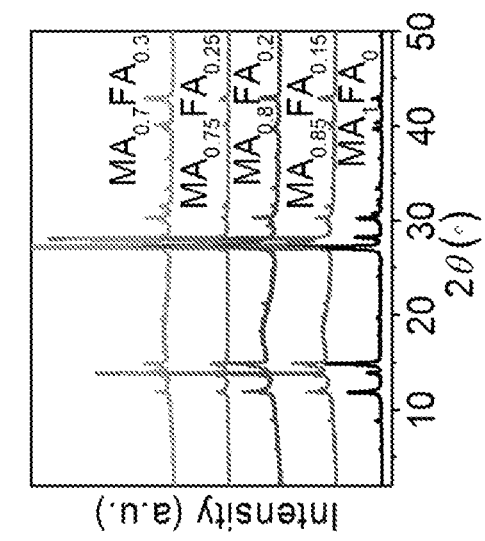
FIG. 7D shows PXRD patterns of the bulk materials.
Figure 7A:
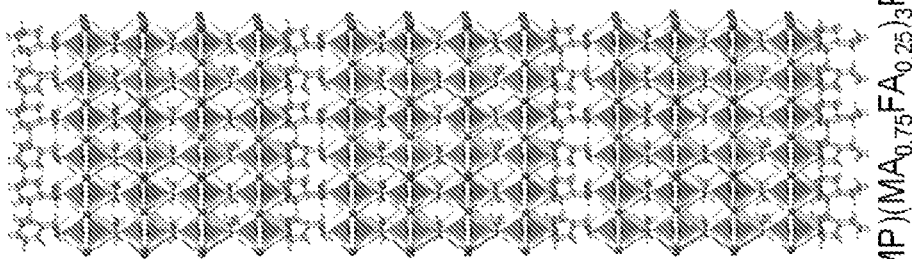
FIG. 7A shows the crystal structure of (3AMP)(MA$_{0.75}$FA$_{0.25}$)$_3$Pb$_4$I$_{13}$.
Figure 19:
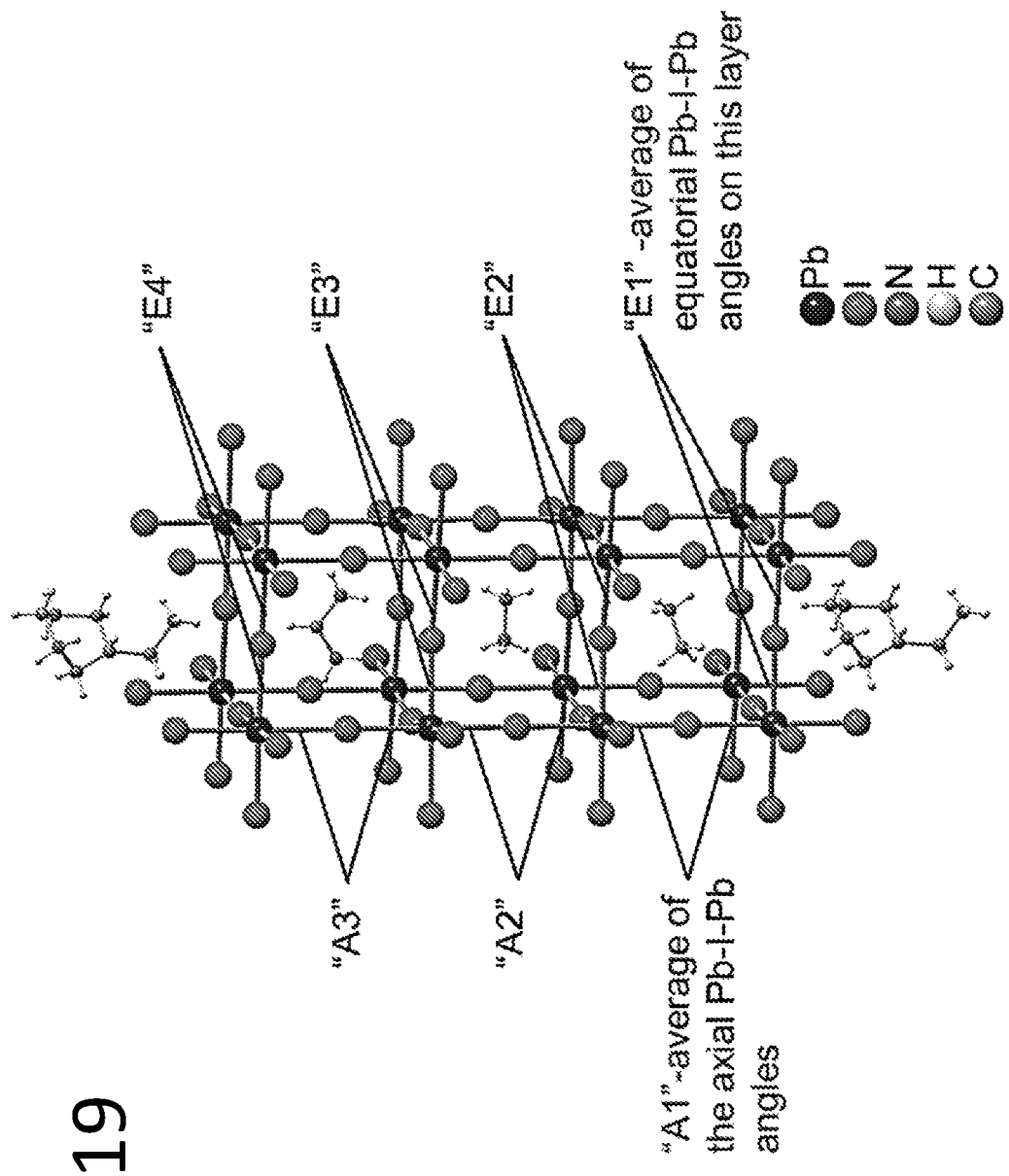
FIG. 19 shows the definition of axial and equatorial Pb—I—Pb angles.
Figure 20A:
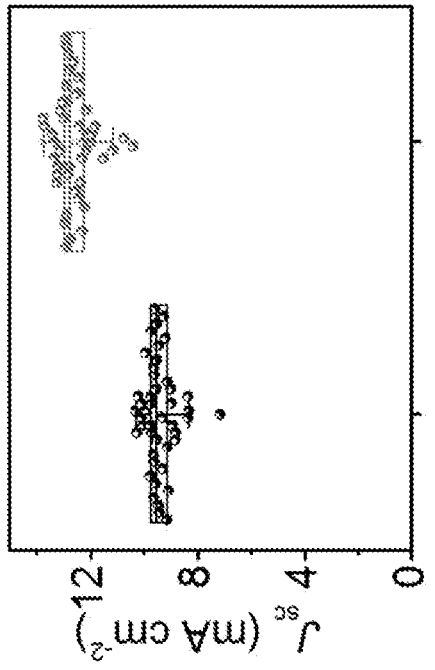
FIGS. 20A-20C show (FIG. 20A) V$_{oc}$, (FIG. 20B) J$_{SC}$, and (FIG. 20C) FF statistics for 45 (3AMP)(MA)$_3$Pb$_4$I$_{13}$ cells and 45 (3AMP)(MA$_{0.75}$FA$_{0.25}$)$_3$Pb$_4$I$_{13}$ cells.
Figure 20B:
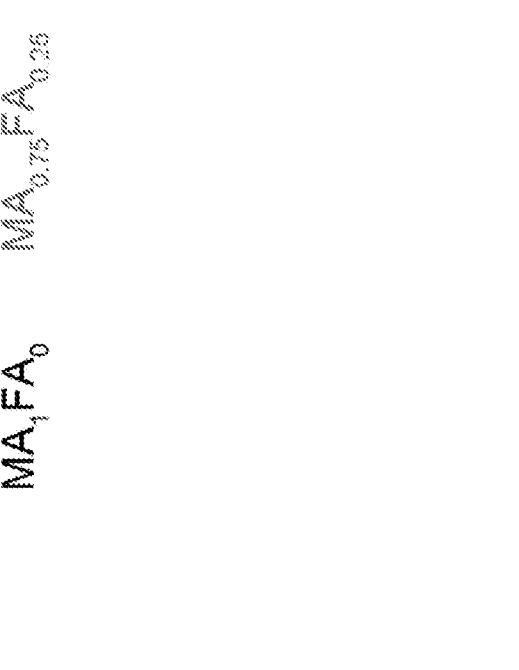
Figure 20C:
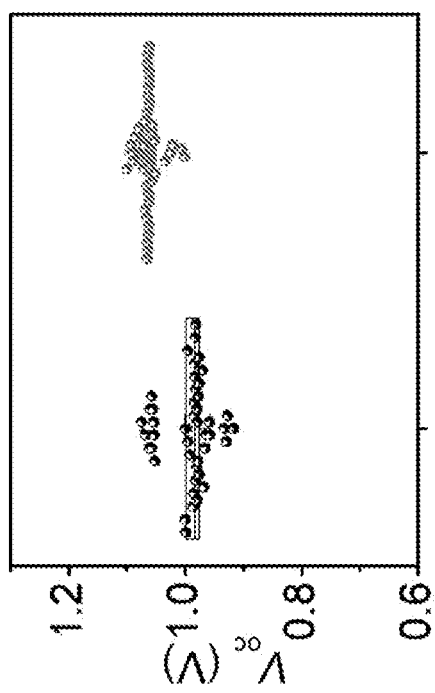
Figure 20C:
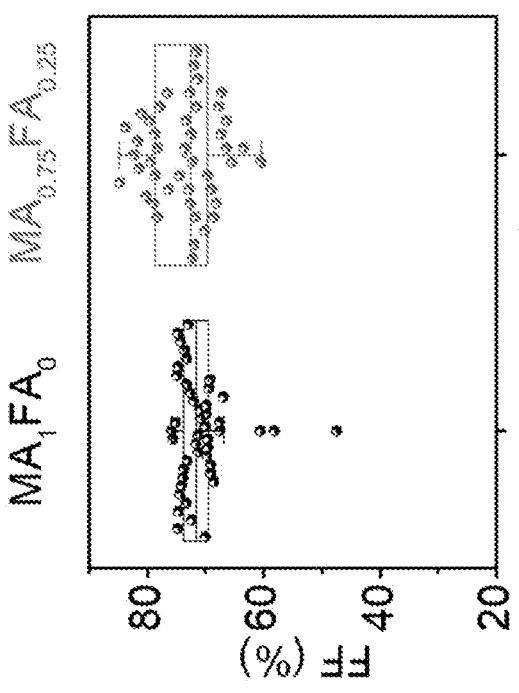

FIG. 7A shows the crystal structure of 2D DJ perovskites, stacking with a 3AMP spacer layer, and four-layered perovskite slabs for per formula unit (n=4), which is defined by single-crystal XRD data. In contrast to the 2D RP perovskites which have two sheets of spacer cations between the layers, the 2D DJ perovskites only have one sheet of spacer cation. The comparison of crystallographically refined Pb—I—Pb angles from the (3AMP)(MA)$_3$Pb$_4$I$_{13}$ and (3AMP)(MA$_{0.75}$FA$_{0.25}$)$_3$Pb$_4$I$_{13}$ single crystals is shown in FIG. 7B and FIG. 7C. The 2D (3AMP)(MA)$_3$Pb$_4$I$_{13}$ and (3AMP)(MA$_{0.75}$FA$_{0.25}$)$_3$Pb$_4$I$_{13}$ perovskites with a I . . . I interlayer distance of ~4.0 Å have average Pb—I—Pb angles of 168° and 173.8°, respectively. These overall larger Pb—I—Pb angles in (3AMP)(MA$_{0.75}$FA$_{0.25}$)$_3$Pb$_4$I$_{13}$ come from every individual equatorial (abbreviated in FIG. 7B as "En", n=1, 2, 3, 4) and axial ("An", A=1, 2, 3) angles in the crystal structure (angles defined in FIG. 19), as the increasing fraction of FA stretches the perovskite cage and decreases the distortion of the inorganic framework. The detailed crystallographic parameters of the unit cell are summarized in Table 4.

TABLE 4

Crystal data and structure refinement for (3AMP)(MA$_{0.75}$FA$_{0.25}$)3Pb$_4$I$_{13}$ at 250.02 K.

| | |
|---|---|
| Empirical formula | C$_9$H$_{33}$N$_6$Pb$_4$I$_{13}$ |
| Formula weight | 2703.87 |
| Temperature | 250.02 K |
| Wavelength | 0.71073 Å |
| Crystal system | Monoclinic |
| Space group | Pc |
| Unit cell dimensions | a = 29.3061(19) Å, α = 90° |
| | b = 8.9093(6) Å, β = 90.0117(12)° |
| | c = 8.9044(6) Å, γ = 90° |
| Volume | 2324.9(3) Å$^3$ |
| Z | 2 |
| Density (calculated) | 3.862 g/cm$^3$ |
| Absorption coefficient | 23.083 mm$^{-1}$ |
| F(000) | 2292 |
| Crystal size | 0.116 × 0.088 × 0.058 mm$^3$ |
| θ range for data collection | 0.695 to 28.383° |
| Index ranges | −39 <= h <= 39, −11 <= k <= 11, −11 <= l <= 11 |
| Reflections collected | 42175 |
| Independent reflections | 10857 [R$_{int}$ = 0.0527] |
| Completeness to θ = 26.000° | 100% |

TABLE 4-continued

Crystal data and structure refinement for (3AMP)(MA$_{0.75}$FA$_{0.25}$)3Pb$_4$I$_{13}$ at 250.02 K.

| | |
|---|---|
| Refinement method | Full-matrix least-squares on F$^2$ |
| Data/restraints/parameters | 10857/32/208 |
| Goodness-of-fit | 1.016 |
| Final R indices [I > 2σ(I)] | R$_{obs}$ = 0.0518, wR$_{obs}$ = 0.1258 |
| R indices [all data] | R$_{all}$ = 0.1111, wR$_{all}$ = 0.1626 |
| Largest diff. peak and hole | 4.049 and −1.385 e · Å$^{-3}$ |

R = Σ||F$_o$| − |F$_c$||/Σ|F$_o$|, wR = {Σ[w(|F$_o$|$^2$ − |F$_c$|$^2$)$^2$]/Σ[w(|F$_o$|$^4$)]}$^{1/2}$ and w = 1/[σ$^2$(Fo$^2$) + (0.0750P)$^2$ + 12.0460P] where P = (Fo$^2$ + 2Fc$^2$)/3

FIGS. 7D and 7E show the XRD patterns and optical properties of the 2D 3AMP perovskite crystals with various ratios of MA and FA (from 1:0 to 0.7:0.3). The XRD patterns of the crystals show that all the samples with different FA amounts adopt a 2D perovskite structure with a layer number of 4 and a slight impurity from n=5. Both the crystals with and without the FA cation have a plate-like morphology. While different samples present different band gaps, as shown in FIG. 7E, the band gap of the neat (3AMP) (MA)$_3$Pb$_4$I$_{13}$, referred to here as MA$_1$FA$_0$, is ~1.57 eV. After introducing FA cations, it is apparent that the materials have red-shifted band gaps. A narrower band gap of ~1.48 eV is obtained for the (3AMP)(MA$_{0.75}$FA$_{0.25}$)$_3$Pb$_4$I$_{13}$ sample, which is referred to as MA$_{0.75}$FA$_{0.25}$. This narrower band gap can be attributed to the larger Pb—I—Pb angles in the crystal structure as discussed above and in Example 1.

The properties of 2D DJ perovskites films and solar cells were then studied. FIG. 8A shows the absorption of the films made from the precursor by dissolving (3AMP) (MA$_{1-x}$FA$_x$)$_3$Pb$_4$I$_{13}$ crystals in DMF and DMSO (see details in Methods). All films show multiple slopes in the absorption spectra, indicating the formation of 2D DJ n=4 perovskites films together with some lower layer numbers (n=2 and 3). The different 2D layers should be beneficial for better absorption across the visible light region. The pristine (3AMP)(MA)$_3$Pb$_4$I$_{13}$ film has an absorption onset at ~760 nm. After 15% of the MA cations were replaced with FA, the film absorption was shifted to longer wavelength, showing an absorption onset at ~780 nm. The higher the FA fraction, the greater the band gap red-shift, which has the same trend as the bulk crystals. PL spectra shown in FIG. 8B are consistent with the UV-vis absorption results. It confirms that the pristine (3AMP)(MA)$_3$Pb$_4$I$_{13}$ has a PL emission peak at 756 nm. The PL emission peaks shift from 770 nm to 780 nm for the samples with the FA when the amount FA in the material was increased from 15% to 30%.

Different from the 3D perovskites which have three efficient directions for charge transport, the 2D perovskites only have two high-speed channels which are parallel to the inorganic slabs. Charge transport in the third channel vertical to the slabs is essentially blocked by the organic 3AMP layer. Therefore, 2D perovskites vertically grown on substrate with a preferred orientation should have more efficient charge transport. The XRD patterns shown in FIG. 8C reveal that all 3AMP perovskite films with various FA fractions have a good crystallinity and a preferred orientation in the (110) planes. The films show strong peaks at 2θ=14.2°, and 28.4°, which can be indexed to the (110) and (220) reflections. The zoomed-in XRD patterns in FIG. 8D show that the films with and without FA cations are slightly different. The diffraction patterns of the 2D 3AMP films with FA cations slightly shift towards smaller 2θ angles, suggesting a small increase in unit cell size arising from the incorporation of larger-size FA cations in the perovskite structure, which increases the Pb—I—Pb angles and reduces the band gaps.

Figure 8E:
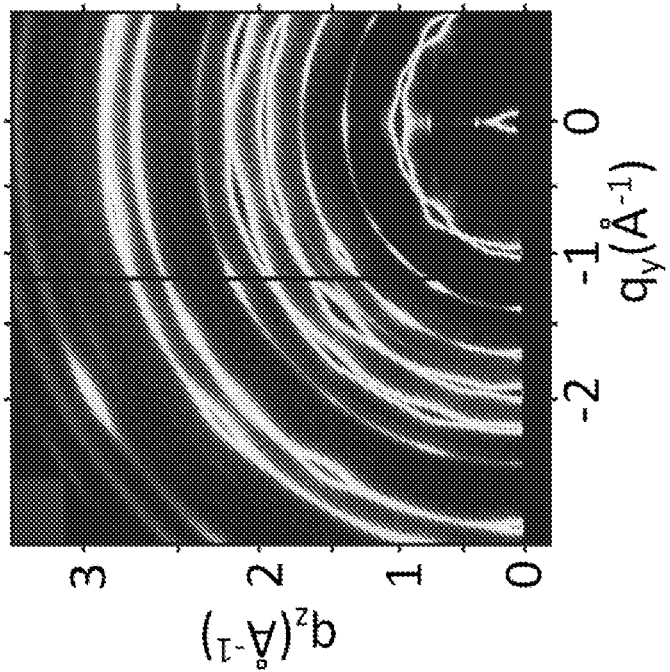
FIGS. 8E-8F show grazing-incidence wide-angle X-ray scattering (GIWAXS) patterns of a (3AMP)(MA)$_3$Pb$_4$I$_{13}$ film (FIG. 8E) and a (3AMP)(MA$_{0.75}$FA$_{0.25}$)$_3$Pb$_4$I$_{13}$ film (FIG. 8F) deposited on FTO/PEDOT:PSS substrates.
Figure 8F:
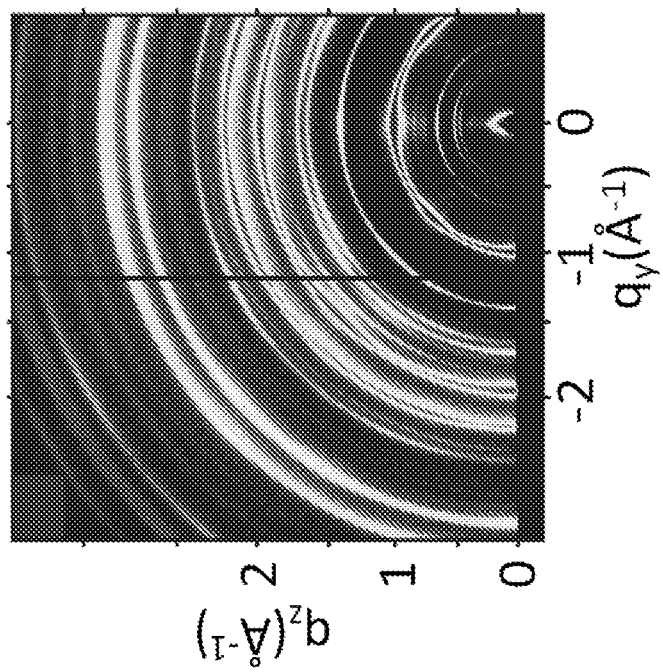

The orientation of the films was assessed by G1WAXS measurement by using synchrotron radiation. The samples without FA and with 25% FA have similar scattering patterns, as shown in FIGS. 8E and 8F. Most of the crystal grains in both films are oriented vertical to the substrates, consistent with the XRD results.

Apart from optical absorption and crystalline quality, film morphology plays a vital role in determining device performance. All films with various FA cation amounts have a similar morphology, showing a pin-hole free and ultra-smooth surface, while the grain size of the films with higher FA fractions becomes slightly smaller. These films were then used to fabricate solar cells. The devices had a planar inverted architecture, which included an FTC substrate, PEDOT:PSS, a perovskite absorber, C$_0$, BCP, and an Al electrode. PEDOT:PSS and C(o act as an HTL and an ETL, respectively. FIG. 9A shows a cross-sectional SEM image of a complete device based on the (3AMP)(MA$_{0.75}$FA$_{0.25}$)$_3$Pb$_4$I$_{13}$ absorber. The thickness of the (3AMP)(MA$_{0.75}$FA$_{0.25}$)$_3$Pb$_4$I$_{13}$ perovskite film absorber was around 350 nm, and each layer was uniformly stacked, which is essential for the fabrication of efficient planar devices.

Even though the films with various FA amounts have similar morphology, the devices show big differences in device performance. The J-V curves of the representative solar cells based on different absorber compositions are shown in FIG. 9B. The MA-only end member solar cell only gives a PCE of 7.02% with a V$_{oc}$ of 1.00 V, a J$_{SC}$ of 9.90 mA cm$^{-2}$, and an FF of 7 L24% The device performance is significantly enhanced after incorporating the FA cation. Just replacing 15% of MA with FA, the PCE rises to 9.30%, due to the improved J$_{SC}$, V$_{oc}$, and FF. The best performance was obtained from the device based on the (3AMP)(MA$_{0.75}$FA$_{0.25}$)$_3$Pb$_4$I$_{13}$ composition. The PCE of the (3AMP)(MA$_{0.75}$FA$_{0.25}$)$_3$Pb$_4$I$_{13}$ cell reaches 11.24% with a high FF of 78,67%, a V$_{oc}$ of 1.10 V, and a J$_{SC}$ of 12.99 mA cm$^{-2}$. The photovoltaic parameters of all devices are summarized in Table 5. FIG. 9C shows the EQE spectra of solar cells with various (3AMP)(MA$_{i-x}$FA$_x$)$_3$Pb$_4$I$_{13}$ compositions. The solar cells with the FA cation show a red-shifted cut-off, which is consistent with the UV-vis absorption and PL results. They also exhibit higher average EQE values in the whole visible-light spectra. The J$_{SC}$ integrated from the EQE curves of the (3AMP)(MA)$_3$Pb$_4$I$_{13}$, (3AMP)(MA$_{0.85}$FA$_{0.15}$)$_3$Pb$_4$I$_{13}$, (3AMP)(MA$_{0.8}$FA$_{0.2}$)$_3$Pb$_4$I$_{13}$, (3AMP)(MA$_{0.75}$FA$_{0.25}$)$_3$Pb$_4$I$_{13}$, and (3AMP)(MA$_{0.7}$FA$_{0.3}$)$_3$Pb$_4$I$_{13}$ cells are 9.86, 11.44, 12.29, 12.88, 11.93 mA cm-2, respectively, in good agreement with the trend obtained from the J-V results.

TABLE 5

Summary of photovoltaic parameters of the solar cells based on 2D(3AMP)(MA$_{1-x}$FA$_x$)$_3$Pb$_4$I$_{13}$ (x = 0-0.3) perovskites.

| | V$_{oc}$ [V] | J$_{sc}$ [mA cm$^{-2}$] | FF [%] | PCE [%] |
|---|---|---|---|---|
| MA$_1$FA$_0$ | 1.00 | 9.90 | 71.24 | 7.02 |
| MA$_{0.85}$FA$_{0.15}$ | 1.09 | 11.56 | 73.69 | 9.30 |
| MA$_{0.8}$FA$_{0.2}$ | 1.09 | 12.38 | 74.93 | 10.16 |
| MA$_{0.75}$FA$_{0.25}$ | 1.10 | 12.99 | 78.67 | 11.24 |
| MA$_{0.7}$FA$_{0.3}$ | 1.06 | 12.45 | 75.86 | 10.03 |

To check the reproducibility of the devices, 45 solar cells for each absorber of (3AMP)(MA)$_3$Pb$_4$I$_{13}$ and (3AMP)(MA$_{0.75}$FA$_{0.25}$)$_3$Pb$_4$I$_{13}$ were fabricated. It is obvious that the (3AMP)(MA$_{0.75}$FA$_{0.25}$)$_3$Pb$_4$I$_{13}$ cells have a much higher average performance with respect to the (3AMP)(MA)$_3$Pb$_4$I$_{13}$ cells. As shown in FIGS. 20A-20C and FIG. 9D, the neat (3AMP)(MA)$_3$Pb$_4$I$_{13}$ cells only achieved an average PCE of 6.62±0.63% with a V$_{oc}$ of 0.99±0.04 V, a J$_{SC}$ of 9.41±0.59 mA cm$^{-2}$, and an FF of 70.81±5.02%, while the (3AMP)(MA$_{0.75}$FA$_{0.25}$)$_3$Pb$_4$I$_{13}$ cells yielded a higher J$_{SC}$ of 12.57±0.70 mA cm$^{-2}$, a V$_{oc}$ of 1.06±0.02 V, an FF of 73.65±5.74%, and therefore a much higher average PCE of 9.83±0.94%.

Figure 10A:
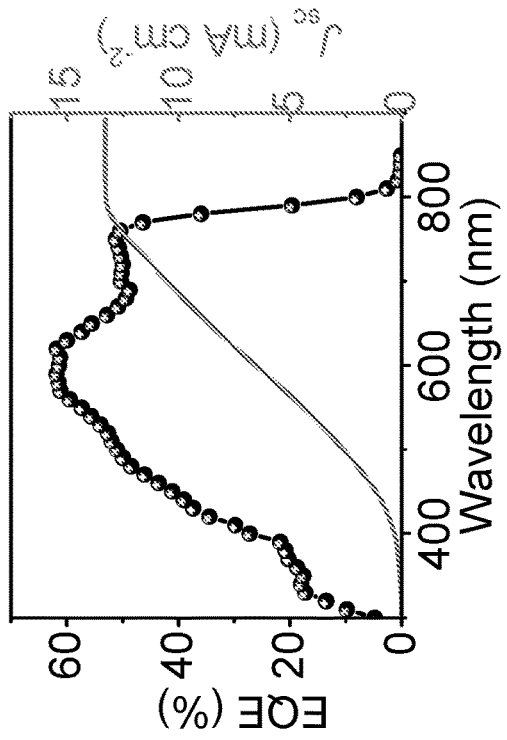
FIG. 10A shows J-V curves of the best-performing (3AMP)(MA$_{0.75}$FA$_{0.25}$)$_3$Pb$_4$I$_{13}$ solar cell measured under different voltage scan directions.
Figure 10B:
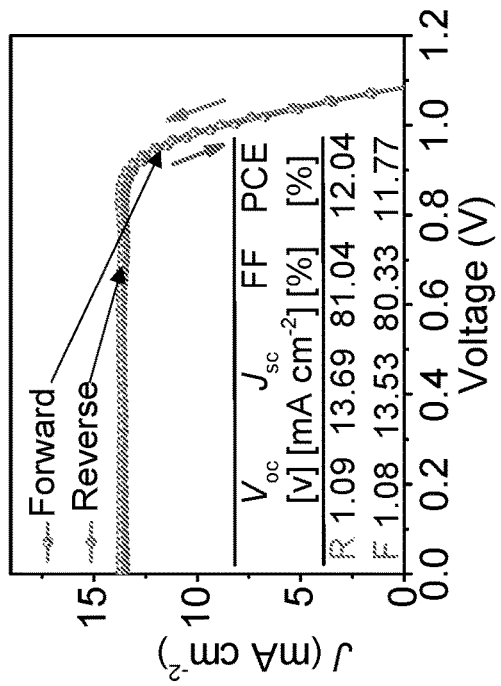
FIG. 10B shows an EQE spectrum of the (3AMP)(MA$_{0.75}$FA$_{0.25}$)$_3$Pb$_4$I$_{13}$ cell.
Figure 21:
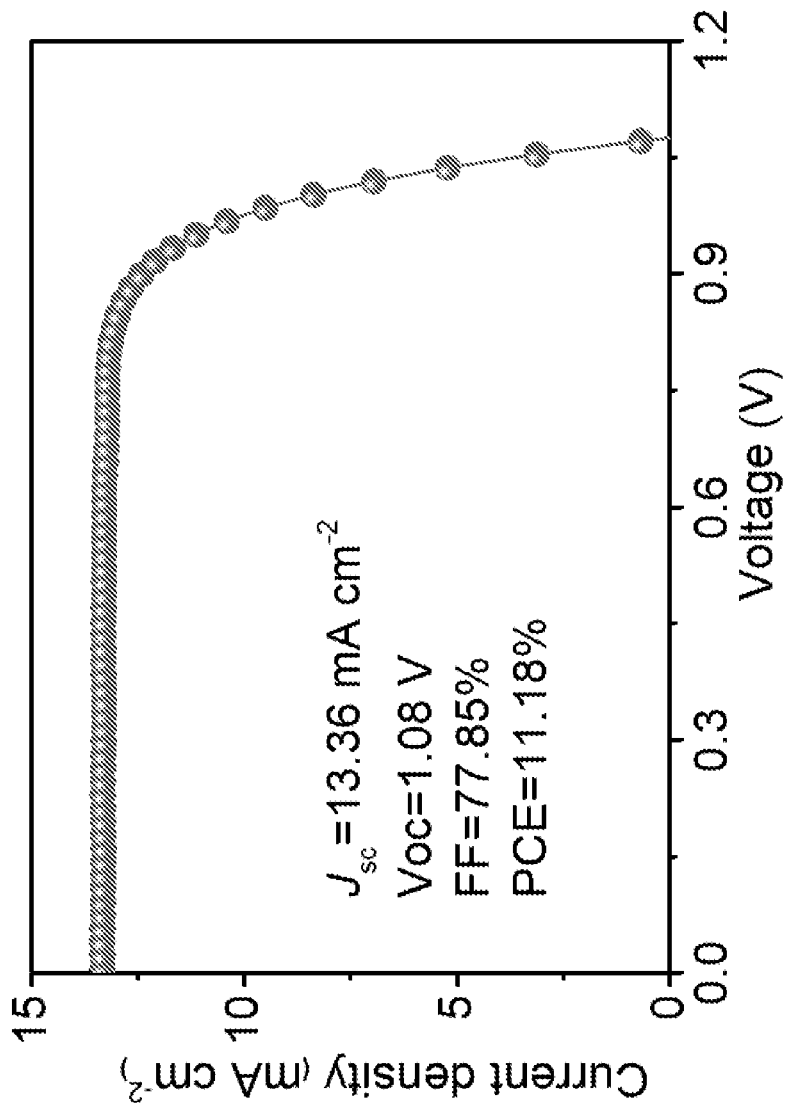
FIG. 21 shows a J-V curve of a (3AMP)(MA$_{0.75}$FA$_{0.25}$)$_3$Pb$_4$I$_{13}$ solar cell with an active area of 0.39 cm$^2$.

Among these devices, the best-performing (3AMP)(MA$_{0.75}$FA$_{0.25}$)$_3$Pb$_4$I$_{13}$ cell with an active area of 0.09 cm$^{-2}$ achieved a champion PCE of 12.04% (FIG. 10A), benefiting from the very high FF of 81.04%, a J$_{SC}$ of 13.69 mA cm$^{-2}$, and a V$_{oc}$ of 1.09 V, when measured under a reverse scan (from V$_{oc}$ to J$_{SC}$). The FF of 81.04% is the record value in all types of 2D perovskite solar cells. The (3AMP)(MA$_{0.75}$FA$_{0.25}$)$_3$Pb$_4$I$_{13}$ device showed a small hysteresis behavior since a similar PCE can be obtained from the J-V curve measured under a forward scan (from J$_{SC}$ to V$_{oc}$). As shown in FIG. 10A, the forward-scanned J-V curve also gave a high PCE of 11.77% with an FF of 80.33%, a J$_{SC}$ of 13.53 mA cm$^{-2}$, and a V$_{oc}$ of 1.08 V. The EQE of the best-performing cell had a high average value in the wavelength range from 300 to 800 nm, shown in FIG. 10B. J$_{SC}$ integrated from EQE spectrum of 13.29 mA cm-2 was obtained, which is close to the values from the J-V results measured under different scan directions. A (3AMP)(MA$_{0.75}$FA$_{0.25}$)$_3$Pb$_4$I$_{13}$ solar cell with a larger active area of 0.39 cm-2 was also fabricated. As shown in FIG. 21, the cell achieved an FF of 77.85%, a J$_{SC}$ of 13.36 mA cm$^{-2}$, a V$_{oc}$ of 1.08 V, and a high PCE of 11.18%, benefiting from the highly uniform perovskite films.

Figure 22B:
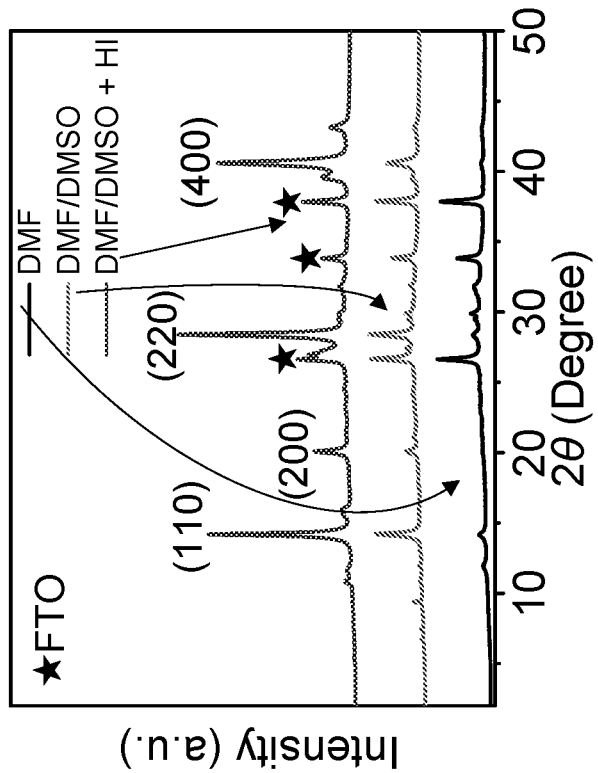
FIGS. 22A-22B show (FIG. 22A) UV-vis absorption and (FIG. 22B) XRD patterns of (3AMP)(MA$_{0.75}$FA$_{0.25}$)$_3$Pb$_4$I$_{13}$ films made from the perovskite precursors with a DMF solvent, a DMF/DMSO solvent, and a DMF/DMSO solvent with 0.8 vol % HI.
Figure 22A:
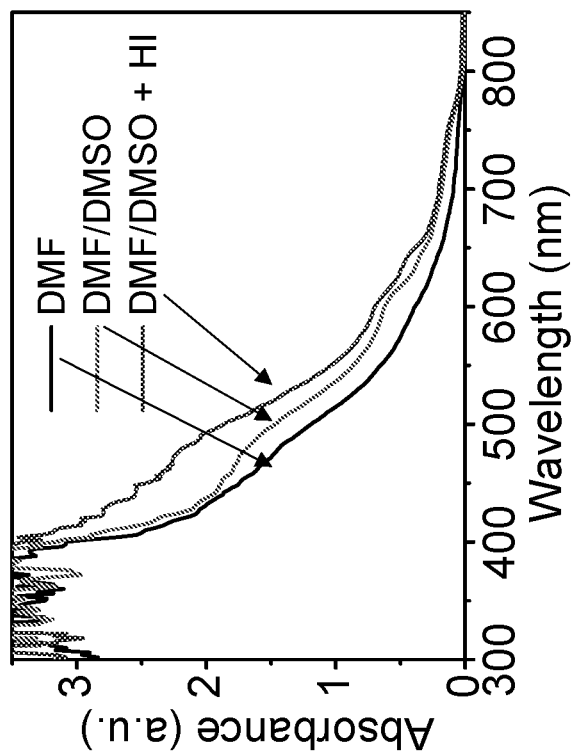
Figure 23:
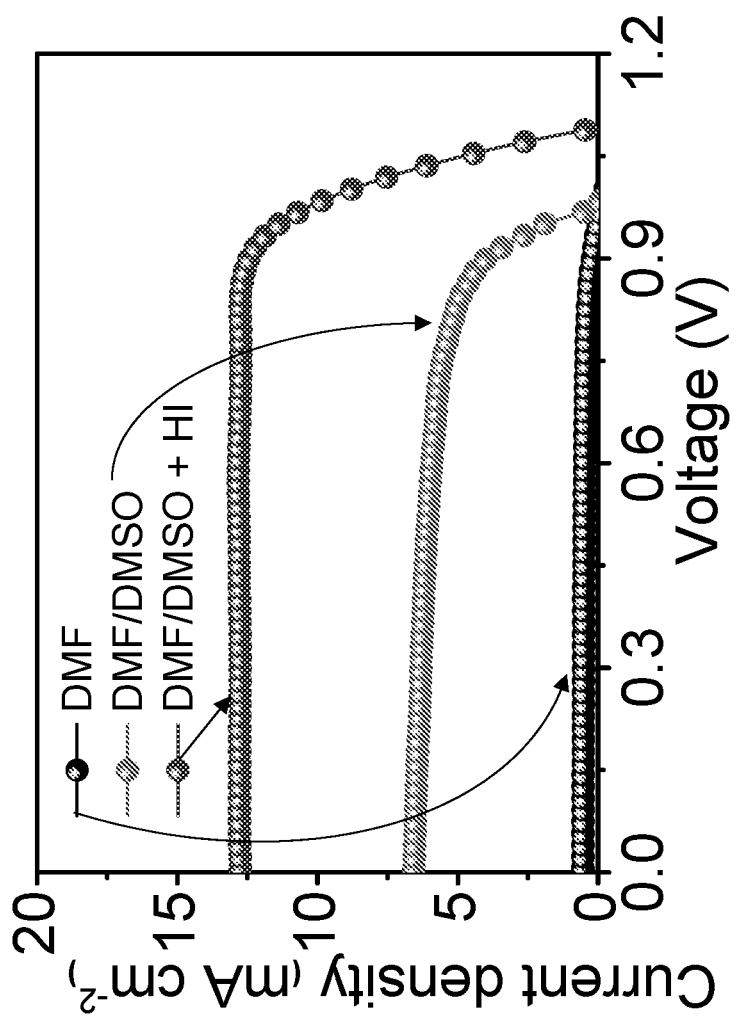
FIG. 23 shows J-V curves of the (3AMP)(MA$_{0.75}$FA$_{0.25}$)$_3$Pb$_4$I$_{13}$-based solar cells made from the perovskite precursors with a DMF solvent, a DMF/DMSO solvent, and a DMF/DMSO solvent with 0.8 vol % HI.

Perovskite film quality can be effectively controlled by the solvents and additives used in the precursors. For fabrication of high-quality 2D DJ perovskite absorbers, the use of the solvent-engineering method with a small amount of added HI in the precursor was found to be critical. (N. J. Jeon et al., Nat. Mater., 2014, 13, 897-903; C. M. Soe et al., ChemSusChem, 2016, 9, 2656-2665; W. Ke, et al., J. Am. Chem. Soc., 2016, 138 14998-15003; N. Ahn, et al., J. Am. Chem. Soc., 2015, 137, 8696-8699.) The (3AMP)(MA$_{0.75}$FA$_{0.25}$)$_3$Pb$_4$I$_{13}$ films prepared using DMF solvent tend to have numerous pin-holes. After use of the solvent-engineering method with a mixed DMF/DMSO solvent, the films became much smoother and pin-hole free. The films by the solvent-engineering method without and with HI showed no obvious difference and both were compact and smooth. Not only the film morphology, but also the film absorption and crystalline quality improved when using the solvent-engineering method and HI additive. FIGS. 22A-22B shows that the (3AMP)(MA$_{0.75}$FA$_{0.25}$)$_3$Pb$_4$I$_{13}$ film made by the DMF solvent had the weakest absorption and XRD pattern intensity. In contrast, the (3AMP)(MA$_{0.75}$FA$_{0.25}$)$_3$Pb$_4$I$_{13}$ film made by the DMF/DMSO solvent and HI had the same band gap but showed the strongest absorption and ~12 times higher XRD reflection intensity than the film made using DMF. This indicates the superior crystalline quality of the film made using DMF/DMSO and HI, which is also confirmed by the GIWAXS measurements. For example, the (3AMP)(MA$_{0.75}$FA$_{0.25}$)$_3$Pb$_4$I$_{13}$ film made from DMF exhibited weak polycrystalliine patterns with some broad Bragg rings in the film plane. The film prepared by DMF/DMSO without HI showed a stronger intensity and consecutive Bragg rings. Unlike the films without HI, the film made by DMF/DMSO and HI showed sharper and discrete Bragg spots (FIG. 8F), suggesting preferred orientation in the "perpendicular" direction, which is beneficial for charge transport in the devices. As a result, the solar cells based on the (3AMP)(MA$_{0.75}$FA$_{0.25}$)$_3$Pb$_4$I$_{13}$ absorbers made using DMF/DMSO and HI have a much better performance. J-V curves of the devices employing the absorbers made by various conditions are shown in FIG. 23. The solar cell with the absorber made using only DMF had a low J$_{SC}$ of 0.54 mA cm$^{-2}$ and a PCE of 0.32% (Table 6), which can be attributed to the poor film morphology, poor crystalline quality, and more random orientation. The J$_{SC}$ of the devices was improved when using the mixed DMF/DMSO solvent and HI additive. The cell achieved a much higher J$_{SC}$ of 12.77 mA cm$^{-2}$ and a PCE of 11.19%. Therefore, the use of the solvent-engineering method and the HI additive are effective in fabricating high-performance 2D 3AMP perovskite solar cells.

TABLE 6

Summary of photovoltaic parameters of the (3AMP)(MA$_{0.75}$FA$_{0.25}$)$_3$Pb$_4$I$_{13}$ solar cells made from the perovskite precursors with different solvents.

| | V$_{oc}$ [V] | J$_{sc}$ [mA cm$^{-2}$] | FF [%] | PCE [%] |
|---|---|---|---|---|
| DMF | 0.95 | 0.54 | 63.05 | 0.32 |
| DMF/DMSO | 0.98 | 6.56 | 65.07 | 4.20 |
| DMF/DMSO + HI | 1.09 | 12.77 | 80.20 | 11.19 |

Figure 10C:
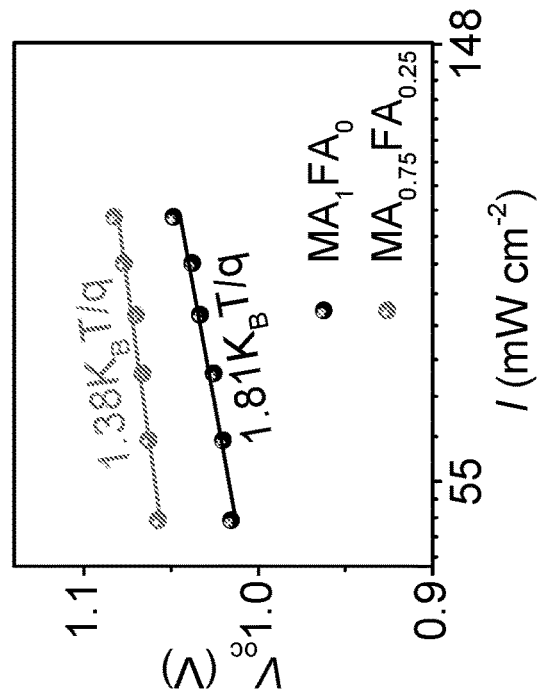
FIGS. 10C-10D show J$_{SC}$ (FIG. 10C) and V$_{oc}$ (FIG. 10D) as a function of I for the (3AMP)MA$_3$Pb$_4$I$_{13}$ cells and (3AMP)(MA$_{0.75}$FA$_{0.25}$)$_3$Pb$_4$I$_{13}$ devices.

It is important to highlight that among all FA:MA ratios, the (3AMP)(MA$_{0.75}$FA$_{0.25}$)$_3$Pb$_4$I$_{13}$ solar cells have higher J$_{SC}$, and this is attributed to the narrower band gap for this ratio. These cells also have higher V$_{oc}$ and FF which are highly related to the recombination process. To understand the recombination process in the devices, J$_{SC}$ was measured under different light intensities (I) ranging from 50 to 100 mW cm$^{-2}$. The power law dependence between J$_{SC}$ and I have a relationship of J$_{SC}$∝I$^\alpha$, where a should be close to 1 if the devices have sufficient electron and hole mobilities and no space charge effect. FIG. 10C shows the plot of J$_{SC}$ versus I for the (3AMP)(MA)$_3$Pb$_4$I$_{13}$ and (3AMP)(MA$_{0.75}$FA$_{0.25}$)$_3$Pb$_4$I$_{13}$ devices under a double logarithmic scale. Both devices showed a linear relationship with I. The fitted a values, equal to the slope of the curves, of (3AMP)(MA)$_3$Pb$_4$I$_{13}$ and (3AMP)(MA$_{0.75}$FA$_{0.25}$)$_3$Pb$_4$I$_{13}$ were 0.956 and 0.971, respectively. The higher a value of (3AMP)(MA$_{0.75}$FA$_{0.25}$)$_3$Pb$_4$I$_{13}$ indicates a less space-charge-limited photocurrent possibly arising from the lower trap density within the materials.

Figure 10D:
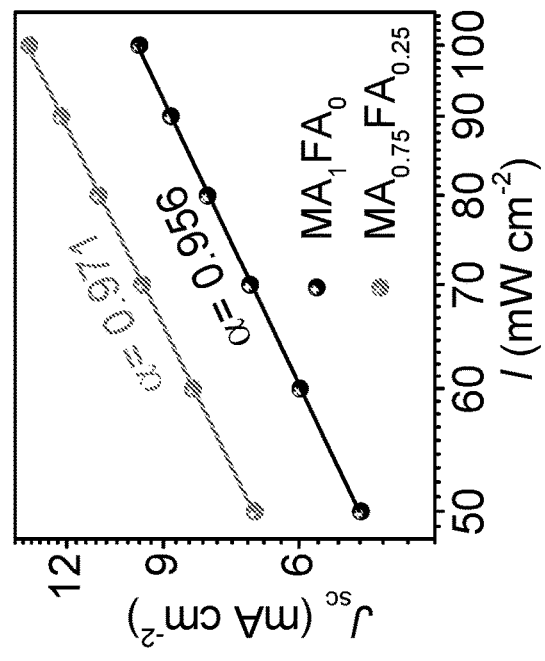

V$_{oc}$ was then measured under different I to compare the recombination process in different devices. Crystalline silicon solar cells have a slope of $\delta V_{oc}$=2kT/q in the plot of V$_{oc}$ versus the natural logarithmic I, implying that a Shockley-Reed-Hall recombination is dominant in the devices where q is the elementary charge, k is the Boltzmann constant, and T is the temperature. A trap-free electron and hole transport and bimolecular recombination should have a slope of $\delta V_{oc}$=kT/q. FIG. 10D shows the plot of V$_{oc}$ versus I for different devices, where I is under a natural logarithmic scale. The (3AMP)(MA)$_3$Pb$_4$I$_{13}$ and (3AMP)(MA$_{0.75}$FA$_{0.25}$)$_3$Pb$_4$I$_{13}$ devices show slopes of 1.81kT/e and 1.38kT/e, respectively. The higher the slopes, the higher the Shockley-Reed-Hall recombination. Therefore, the (3AMP)(MA$_{0.75}$FA$_{0.25}$)$_3$Pb$_4$I$_{13}$ device has a much lower slope that indicates a much lower trap-assisted recombination, implying a lower trap density in this material. On the basis of these results, it is concluded that the higher efficiency of the (3AMP)(MA$_{0.75}$FA$_{0.25}$)$_3$Pb$_4$I$_{13}$ solar cells derives mainly from the reduced band gap and reduced trap density after introducing the FA cation in the perovskite cage.

Figure 11B:
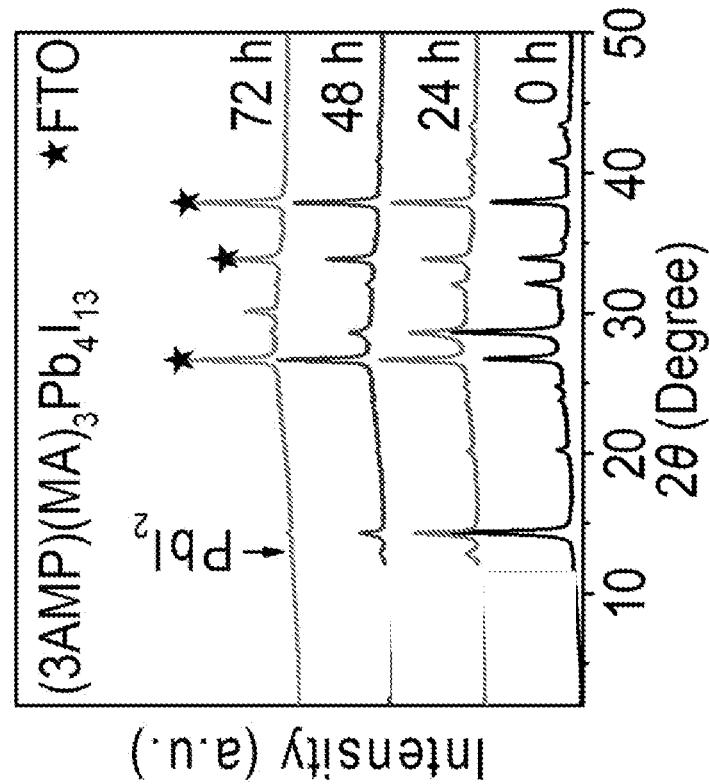
FIGS. 11A-11D show a stability test for XRD patterns of (FIG. 11A) a (BA)$_2$(MA)$_3$Pb$_4$I$_{13}$ film, (FIG. 111B) a (3AMP)(MA)$_3$Pb$_4$I$_{13}$ film, (FIG. 11C) a (3AMP)(MA$_{0.75}$FA$_{0.25}$)$_3$Pb$_4$I$_{13}$ film, and (FIG. 11D) a 3D MA$_{0.75}$FA$_{0.25}$PbI$_3$ film deposited on FTO/PEDOT substrates without encapsulation under constant AM1.5G illumination in ambient air with 50-60% relative humidity at room temperature.
Figure 11A:
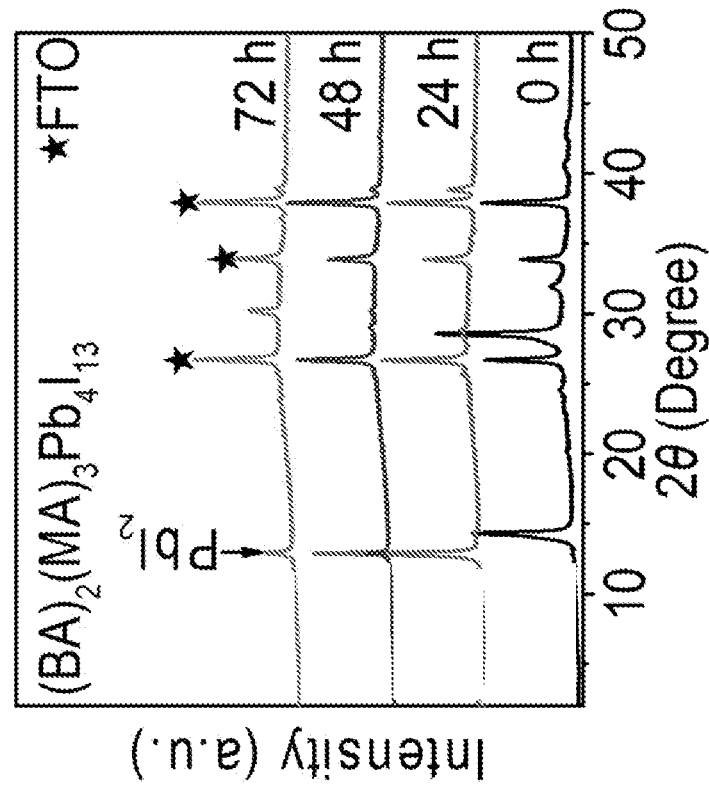
Figures 11C, 11D:
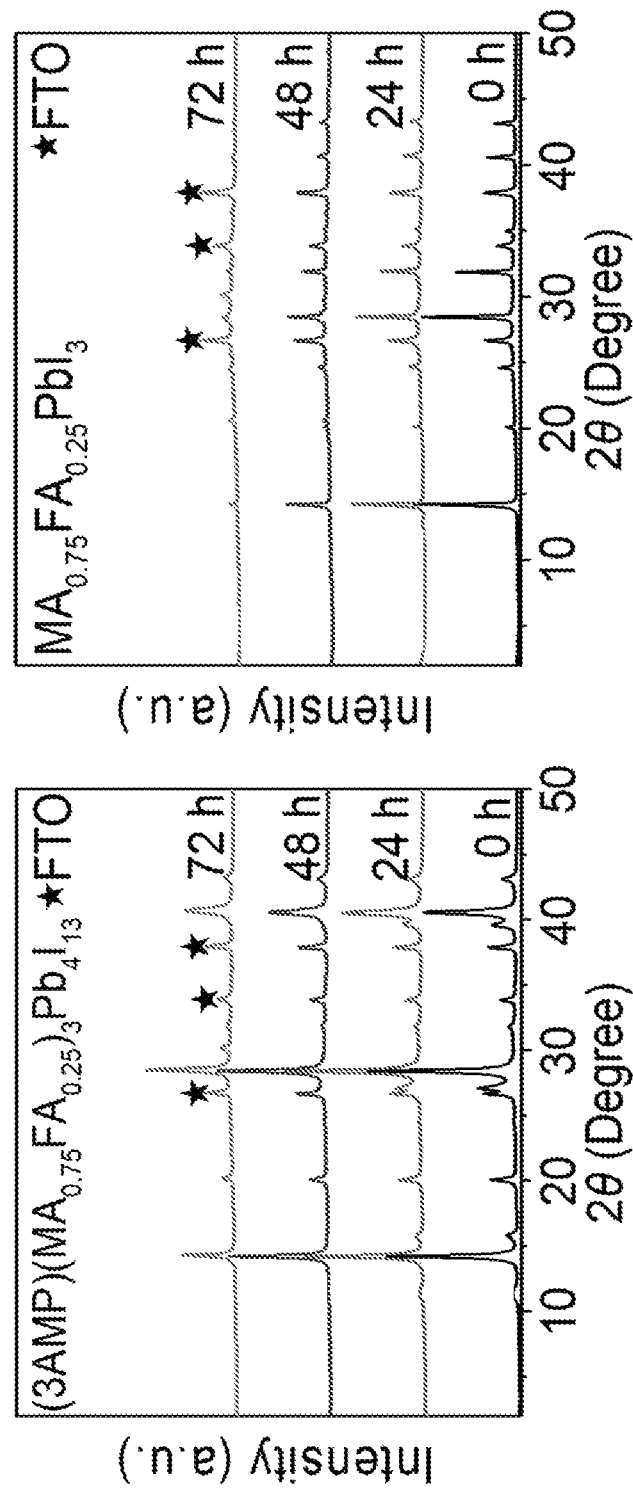

The environmental stability of these materials was also examined. First, the stability of the 2D DJ (3AMP)(MA)$_3$Pb$_4$I$_{13}$ perovskite film was compared to that of a representative 2D RP perovskite of (BA)$_2$(MA)$_3$Pb$_4$I$_{13}$. FIG. 11A shows that the un-encapsulated RP (BA)$_2$(MA)$_3$Pb$_4$I$_{13}$ film developed an obvious PbI$_2$ peak, and the 2D perovskite Bragg reflections almost disappeared just after 24 h of constant AM1.5G illumination in ambient air. The films turned from black to yellow after the stability tests. By comparison, the (3AMP)(MA)$_3$Pb$_4$I$_{13}$ perovskite film retained its main perovskite component after 24 h and started to decompose after 48 h of constant AM 1.5G illumination in ambient air (FIG. 11B). Therefore, the 2D DJ 3AMP-based perovskite is more stable than the 2D RB BA-based perovskite. It was also found that the FA cation in 3AMP-based 2D DJ perovskite improves not only the efficiency but also the stability. As shown in FIG. 11C, the un-encapsulated (3AMP)(MA$_{0.75}$FA$_{0.25}$)$_3$Pb$_4$I$_{13}$ film did not exhibit pronounced changes after 72 h illumination in ambient air. Furthermore, the (3AMP)(MA$_{0.75}$FA$_{0.25}$)$_3$Pb$_4$I$_{13}$ perovskite film showed better stability than its 3D counterparts of MAPbI$_3$ and MA$_{0.75}$FA$_{0.25}$PbI$_3$ (FIG. 11D). The MA$_{0.75}$FA$_{0.25}$PbI$_3$ film had a faster degradation rate under the same conditions, as evidenced by the very weak XRD patterns after 72 h illumination in ambient air (FIG. 11D). It is clear that the trend of the film stability is MAPbI$_3$<(BA)$_2$(MA)$_3$Pb$_4$I$_{13}$<(3AMP)(MA)$_3$Pb$_4$I$_{13}$< MA$_{0.75}$FA$_{0.25}$PbI$_3$<(3AMP)(MA$_{0.75}$FA$_{0.25}$)$_3$Pb$_4$I$_{13}$.

Figures 11E, 11F:
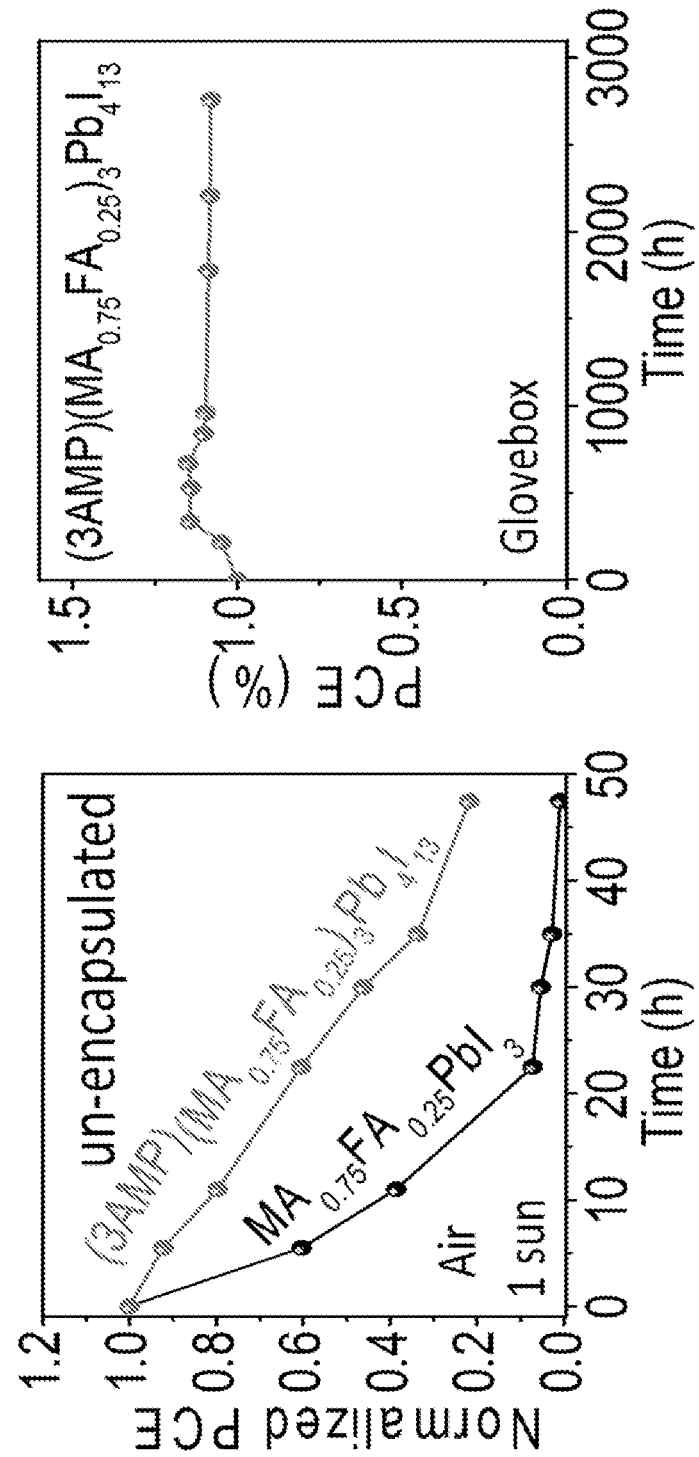
FIG. 11E shows a stability test of the un-encapsulated devices under constant AM1.5G illumination in ambient air with a 50-60% relative humidity at room temperature.
FIG. 11F shows a stability test of the un-encapsulated (3AMP)(MA$_{0.75}$FA$_{0.25}$)$_3$Pb$_4$I$_{13}$ cell stored in a N$_2$-filled glovebox in the dark.
Figure 12C:
Figure 12C:
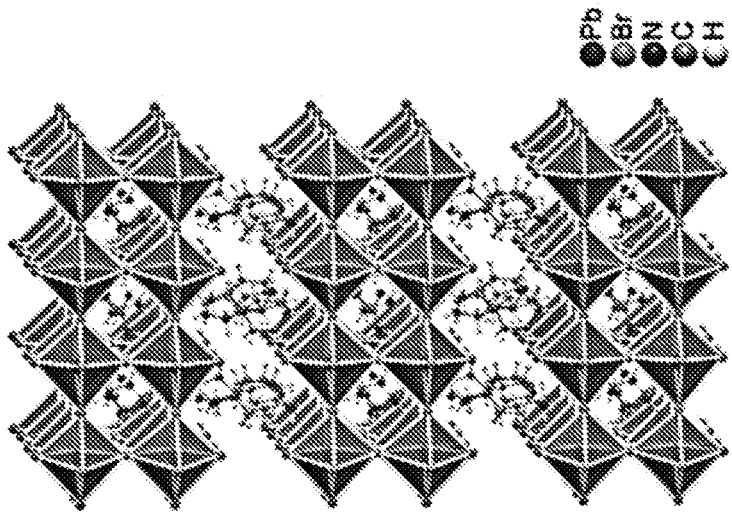
Figure 12D:
Figure 12D:
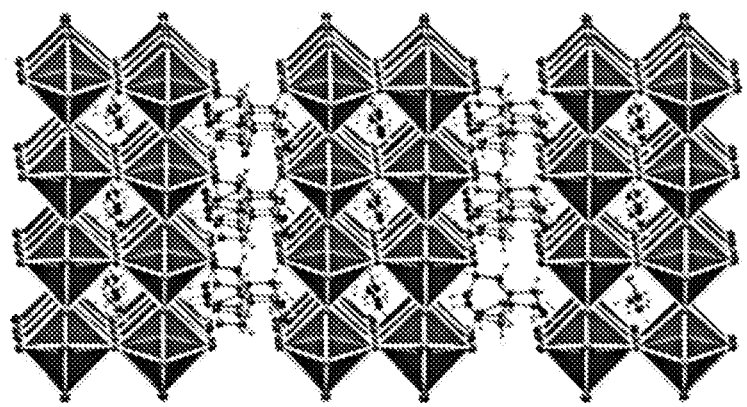
Figure 12F:
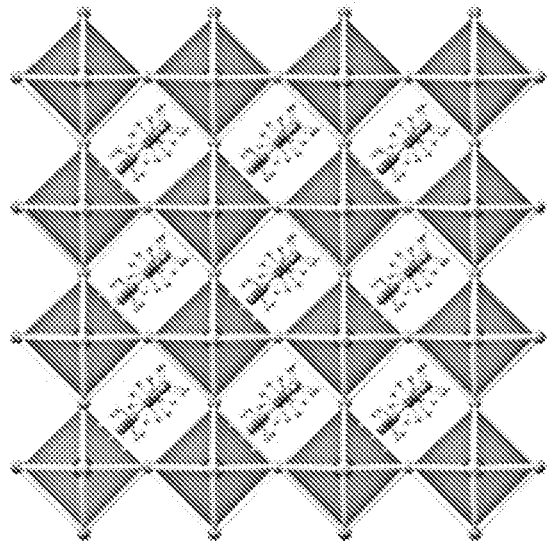
Figure 12E:
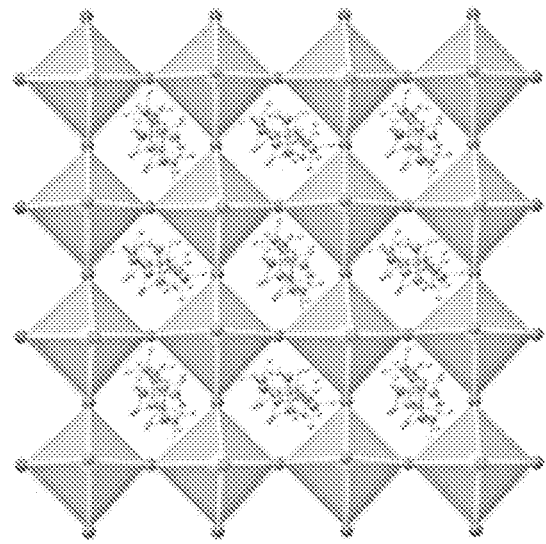
Figure 12G:
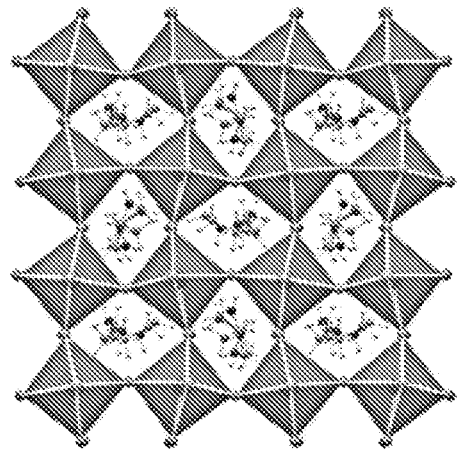
Figure 12H:
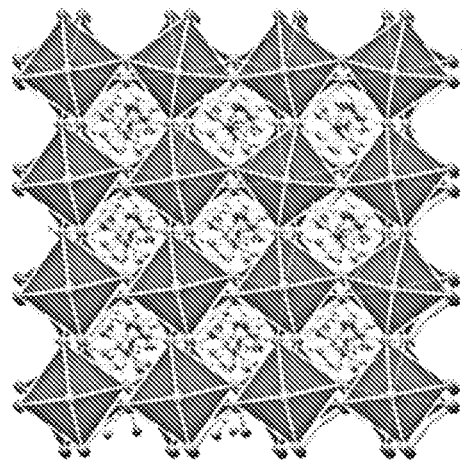
Figures 12I, 12J:
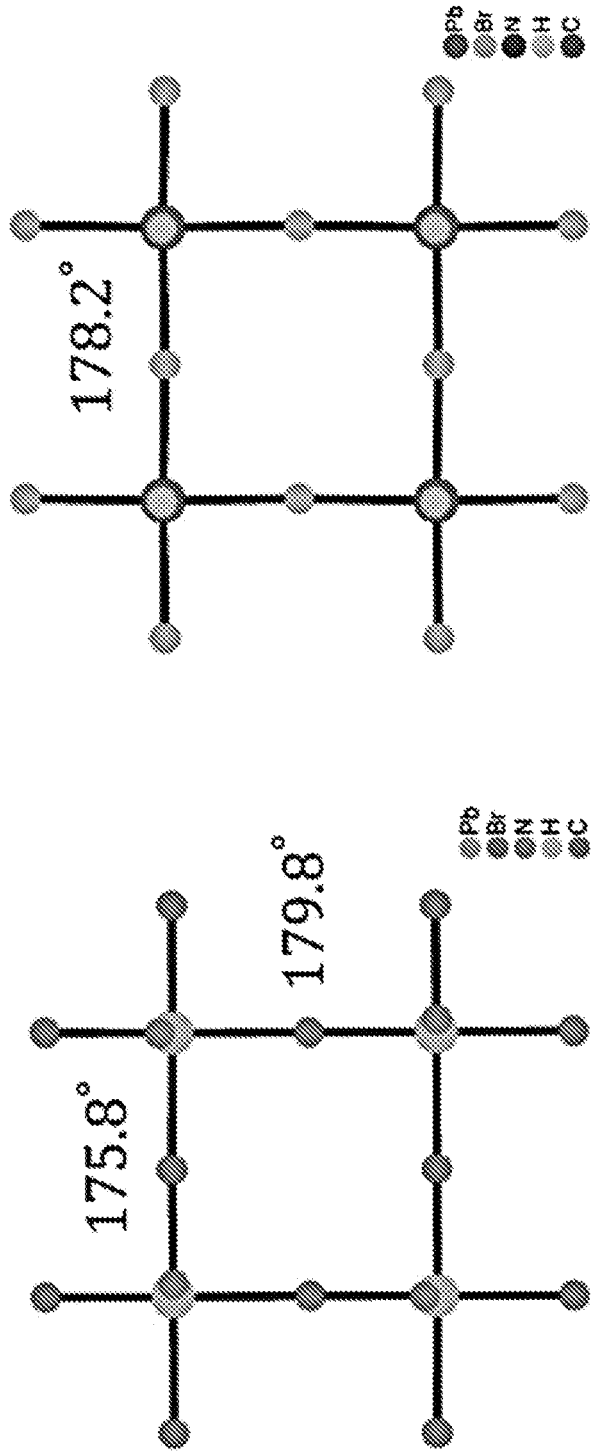
Figures 12K, 12L:
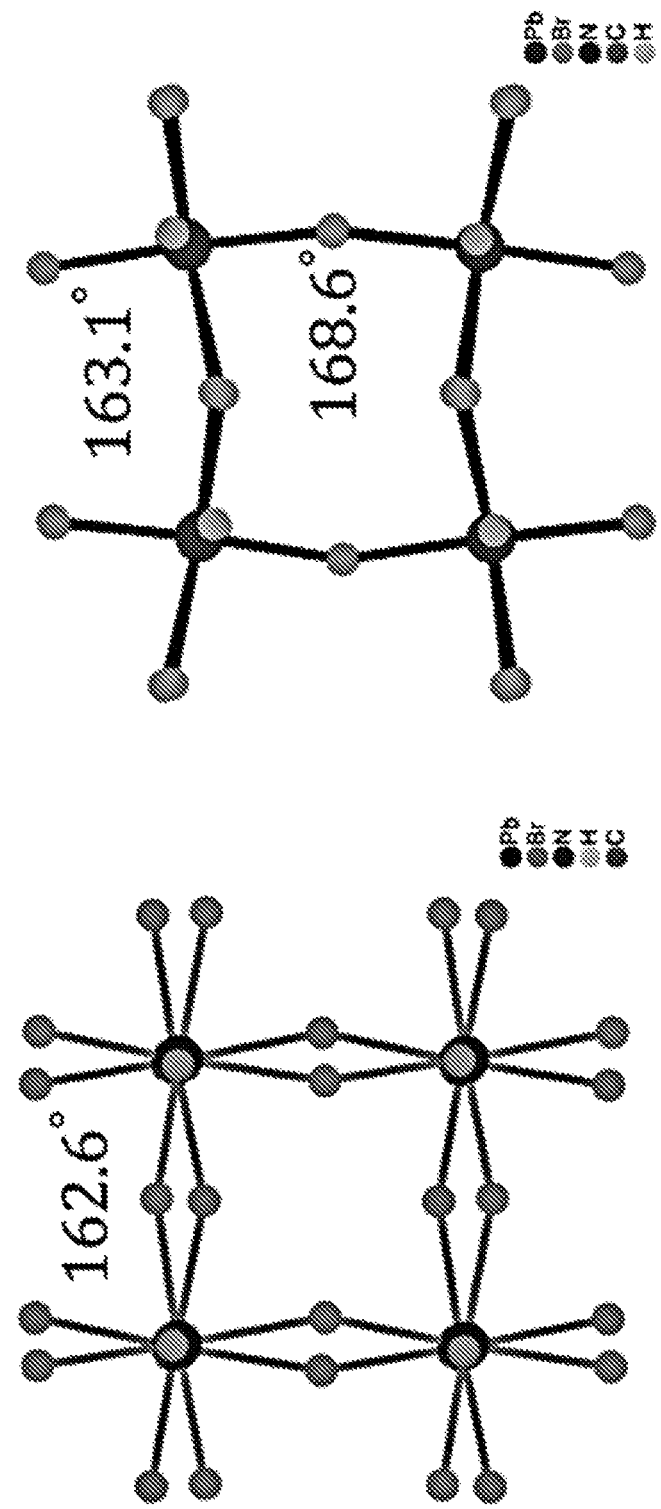
Figure 13:
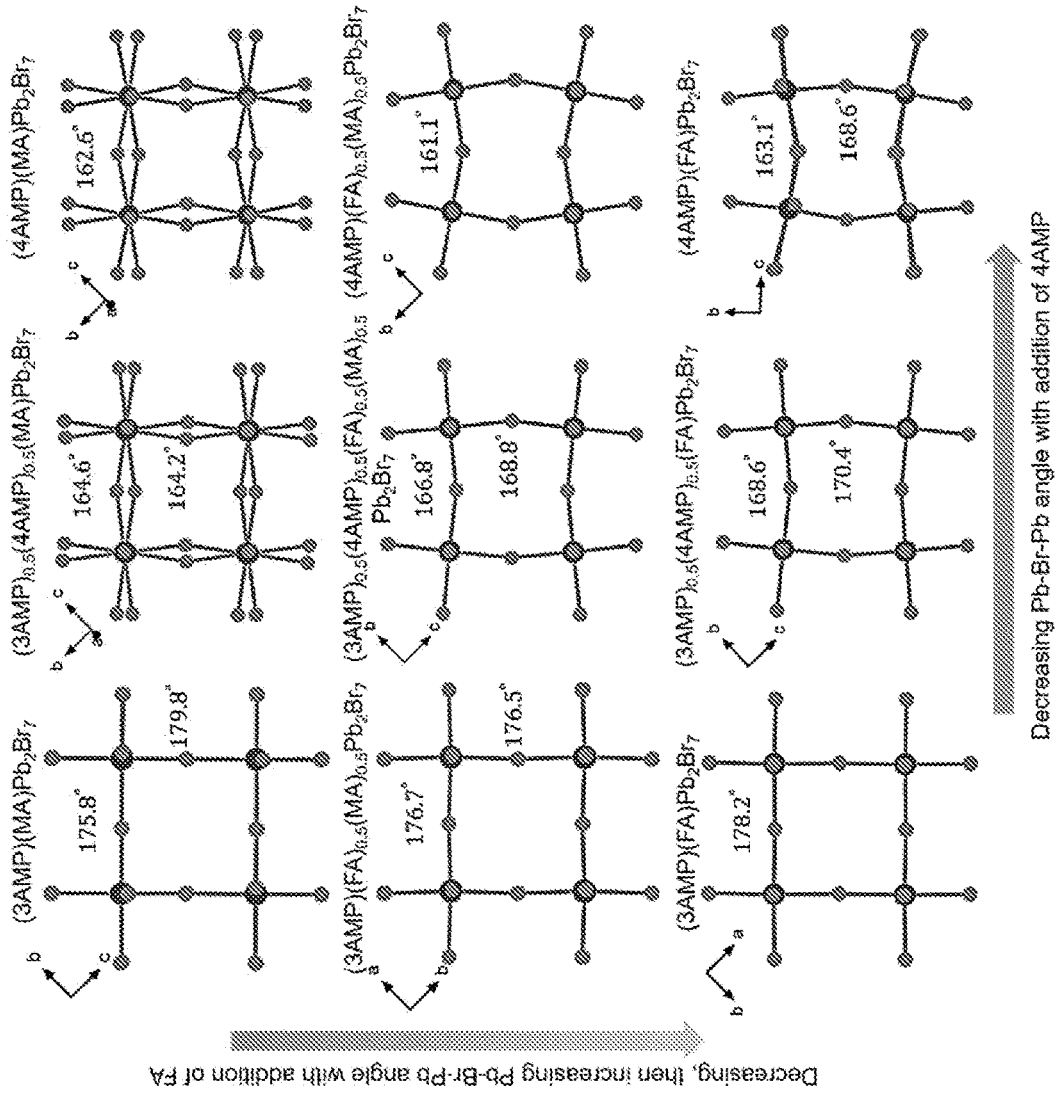
FIG. 13 shows the crystal structure of the additional two-dimensional halide perovskites.
Figure 14A:
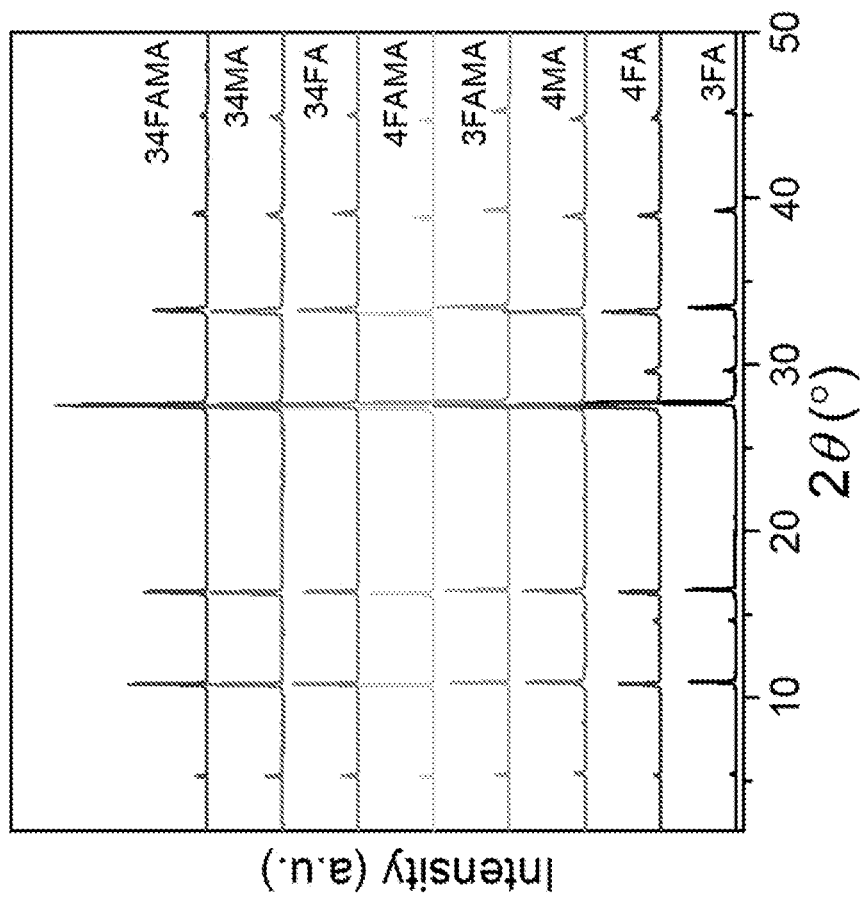
FIGS. 14A-14E show the PXRD results for the additional two-dimensional halide perovskites.
Figure 14B:
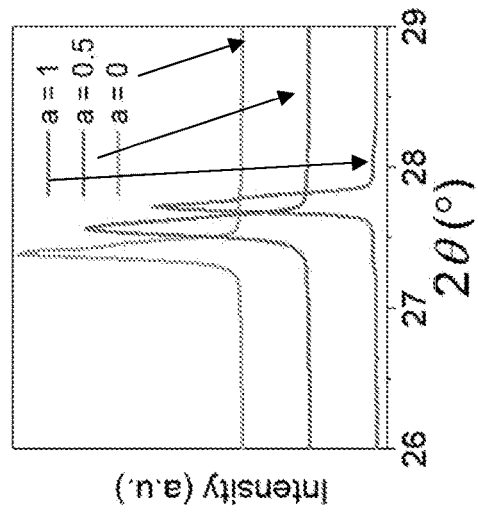
Figure 14C:
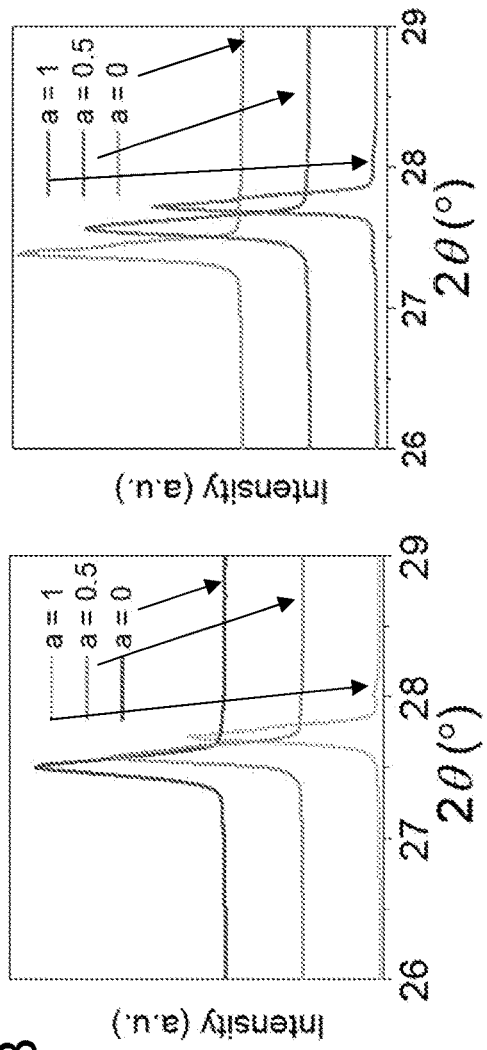
Figure 14D:
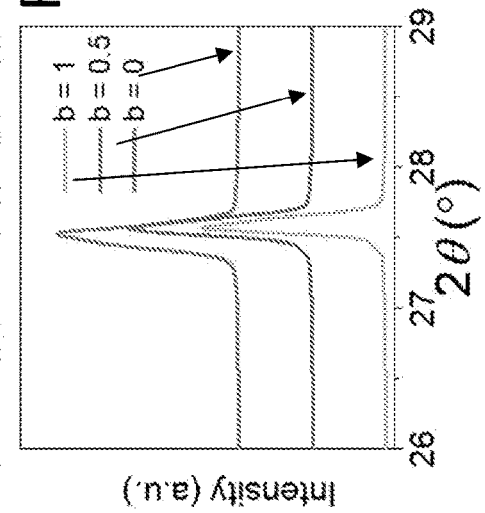
Figure 14E:
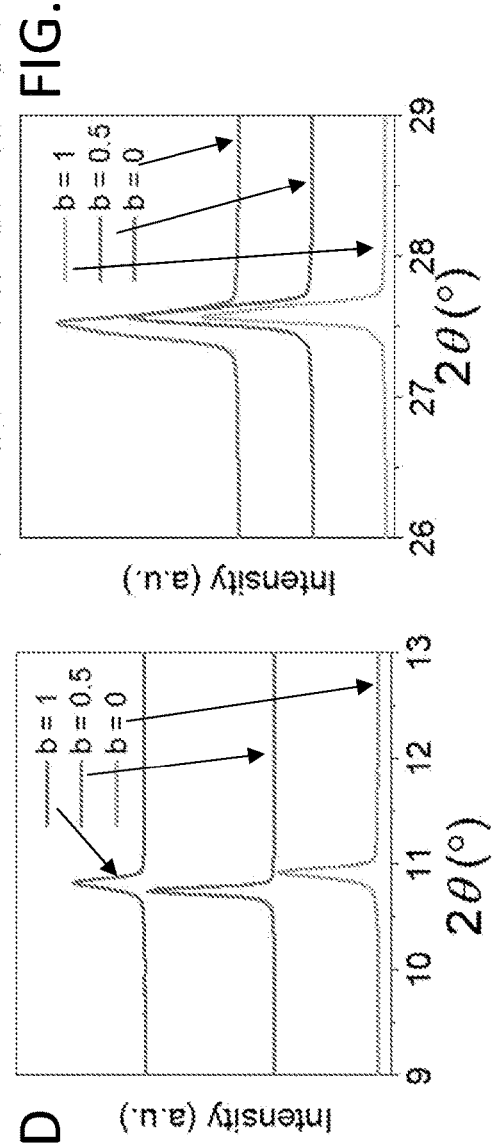
Figure 15A:
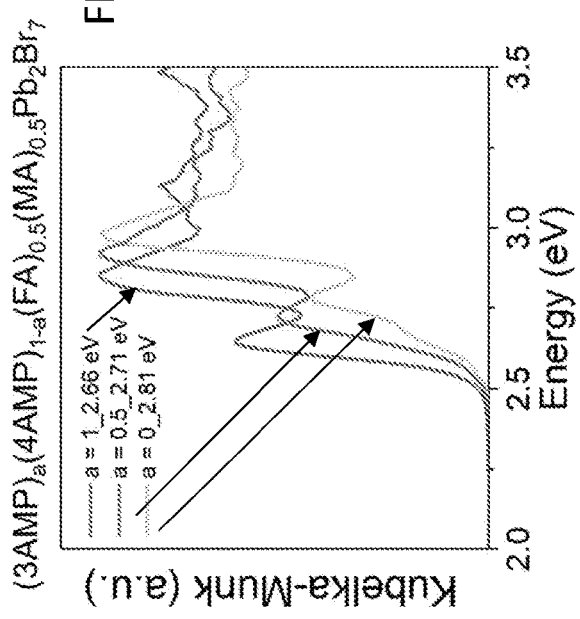
FIGS. 15A-15D show the band gaps of the additional two-dimensional halide perovskites.
Figure 15B:
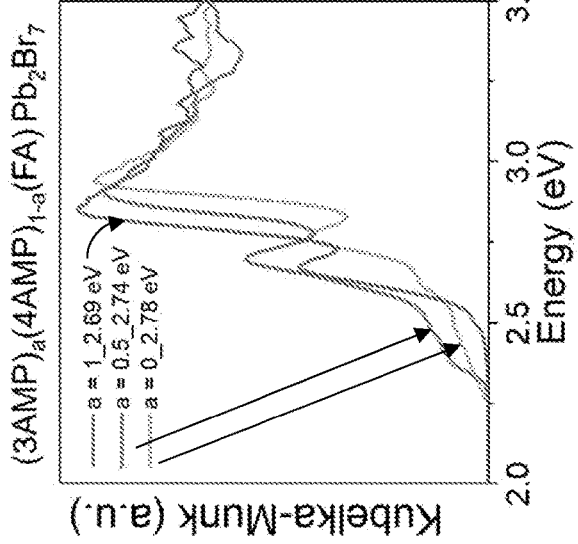
Figure 15C:
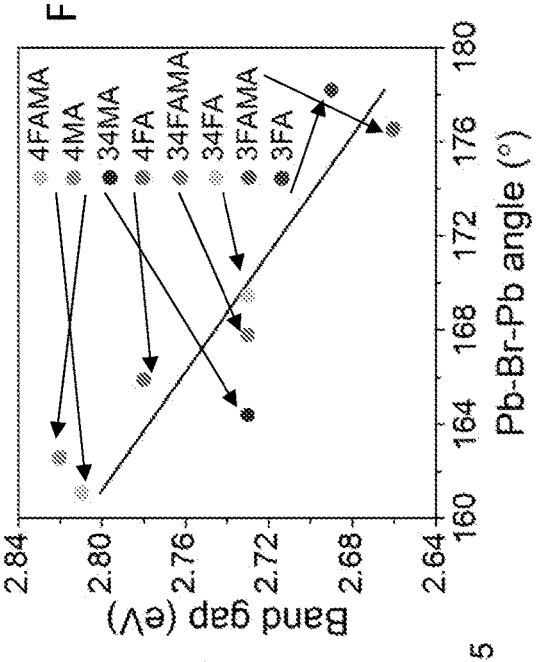
Figure 15D:
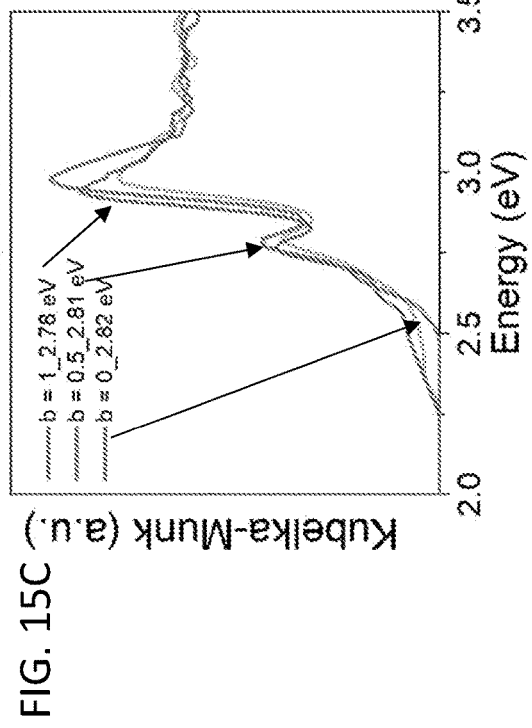
Figure 16:
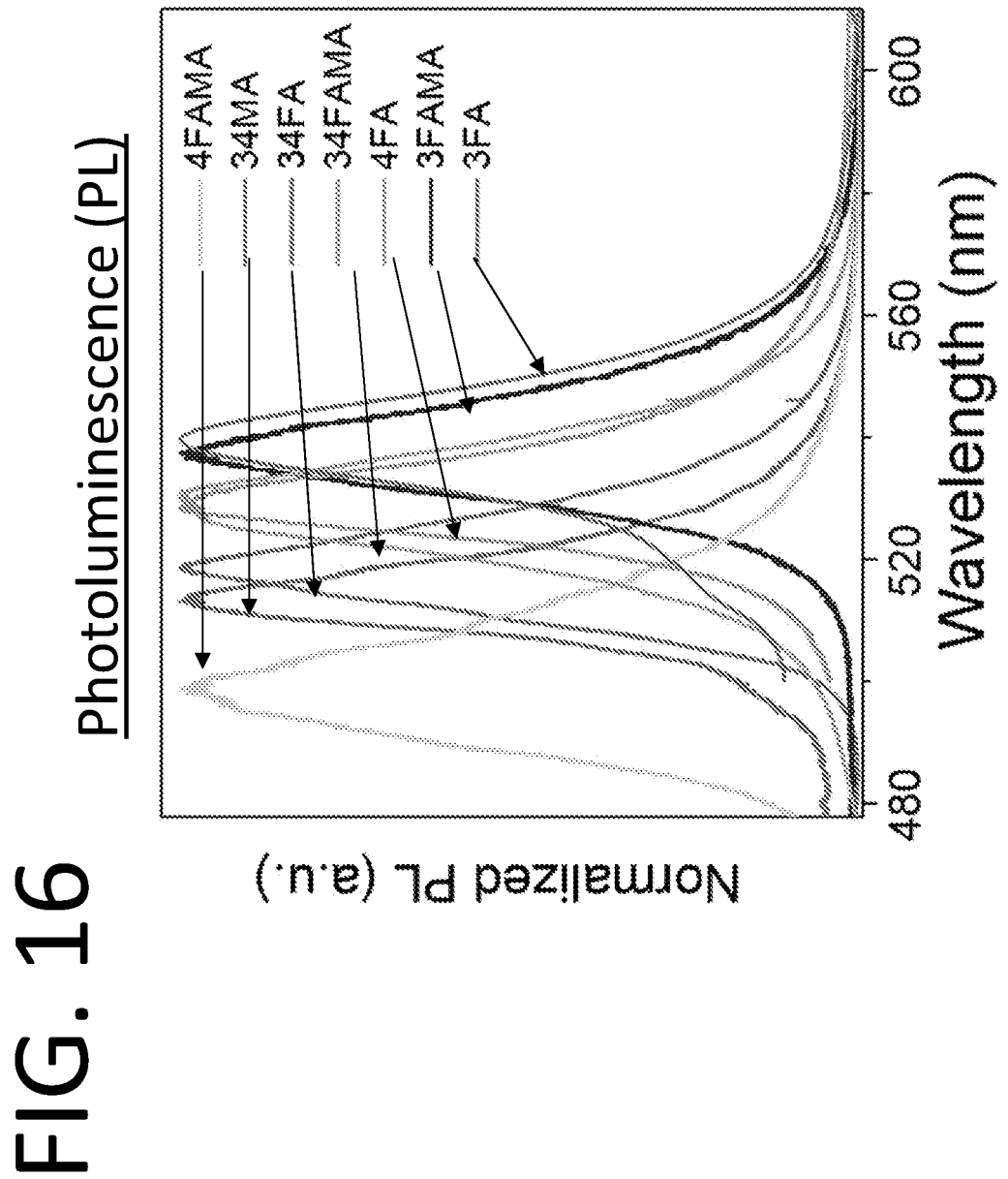
FIG. 16 shows the PL spectra of the additional 2D halide perovskites.

The stability of the devices was also compared using (3AMP)(MA$_{0.75}$FA$_{0.25}$)$_3$Pb$_4$I$_{13}$ and its 3D analogue of MA$_{0.75}$FA$_{0.25}$PbI$_3$. FIG. 11E shows PCE evolution of two representative un-encapsulated MA$_{0.75}$FA$_{0.25}$PbI$_3$ and (3AMP)(MA$_{0.75}$FA$_{0.25}$)$_3$Pb$_4$I$_{13}$ solar cells under constant AM1.5G illumination in ambient air. The MA$_{0.75}$FA$_{0.25}$PbI$_3$ device degraded rapidly. After ~47.5 h of continued light soaking, the PCE of the 3D perovskite device went to ~0%. On the other hand, the 2D (3AMP)(MA$_{0.75}$FA$_{0.25}$)$_3$Pb$_4$I$_{13}$ device showed much better stability, retaining ~22% of its initial PCE under the same conditions. It is interesting to note that the perovskite films had even better stability after being coated with the evaporated C$_{60}$ film, which is hydrophobic and can protect the perovskite films. However, Ag film can diffuse into the perovskite films and react with iodide to form insulating AgI. The Ag electrode in both devices turned from silver-white to dark-gray. Therefore, the degradation of the (3AMP)(MA$_{0.75}$FA$_{0.25}$)$_3$Pb$_4$I$_{13}$ solar cell can be mainly attributed to the Ag electrode diffusion itself even though the perovskite film is stable. It was observed that the degradation of the (3AMP)(MA$_{0.75}$FA$_{0.25}$)$_3$Pb$_4$I$_{13}$ device caused by the Ag electron can be effectively inhibited after the device is stored in a N$_2$-filled glovebox. As shown in FIG. 11F, the (3AMP)(MA$_{0.75}$FA$_{0.25}$)$_3$Pb$_4$I$_{13}$ solar cell with an initial PCE of 10.20% can have a much better stability and retain a slightly higher PCE of 11.02% after ~2760 h of storage in the glovebox in the dark.

Conclusions

The new 2D DJ 3AMP-based perovskites with mixed A cations of MA and FA in the perovskite cage have narrower band gaps than those with MA only in the cage, and this effect arises from larger Pb—I—Pb angles in the structure. Therefore, solar cells based on 3AMP perovskites with mixed MA/FA cation possess enhanced J$_{SC}$ and PCE. Specifically, 3AMP perovskites with the optimal amount of 25% FA have lower recombination, leading to higher FF and V$_{oc}$ for the devices. Consequently, the (3AMP)(MA$_{0.75}$ $FA_{0.25})_3Pb_4I_{13}$ solar cells achieved a champion PCE of 12.04% with a record FF of 81.04% and an average PCE of 9.83±0.94%, which show a ~50% improvement compared to the pristine $(3AMP)(MA)_3Pb_4I_{13}$ cells. Combining the solvent-engineering method with mixed DMF/DMSO solvent and the use of an HI additive yields high-quality films and therefore the high-reproducibility and performance of the devices. Furthermore, these 2D DJ perovskite films and devices have much better environmental stability compared to their 2D RP and 3D analogues, benefiting from the hydrophobic behavior the organic space layer of the 3AMP cation, which leads to a higher moisture and light resistance of the materials.

Example 3

In this Example, additional 2D perovskites were prepared having the formula $A'A_{n-1}PbnBr_{3n+1}$, wherein A' is 3AMP, 4AMP, or a combination thereof and A is MA, FA, or a combination thereof. The general structures, detailed crystal structures, PXRD results, band gaps, and optical properties are shown in FIGS. 12A-12L, 13, 14A-14E, 15A-15D, and 16, respectively. Crystal structures and purity of the newly synthesized nine compounds based on the $(A')(A)Pb_2Br_7$ (A'=3AMP or 4AMP, A=FA or MA) formula were collected and examined using single-crystal XRD and PXRD. The conformation mode and distortion of the Pb—Br inorganic framework were greatly impacted by the large organic spacer A' and perovskitizer cation A. The addition of 4AMP into the $(3AMP)_a(4AMP)_{1-a}(FA)b(MA)_{1-b}Pb_2Br_7$ (a and b=1, 0.5 or 0) system decreases the Pb—Br—Pb angle, making the framework more distorted. On the contrary, with more FA incorporated into the system, the Pb—Br—Pb angle increases. The band gap ranges from $(4AMP)(MA)Pb_2Br_7$ (2.83 eV), which has the largest distortion with averaged Pb—Br—Pb angle of 166.5°, to $(3AMP)(FA)Pb_2Br_7$ (2.69 eV), which has the least distortion (178.8°). The different effects from solely the organic cations in the 2D system highlight the importance of understanding the structural evolution and its corresponding influence on the optical properties by compositional tuning.

Example 4

This example reports the highest layer thickness (n=7) yet to be crystallographically characterized for the DJ family. The seven-layered DJ phase $(4AMP)(MA)_6Pb_7I_{22}$ shows much less distortion (i.e. Pb—I—Pb angle, bond angle variance and bond length distortion) (FIGS. 25E and 25F) in the crystal structure, than the corresponding RP phase $(BA)_2(MA)_6Pb_7I_{22}$. The comparison of the DJ and RP perovskites at the n=7 level reveals that the fine structural details still influence the optical properties, with the DJ phase maintaining a lower energy absorption edge and PL emission (1.53 eV, 1.70 eV) than the RP phase (1.57 eV, 1.74 eV). DFT calculations reveal more dispersed bands in the electronic structure of the DJ phase than the RP, and LDOS of CBM and VBM are situated at different parts of the layers of the DJ phase and RP phase, implying separate channels in the structure followed by electrons and holes. Unlocking the high layer thickness in the family of 2D halide perovskites provides accessibility to new perovskites for high-performance optoelectronics.

This example demonstrates the synthesis and characterization of the thickest layered 2D perovskites (n=7) to date demonstrated by the DJ phase $(4AMP)(MA)_6Pb_7I_{22}$, and compare its properties with the RP perovskite $(BA)_2(MA)_6Pb_7I_{22}$ (BA=butylammonium) with a detailed structural analysis. (C. M. M. Soe et al., *Proc. Natl. Acad. Sci.* 2019, 116, 58-66.) The distortion levels of the crystal structures, which is a key property-defining aspect in perovskites, are evaluated based on the Pb—I—Pb angles (distortion across the layers), BAV and DI (distortion of individual octahedron). DFT calculations taking into account these distortions point out the intrinsic differences in the electronic structure, where opposite LDOS in the CBM and VBM are observed. Local inclusions of lower n phases identified via single crystal XRD and visualized via scanning transmission electron microscopy (STEM) suggest an upper limit on possible n thickness that can be obtained in a phase-pure manner. The intricate crystal structure and its connection to the observed optical and electronic properties provide an analytical guidance in the understanding of the high-layer-thickness compounds.

Results and Discussion

The synthesis of the n=7 DJ phase requires reduced 4AMP input and hydroiodic acid than the RP phases described in Example 1. An amount of 892 mg (4 mmol) 99.9% PbO powder was dissolved in 4 mL of hydroiodic acid and 0.5 mL of a hypophosphorous acid solution by heating under stirring for 5-10 min at 130° C. until the solution turned to clear bright yellow. 636 mg (4 mmol) of MAI was added directly to the above solution under heating. 0.5 mL hydroiodic acid was added to 23 mg (0.2 mmol)₄AMP in a separate vial under stirring. The protonated 4AMP solution was added into the previous solution under heating and stirring for 5-10 min. Black plate-like crystals precipitated during slow cooling to room temperature. The yield was 312 mg (12.0% based on total Pb content). PXRD shows the signature basal Bragg peaks of the n=7 phase at ~12.7° and ~-14.6°, which correspond to the (700) and (800) planes, respectively. The low angle basal Bragg peaks (<10°) are not visible because their intensity is very weak. A minor n=5 impurity can be found in the sample, similar to the n=7 RP phase, where n=5 and 6 impurities co-crystallize because the thermodynamic instability of the 2D phases was found to decrease with increasing n.

Having evaluated the phase purity of the n=7 DJ crystals, the n=7 DJ phase was then compared to its analog n=7 RP phase. The crystal structures of DJ and RP phases are shown in FIGS. 24A-24D. Both compounds consist of massive unit cells of ~5 nm (taking unit cell centering into account), featuring inorganic perovskite layers of ~4.5 nm thickness. The difference in the layer conformation between the two structures is clearly seen in the side view and top-down view of the structures, where the layers of DJ phase overlap exactly on top of each other, showing a (0, 0) displacement. The layers of the RP phase are more flexible, showing a (½, 0) displacement because of the monovalent cation BA that only attaches to one side of the slab (FIGS. 24C-24D). The interlayer space requires two sheets of organic cations of BA (singly protonated —$NH_3^+$), whereas the DJ phase only requires one sheet of the dication 4AMP (doubly protonated, —$NH_3^+$ and —$NH_2^+$). The latter locks in place the relative positions of adjacent inorganic slabs. Due to the asymmetric nature of the 4AMP cation, $(4AMP)(MA)_6Pb_7I_{22}$crystallizes in the non-centrosymmetric monoclinic space group Pc, whereas the RP phase adopts the non-centrosymmetric orthorhombic space group C2cb. The crystallographic data and refinement details of the DJ phase are given in Table 7. To better illustrate the subtle differences in the two crystal structures, the structures were dissected into individual slabs, where each slab is a representative unit from which the whole structure is composed.

TABLE 7

Single-crystal XRD refinement details for the DJ phase (4AMP)(MA)$_6$Pb$_7$I$_{22}$.

| | |
|---|---|
| Empirical formula | (C$_6$N$_2$H$_{16}$)(CH$_3$NH$_3$)$_6$Pb$_7$I$_{22}$ |
| Formula weight | 4550.74 |
| Temperature, wavelength | 293(2) K, 0.71073 Å |
| Space group | Pc |
| Unit cell dimensions | a = 48.605(10) Å, |
| | b = 8.8635(18) Å, |
| | c = 8.8638(18) Å, |
| | β = 90.13(3)° |
| Volume | 3818.6(13) Å$^3$ |
| Density (calculated) | 3.958 g/cm$^3$ |
| θ range, completeness to θ = 26.000° | 2.298 to 29.253°, 91.1% |
| Reflections collected, independent | 23035, 14637 [R$_{int}$ = 0.1065] |
| Data/restraints/parameters | 14637/32/342 |
| Goodness-of-fit | 1.031 |
| Final R indices [I > 2σ(I)] | R$_{obs}$ = 0.1194, |
| | wR$_{obs}$ = 0.3397 |

R = Σ||F$_o$| − |F$_c$||/Σ|F$_o$|, wR = {Σ[w(|F$_o$|$^2$ − |F$_c$|$^2$)$^2$]/Σ[w(|F$_o$|$^4$)]}$^{1/2}$ and w = 1/[σ$^2$(Fo$^2$) + (0.2000P)$^2$] where P = (Fo$^2$ + 2Fc$^2$)/3

STEM images of an n=7 crystal revealed stacked layers of high and low contrast. The high-contrast layers consistently exhibited thicknesses of 42-45 Å, which roughly matches the thickness of the Pb—I inorganic slab of the n=7 (44.5 Å). Lower-contrast layers were intercalated irregularly between the high-contrast layers, suggesting the presence of a lower-Z impurity growing between layers of n=7. This was consistent with the observation of n=5 impurities via single-crystal XRD, as lower-n layers would have a higher proportion of organic cation vs. Pb. The lower-contrast layers were thus interpreted to be these n<7 impurities. In contrast, in low-n (n=3, or n=4) spin-coated RP thin films, impurities consisting of both lower-n and higher-n RP phases were tightly interwoven with the dominant stoichiometric phase. This suggests that the nature of impurity intergrowth, whether as full, separate layers, or as interwoven crystallites, may depend on the average n, on the bulkiness of the large organic cation, or on the growth kinetics.

Figure 25A:
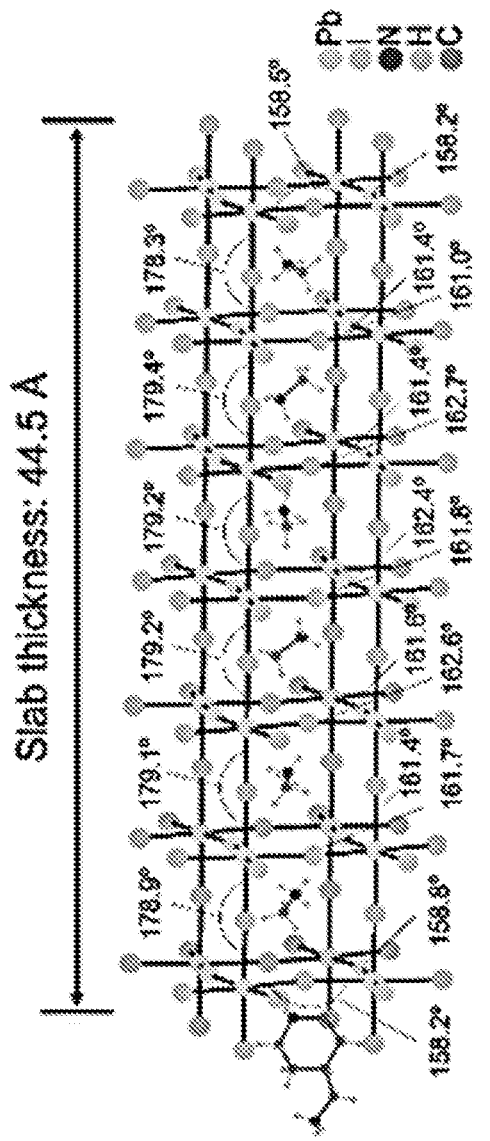
FIGS. 25A-25H show detailed Pb—I—Pb angles for (FIG. 25A) DJ phase (4AMP)(MA)$_6$Pb$_7$I$_{22}$ and (FIG. 25B) RP phase (BA)$_2$(MA)$_6$Pb$_7$I$_{22}$; and crystallographic independent Pb environments in (FIG. 25C) (4AMP)(MA)$_6$Pb$_7$I$_{22}$ and (FIG. 25D) (BA)$_2$(MA)$_6$Pb$_7$I$_{22}$.
Figure 25C:
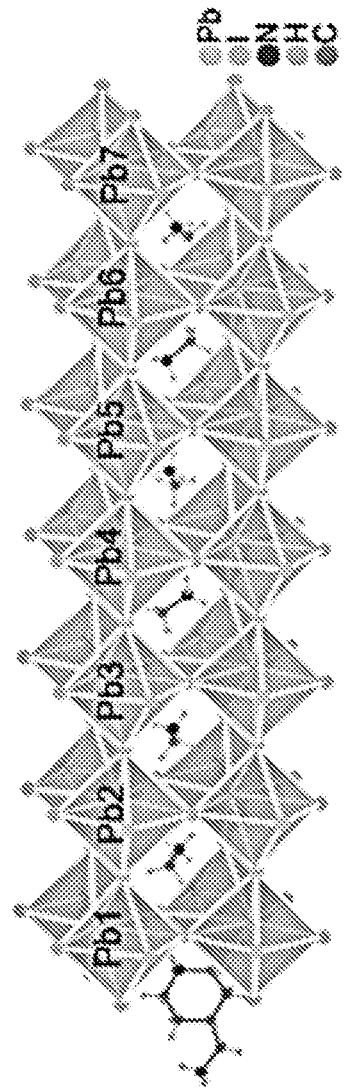
Figure 25B:
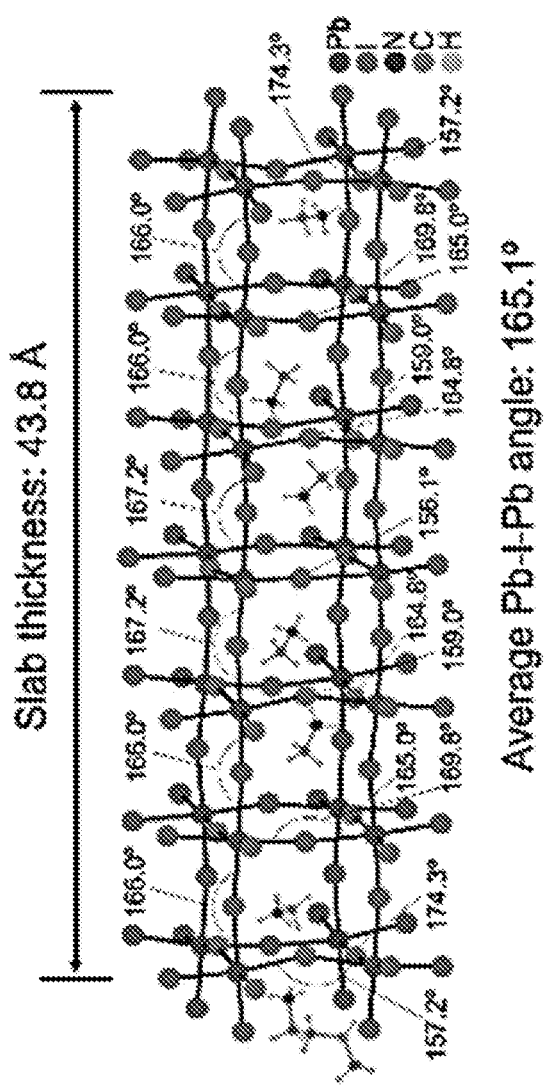
Figure 25D:
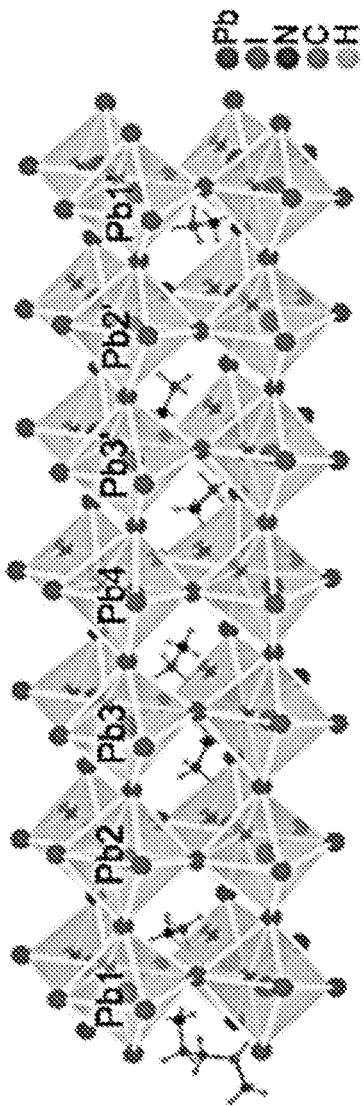
Figure 25E:
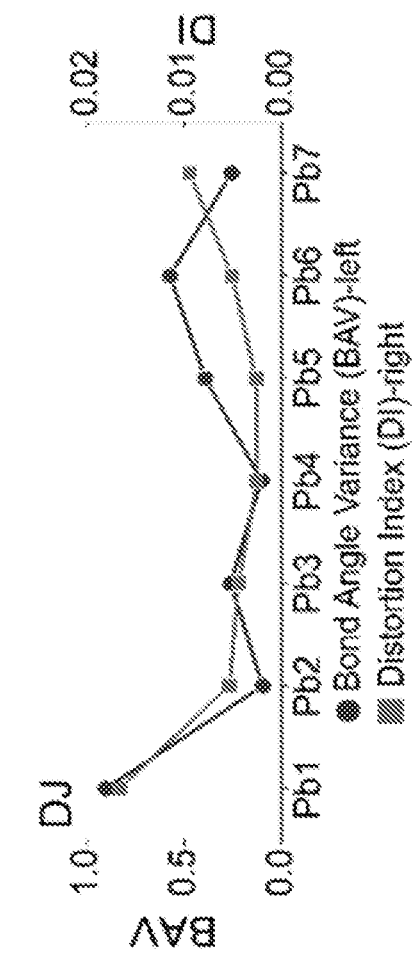
Figure 25G:
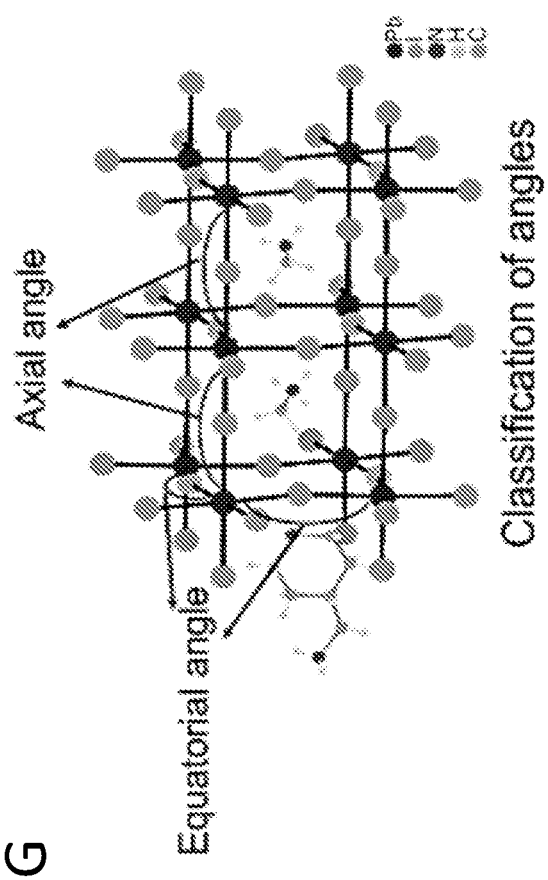
Figure 25F:
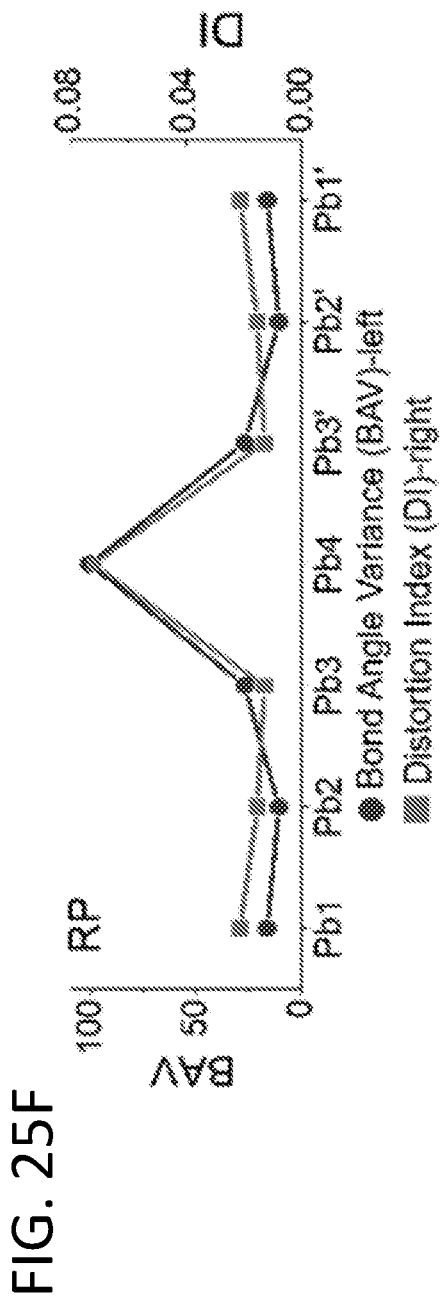
Figure 25H:
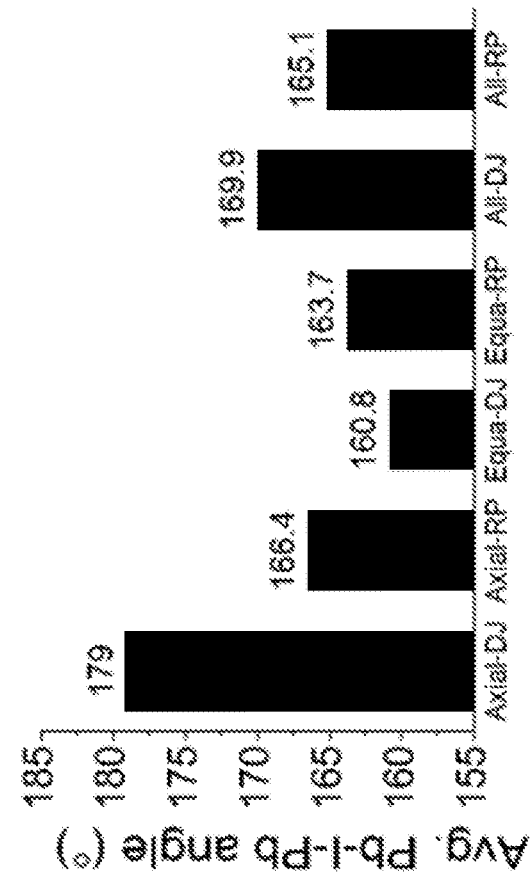

In FIGS. 25A-25B, the n=7 inorganic slabs of the DJ phase and RP phase are placed horizontally, with individually labeled Pb—I—Pb angles. The Pb—I—Pb angle can be viewed as a parameter that quantifies the distortion across the Pb/I inorganic framework. The overall average of the Pb—I—Pb angles is 169.9° for the DJ phase and 165.1° for the RP phase. The main contribution that raises the average for the DJ phase comes from the axial Pb—I—Pb angles (perpendicular to the layers, parallel to stacking a-axis) as seen in FIGS. 25A, 25G, and 25H, which approach the ideal 180°. The axial angles in the RP phase are all below 170° (FIGS. 25B and 25H). The other type of Pb—I—Pb angle is the equatorial Pb—I—Pb angles as defined in FIG. 25G, and they extend along the infinite 2D planes. The averaged equatorial angle for the RP is larger than that for the DJ phase (163.7° vs. 160.8°), which shows a smaller in-plane distortion in the RP phase.

To consider the distortion level at the individual [PbI$_6$] octahedron, BAV (equation 1) and DI (equation 2) are important parameters, as they show the deviation from the perfect octahedron and provide another sense of the flexibility of the structure.

$$\sigma^2 = \frac{\sum_{i=1}^m (\theta_i - \theta_0)^2}{m-1} \quad (1)$$

where m is (number of faces in the polyhedron)×3/2 (i.e. number of bond angles), θ$_i$ is the ith bond angle, and θ$_0$ is the ideal bond angle for a regular polyhedron (90° for an octahedron).

$$D = \frac{1}{n}\sum_{i=0}^n \frac{|li - l|}{l} \quad (2)$$

where li is the distance from the central atom to the ith coordinating atom, and l is the average bond length. The individual [PbI$_6$]octahedron is labeled in FIGS. 25C-25D. In the structure of (4AMP)(MA)$_6$Pb$_7$I$_{22}$ each Pb environment is different from Pb1 to Pb7 as shown in FIG. 25C. For the RP phase, because of a glide plane sitting in the middle of the layer, Pb1, Pb2, and Pb3 are equivalent to Pb1', Pb2' and Pb3' (FIG. 25D).

The BAV, quantifying the distortion from I—Pb—I angles inside the [PbI$_6$], and DI, quantifying the distortion from Pb—I bond length, are calculated using the VESTA software and listed in Table 8. The BAV values of all the [PbI$_6$]units in the DJ phase are below 1, contrary to the BAV values which are ~20 and can reach values as high as 100 for the symmetry independent layer (defined by Pb4) of the RP phase. The DI difference is less pronounced, but still the DJ phase has smaller values (0.01-0.02) and the RP phase can go as high as 0.08, clearly seen in Table 8. The smaller degree of distortion in the DJ structure suggests that the thicker 2D perovskite structures are much less strained in the DJ motif compared to the RP motif, which is a good indicator that it will be easier to construct thicker slabs (n>7) in the DJ case.

TABLE 8

Local distortion level of the crystal structure quantified by the BAV and DI of the individual octahedron [PbI$_6$].

| DJ | BAV | DI | RP | BAV | DI |
|---|---|---|---|---|---|
| Pb1 | 0.901 | 0.017 | Pb1 | 16.326 | 0.021 |
| Pb2 | 0.980 | 0.005 | Pb2 | 10.837 | 0.015 |
| Pb3 | 0.263 | 0.004 | Pb3 | 27.021 | 0.013 |
| Pb4 | 0.105 | 0.003 | Pb4 | 100.851 | 0.072 |
| Pb5 | 0.391 | 0.003 | Pb3' | 27.021 | 0.013 |
| Pb6 | 0.573 | 0.003 | Pb2' | 10.837 | 0.015 |
| Pb7 | 0.258 | 0.009 | Pb1' | 16.326 | 0.021 |

The difference in the relative strain and distortion between the DJ and RP n=7 structures can be understood as deriving from the different influence exerted from the soft organic layers. In the DJ structure, it is the [PbI$_6$]unit (Pb1) next to the piperidinium ring that is the most distorted and "absorbs" most of the cation-induced strain. For the RP structure, on the other hand, it is the rigid middle inorganic layer [PbI$_6$]unit (Pb4) that plays this role, and therefore the lattice strain cannot be efficiently relieved in the individual layers leading to the pronounced distortion in the whole layer. The difference is caused by the inherent properties of the organic spacing cations. In RP perovskites, each layer is "individual", fully charge-balanced with electrostatically interacting monolayer of BA cations. These then stack with the other layers only through weak dispersion forces between the alkyl chain tails of the BA cations. For the DJ systems, because of the ditopic function the 4AMP dications, the stacked layers are held together through strong electrostatic forces of the two different ammonium endgroups, which themselves are linked with covalent C-C bonds. This arrangement seems to work as cushion to relieve the strain in the individual perovskite layers.

Figure 26B:
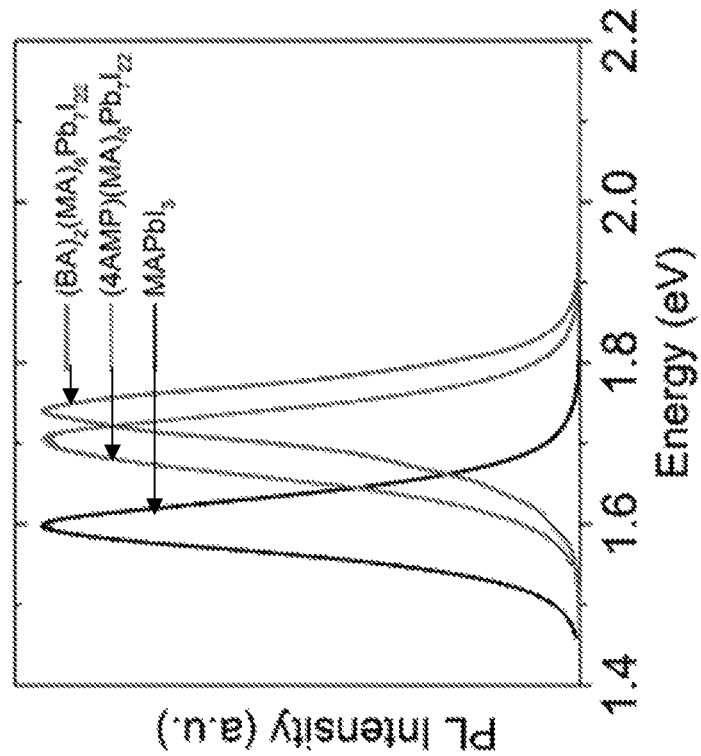
FIGS. 26A-26B show (FIG. 26A) a comparison of the optical absorption spectra and (FIG. 26B) steady-state PL spectra of (4AMP)(MA)$_6$Pb$_7$I$_{22}$, (BA)$_2$(MA)$_6$Pb$_7$I$_{22}$ and 3D MAPbI$_3$.
Figure 26A:
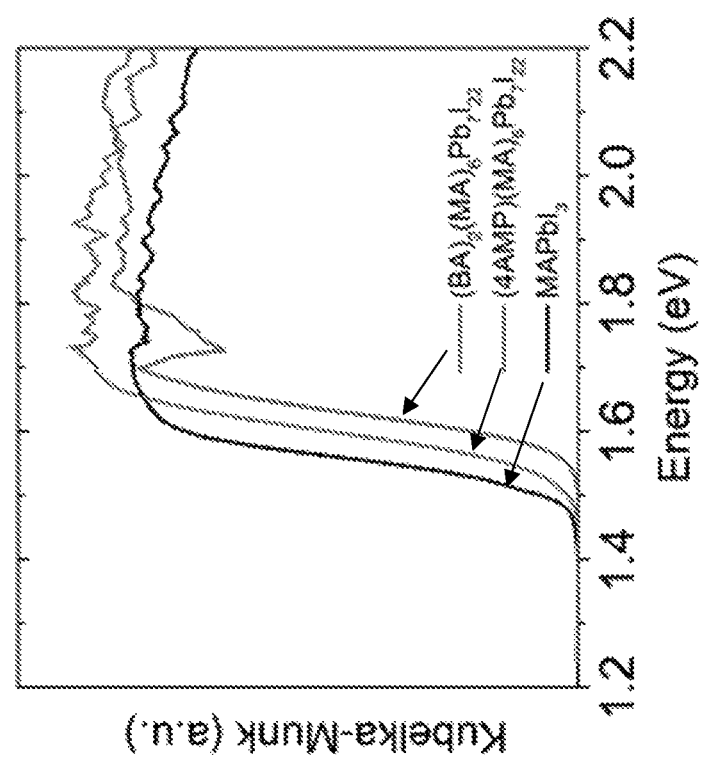

The optical properties match the trend where a less distorted perovskite structure will lead to a smaller band gap. From UV-vis absorption and steady-state PL spectra (FIGS. 26A-26B), it is evident that the DJ phase has a lower absorption edge (1.53 eV) than the RP phase and lies between the 3D perovskite MAPbI$_3$ (1.50 eV) and the RP phase (1.57 eV). The PL emission energies for the DJ and RP phase are blue shifted from MAPbI$_3$ (1.60 eV), at 1.70 eV and 1.74 eV, respectively. By comparison, for the n=5 case, the PL emission energy is 1.83 eV for the RP phase and 1.79 eV for the DJ phase. A major difference in n=7 compared with the thinner layer RP and DJ phases can also be seen in the absence of resolved characteristic exciton peaks from the absorption spectra, which is understood in terms of decreasing exciton binding energy. With increasing layer thickness, the inorganic:organic aspect ratio becomes increasingly larger, practically negating the effects of dielectric confinement and approximating the dielectric properties of the 3D perovskites. This aspect facilitates the breakup of the excitons into free carriers.

The intrinsic differences between the n=7 DJ phase and RP phase in their electronic structures were also investigated with DFT calculations based on the experimental crystal structures (FIGS. 27A-27F). FIGS. 27A-27F compare the electronic band structures of the RP and the DJ. The direct band gaps of 0.17 eV at F and 0.25 eV at Y are computed for the RP and DJ phase, respectively. The absence of the inversion center coupled with the presence of a giant spin-orbit coupling in both structures induces a small Rashba spin-splitting at mainly the conduction band (CB) for RP and both the valence band (VB) and CB for DJ. The bandwidths of the CB are similar for the DJ and RP phase, while the RP phase shows a wider bandwidth of the VB than the DJ phase (~0.7 eV vs. 0.5 eV). Flat dispersions (<1 meV) were noted along YF for RP in reciprocal space, which corresponds to its stacking axis in real space, whereas for the DJ phase slight dispersions can be seen along the stacking FY axis (bandwidth ~31 meV at VBM and ~48 meV at CBM). The small but notable band dispersion arises from the close I . . . I interaction between adjacent [Pb$_7$I$_{22}$]slabs brought about by the small 4AMP cations, as discussed previously.

The orbital hybridization near the VBM and CBM edges can be best seen from wave functions, computed without SOC. Typically, for lead iodide perovskite systems, VBM is made of an anti-bonding hybridization between Pb (6s) and I (5p) while CBM mainly consists of bonding hybridization between Pb (6p) states. The spatial localizations of LDOS computed with SOC are consistent with their wave function distributions on the different octahedral planes.

Figures 27A, 27B, 27C, 27D:
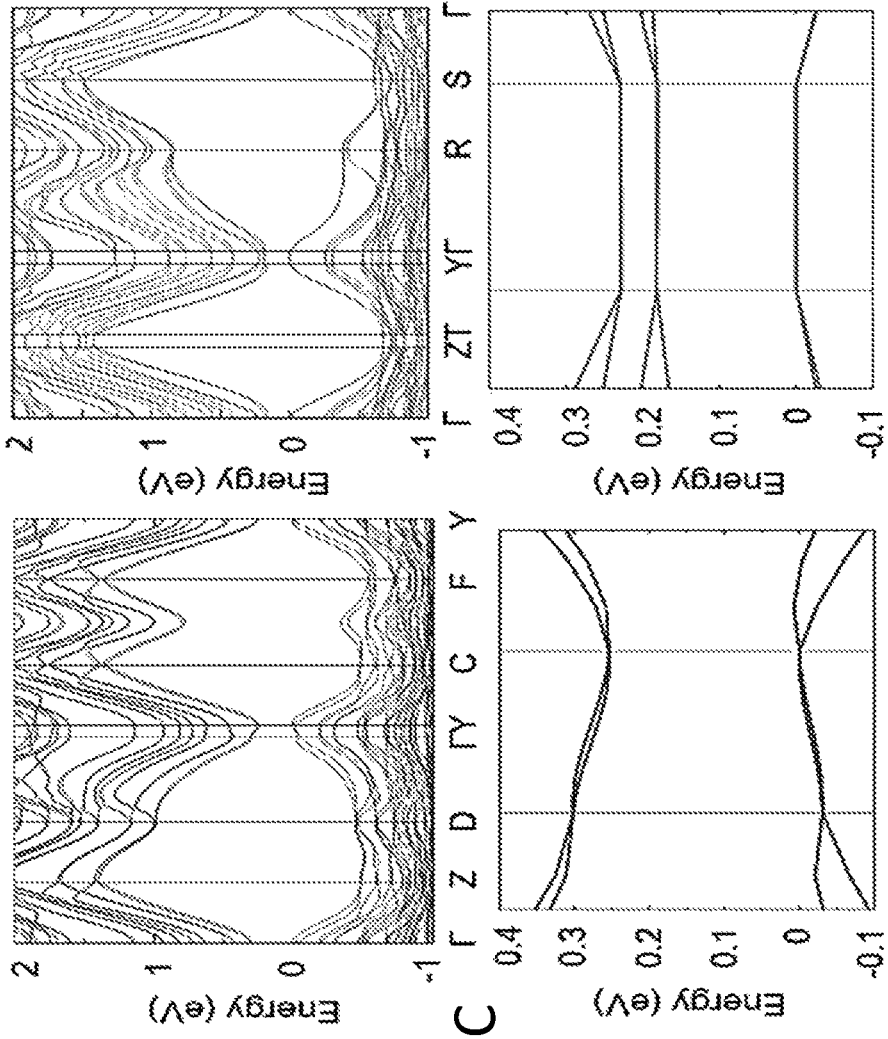
FIGS. 27A-27F show a comparison of the band structures of (FIG. 27A) (4AMP)(MA)$_6$Pb$_7$I$_{22}$ and (FIG. 27B) (BA)$_2$(MA)$_6$Pb$_7$I$_{22}$ including spin-orbit coupling effects. The zoom-in regions at the band edges show different level of dispersion, where the DJ phase has larger dispersion (FIG. 27C) than the RP phase (FIG. 27D). Also shown is a schematic illustration of the localized density of states (LDOS) of conduction band minimum (CBM) and valence band maximum (VBM) and favored channels (in blue and red octahedra) for holes and electrons in the DJ phase (FIG. 27E) and in the RP phase (FIG. 27F).
Figures 27E, 27F:
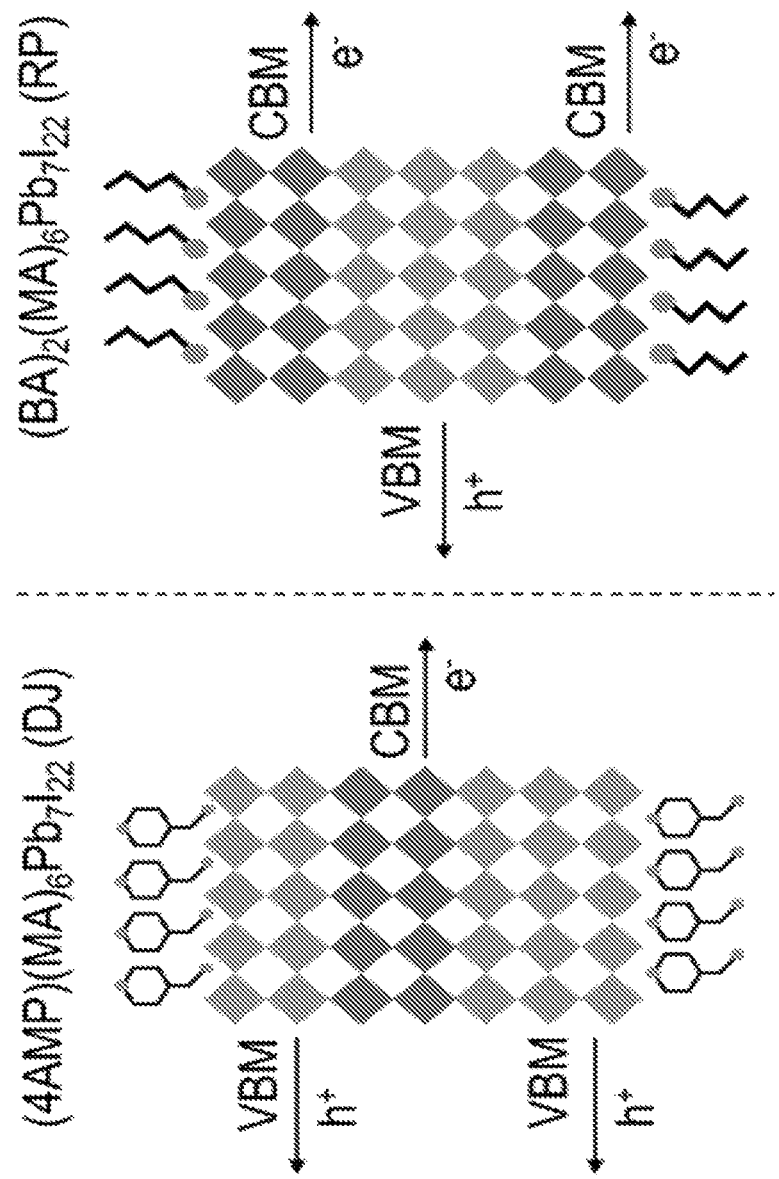

The LDOS at VBM and CBM for both class types show different spatial distributions (FIGS. 27A-27F). For RP, VBM is localized at the inner octahedral layer while CBM is located at the outer octahedral planes. For DJ, CBM is mostly localized over the inner layer, whereas VBM is asymmetrically localized over one side of the outer layer. The latter asymmetry can be traced back to the two different charged moieties in the 4AMP dications (—NH$_2^+$ versus —NH$_3^+$) that induce a net dipole, which in turn induces the asymmetry of the electronic density distribution at VBM that localizes on the [NH$_3$]$^+$ side. The localization is driven by the structural properties of the inorganic framework. In the DJ case, the anti-bonding character of the VBM causes them to localize on the layers that are more distorted (outer layers). This trend is the opposite for the RP phase, as the more distorted layers are in the middle (FIGS. 27E-27F). The LDOS of VBM and CBM in the DJ and RP phases indicates that the electron and hole pathways are distinctively different in these materials, thus different optoelectronic engineering strategies may be considered for devices.

Experimental Section

Materials. PbO (99.9%), 4-(aminomethyl)piperidine (96%), hydroiodic acid (57 wt. % in H$_2$O, distilled, stabilized, 99.95%) and hypophosphorous acid solution (50 wt. % in H$_2$O) were purchased from Sigma-Aldrich and used as received. Methylammonium iodide (>99.5%) was purchased from Luminescence Technology Corp. and used as received.

Synthesis of (4AMP)(MA)$_6$Pb$_7$I$_{22}$. An amount of 892 mg (4 mmol) 99.9% PbO powder was dissolved in 4 mL of hydroiodic acid and 0.5 mL of a hypophosphorous acid solution by heating under stirring for 5-10 min at 130° C. until the solution turned to clear bright yellow. 636 mg (4 mmol) of MAI was added directly to the above solution under heating. 0.5 mL hydroiodic acid was added to 23 mg (0.2 mmol)$_4$AMP in a separate vial under stirring. The protonated 4AMP solution was added into the previous solution under heating and stirring for 5 min. Black plate-like crystals precipitated during slow cooling to room temperature. The yield was 312 mg (12.0% based on total Pb content).

STEM. High-angle annular dark-field (HAAFS) STEM images were acquired using a ThermoFisher Talos G2 200X TEM/STEM operating at 200 keV and ~3 nA. n=7 DJ crystals were crushed onto TEM grids (Ted Pella No. 01824, ultrathin C film on holey carbon support film, 400 mesh, Cu) using a razor blade.

Single Crystal XRD. Full sphere data were collected after screening for a few frames using either a STOE IPDS 2 diffractometer with graphite-monochromatized Mo Kα radiation (λ=0.71073 Å) (50 kV/40 mA) under N$_2$ at 293 K. The collected data was integrated and applied with numerical absorption corrections using the STOE X-AREA programs. The crystal structure was solved by direct methods and refined by full-matrix least-squares on F$^2$ using the OLEX2 program package. (0. V. Dolomanov et al., *J Appl. Crystallogr.* 2009, 42, 339-341.)

Steady State PL. Steady-state PL spectra were collected using HORIBA LabRAM HR Evolution Confocal RAMAN microscope. 473 nm laser (0.1% power) was used to excite all samples at 50× magnification.

DFT Simulations. The calculations were performed within the DFT as implemented in the SIESTA package with a basis set of finite-range of numerical atomic orbitals. (aP. Hohenberg, et al., *Phys. Rev.* 1964, 136, B864; bW. Kohn, L. J. Sham, *Phys. Rev.* 1965, 140, Al 133; and J. M. Soler et al., *J. Phys. Condens. Matter* 2002, 14, 2745.) The GGA was used with the PBE functional to describe the exchange-correlation term, and norm-conserving Troullier-Martins pseudopotentials were used for each atomic species to account for the core electrons. (J. P. Perdew, et al., *Phys. Rev. Lett.* 1996, 77, 3865; and N. Troullier et al., *Phys. Rev. B* 1991, 43, 1993.) 1s$^1$, 2s$^2$2p$^2$, 2s$^2$2p$^3$, 5s$^2$5p$^5$ and 5d$^{10}$6s$^2$6p$^2$ were used as valence electrons for H, C, N, I, and Pb, respectively. Polarized Double-Zeta (DZP) basis set with an energy shift of 50 meV and a Mesh cutoff 200 Rydberg were used for the calculations. The Brillouin zone was sampled with 6×6×2, and 2×6×6 Monckhorst-Pack grids for (BA)$_2$(MA)$_6$Pb$_7$I$_{22}$ and (4AMP)(MA)$_6$Pb$_7$I$_{22}$, respectively. The densities of states (DOS) were generated with a Gaussian smearing of 0.1 eV. The electronic properties were calculated using the experimental lattice parameters and atomic coordinates. SOC was taken into account in the calculation of the electronic band structures.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the invention to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A photovoltaic cell comprising:
   (a) a first electrode comprising an electrically conductive material;
   (b) a second electrode comprising an electrically conductive material; and
   (c) a perovskite in electrical communication with the first electrode and the second electrode, wherein the perovskite is a two-dimensional halide perovskite having a Dion-Jacobson phase represented by the formula (I) $A'(A)_{n-1}M_nX_{3n+1}$, wherein A' is a 3-(aminomethyl)piperidinium cation or a 4-(aminomethyl)piperidinium cation, A is a perovskitizer cation, M is Ge, Sn, Pb, or a combination thereof; X is I, Br, Cl, F, or a combination thereof; n is an integer in a range from 1 to 12; and the perovskite has a structure comprising a plurality of inorganic layers comprising $[MX_6]^{4-}$ octahedra and the perovskitizer cations, wherein the inorganic layers are confined between layers of A' cations.

2. The photovoltaic cell of claim 1, wherein M is Pb.

3. The photovoltaic cell of claim 1, wherein X is I.

4. The photovoltaic cell of claim 1, wherein A is methyl ammonium (MA), formamidinium (FA), guanidinium (GUA), dimethylammonium (DMA), Rb, or Cs.

5. The photovoltaic cell of claim 2, wherein A is MA or FA.

6. The photovoltaic cell of claim 1, wherein A' is a 3-(aminomethyl)piperidinium cation.

7. The photovoltaic cell of claim 6, wherein n is in a range from 5 to 7.

8. The photovoltaic cell of claim 6, wherein n is at least 4.

9. The photovoltaic cell of claim 8, wherein A is methyl ammonium.

10. The photovoltaic cell of claim 9, wherein M is Pb and X is I.

11. A photovoltaic cell comprising:
    (a) a first electrode comprising an electrically conductive material;
    (b) a second electrode comprising an electrically conductive material; and
    (c) a perovskite in electrical communication with the first electrode and the second electrode, wherein the perovskite is a two-dimensional halide perovskite having a Dion-Jacobson phase represented by the formula $(A'_{1-y}A'''_y)(A_{1-x}A''_x)_{n-1}M_nX_{3n+1}$, wherein A' is a 3-(aminomethyl)piperidinium cation, A''' is a 4-(aminomethyl)piperidinium cation, A is a first perovskitizer cation, A'' is a second perovskitizer cation, M is Ge, Sn, Pb, or a combination thereof, X is I, Br, Cl, F, or a combination thereof, n is an integer in a range from 1 to 12, $0 \leq x \leq 1$, and $0 \leq y \leq 1$, provided that at least one of x and y has a value that is greater than 0 and less than 1, the perovskite having a structure comprising a plurality of inorganic layers comprising $[MX_6]^{4-}$ octahedra and the perovskitizer cations, wherein the inorganic layers are confined between layers of A' cations.

12. The photovoltaic cell of claim 11, wherein $0<x<1$.

13. The photovoltaic cell of claim 12, wherein A is methyl ammonium and A'' is formamidinium.

14. The photovoltaic cell of claim 13, wherein A' is a 3-(aminomethyl)piperidinium cation.

15. The photovoltaic cell of claim 13, wherein n is at least 4.

16. The photovoltaic cell of claim 13, wherein n is in a range from 3 to 7.

17. The photovoltaic cell of claim 16, wherein M is Pb.

18. The photovoltaic cell of claim 17, wherein X is I.

* * * * *